(12) United States Patent
Fuji et al.

(10) Patent No.: US 8,824,108 B2
(45) Date of Patent: Sep. 2, 2014

(54) MAGNETO-RESISTANCE EFFECT ELEMENT, MAGNETIC HEAD ASSEMBLY, MAGNETIC RECORDING AND REPRODUCING APPARATUS, AND MAGNETIC MEMORY

(71) Applicants: Yoshihiko Fuji, Kanagawa-ken (JP); Michiko Hara, Kanagawa-ken (JP); Hideaki Fukuzawa, Kanagawa-ken (JP); Hiromi Yuasa, Kanagawa-ken (JP)

(72) Inventors: Yoshihiko Fuji, Kanagawa-ken (JP); Michiko Hara, Kanagawa-ken (JP); Hideaki Fukuzawa, Kanagawa-ken (JP); Hiromi Yuasa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/728,281

(22) Filed: Dec. 27, 2012

(65) Prior Publication Data

US 2013/0242435 A1   Sep. 19, 2013

(30) Foreign Application Priority Data

Mar. 16, 2012 (JP) .................. 2012-061104

(51) Int. Cl.
| | |
|---|---|
| G11B 5/39 | (2006.01) |
| G11C 11/16 | (2006.01) |
| G11B 5/127 | (2006.01) |
| G01R 33/09 | (2006.01) |
| H01L 43/10 | (2006.01) |
| H01L 43/08 | (2006.01) |
| H01L 27/22 | (2006.01) |

(52) U.S. Cl.
CPC ............ *G11B 5/1274* (2013.01); *G11B 5/3983* (2013.01); *G11B 5/3909* (2013.01); *H01L 27/228* (2013.01); *G11C 11/16* (2013.01); *G01R 33/093* (2013.01); *H01L 43/10* (2013.01); *G11B 5/3906* (2013.01); *H01L 43/08* (2013.01)

USPC .......................................... 360/324; 365/158

(58) Field of Classification Search
CPC ............ G11B 5/33; G11B 5/332; G11B 5/39; G11B 5/3909; G11B 2005/3996; G11B 5/3906; G11B 5/3983; G11B 5/1274
USPC ............... 360/324–324.2; 365/158, 171, 173; 428/811.2
See application file for complete search history.

(56) References Cited

U.S. PATENT DOCUMENTS

| | | | | |
|---|---|---|---|---|
| 6,861,940 | B2 * | 3/2005 | Matsukawa et al. | 338/32 R |
| 7,301,733 | B1 | 11/2007 | Fukuzawa et al. | |
| 8,213,130 | B1 | 7/2012 | Fuji et al. | |
| 2004/0130431 | A1 * | 7/2004 | Matsukawa et al. | 338/32 R |
| 2012/0206837 | A1 | 8/2012 | Fuji et al. | |
| 2012/0212857 | A1 | 8/2012 | Fuji et al. | |

FOREIGN PATENT DOCUMENTS

| | | |
|---|---|---|
| JP | 2002-208744 | 7/2002 |
| JP | 2004-006589 | 1/2004 |

* cited by examiner

*Primary Examiner* — Will J Klimowicz
(74) *Attorney, Agent, or Firm* — Nixon & Vanderhye, P.C.

(57) ABSTRACT

According to one embodiment, a magneto-resistance effect element includes: a first electrode; a second electrode; a first magnetic layer provided between the first and the second electrodes; a second magnetic layer provided between the first magnetic layer and the second electrode; and an oxide layer of a metal oxide provided between the first magnetic layer and the second magnetic layer. The oxide layer includes wustite crystal grains of a wustite structure with a (1 1 1) plane orientation containing iron. A lattice spacing of a (1 1 1) plane of the wustite crystal grains is not less than 0.253 nanometers and not more than 0.275 nanometers.

24 Claims, 20 Drawing Sheets

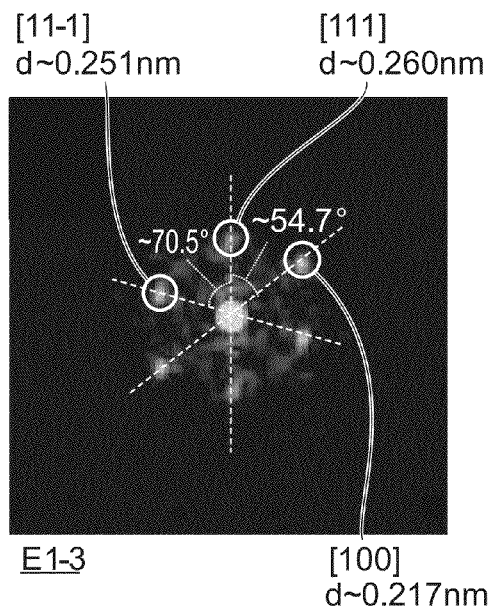
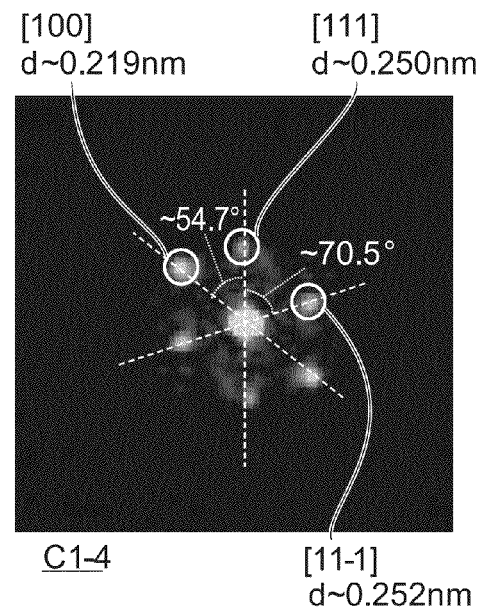
FIG. 6A  FIG. 6B
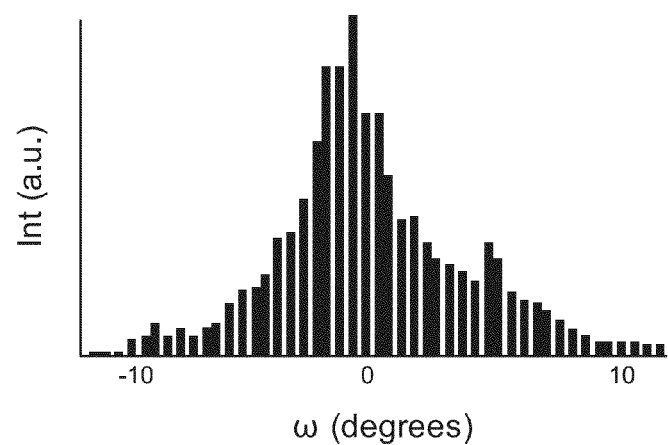
FIG. 7

MAGNETO-RESISTANCE EFFECT ELEMENT, MAGNETIC HEAD ASSEMBLY, MAGNETIC RECORDING AND REPRODUCING APPARATUS, AND MAGNETIC MEMORY

CROSS-REFERENCE TO RELATED APPLICATIONS

This application is based upon and claims the benefit of priority from the prior Japanese Patent Application No. 2012-061104, filed on Mar. 16, 2012; the entire contents of which are incorporated herein by reference.

FIELD

Embodiments described herein relate generally to a magneto-resistance effect element, a magnetic head assembly, a magnetic recording and reproducing apparatus, and a magnetic memory.

BACKGROUND

An MR (magneto-resistance) head (a magnetic head) that reproduces memory information written is provided in magnetic recording apparatuses such as a hard disk drive (HDD). To improve sensitivity, an improvement in the MR ratio of the magnetic head is desired.

In addition, magnetic memories using a magneto-resistance effect element are investigated. To obtain a high-density magnetic memory, an improvement in the MR ratio of the magneto-resistance effect element is desired.

BRIEF DESCRIPTION OF THE DRAWINGS

FIG. 6A and FIG. 6B are FFT analysis images illustrating characteristics of the magneto-resistance effect element;

FIG. 7 is a graph illustrating characteristics of the magneto-resistance effect element;

FIG. 8 shows a cross-sectional TEM image of Sample E2;

DETAILED DESCRIPTION

Figure 1:
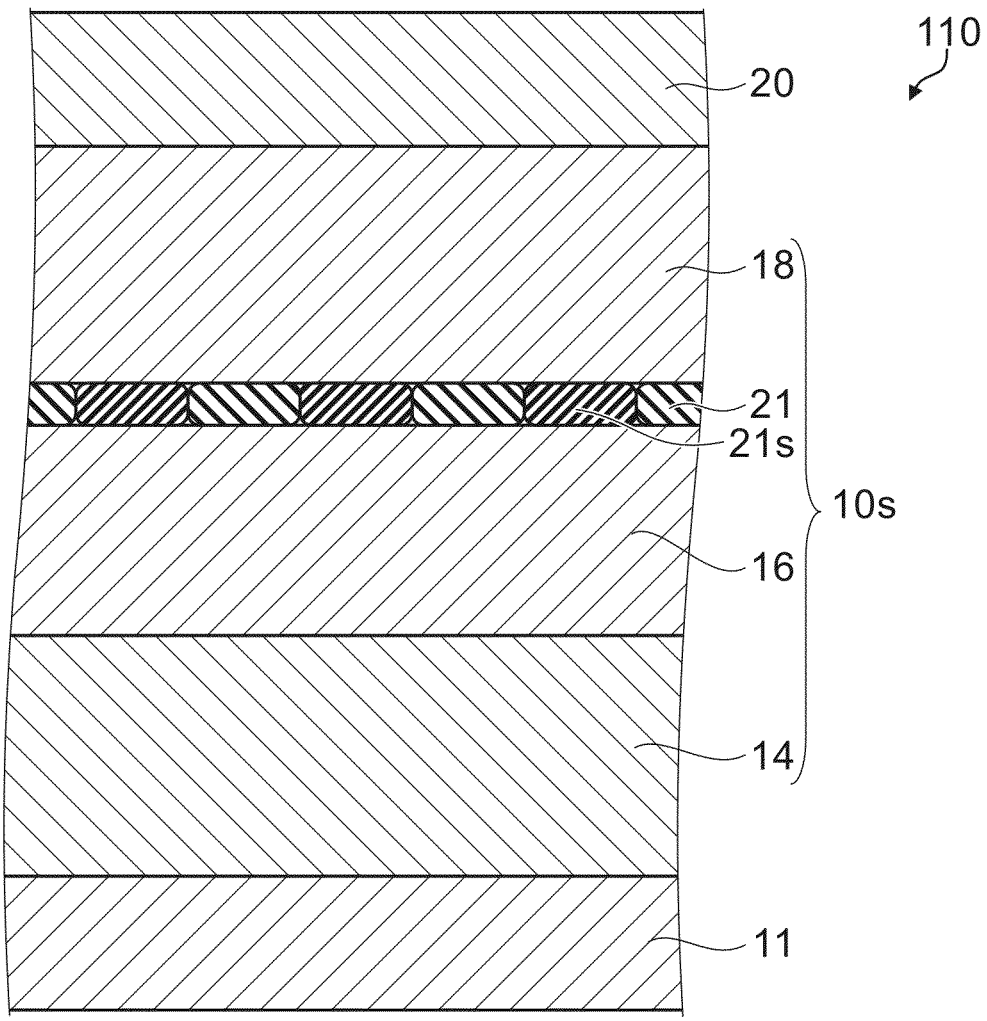
FIG. 1 is a schematic cross-sectional view illustrating a configuration of a magneto-resistance effect element according to a first embodiment.

In general, according to one embodiment, a magneto-resistance effect element includes: a first electrode; a second electrode; a first magnetic layer provided between the first and the second electrodes; a second magnetic layer provided between the first magnetic layer and the second electrode; and an oxide layer of a metal oxide provided between the first magnetic layer and the second magnetic layer. The oxide layer includes wustite crystal grains of a wustite structure with a (1 1 1) plane orientation containing iron. A lattice spacing of a (1 1 1) plane of the wustite crystal grains is not less than 0.253 nanometers and not more than 0.275 nanometers.

In general, according to another embodiment, a magneto-resistance effect element includes: a nonmagnetic layer including a first portion and a second portion away from the first portion; a first electrode stacked with the first portion; a first magnetic layer provided between the first portion and the first electrode; a second electrode stacked with the second portion; a second magnetic layer provided between the second portion and the second electrode; and an oxide layer of a metal oxide provided at least one of between the first electrode and the first portion and between the second electrode and the second portion, the oxide layer including wustite crystal grains of a wustite structure with a (1 1 1) plane orientation containing iron, a lattice spacing of a (1 1 1) plane of the wustite crystal grains being not less than 0.253 nanometers and not more than 0.275 nanometers.

In general, according to another embodiment, a magnetic head assembly includes: a magneto-resistance effect element; a suspension mounted with the magneto-resistance effect element at one end; and an actuator arm connected to another end of the suspension, the magneto-resistance effect element including: a first electrode; a second electrode; a first magnetic layer provided between the first electrode and the second electrode; a second magnetic layer provided between the first magnetic layer and the second electrode; and an oxide layer of a metal oxide provided between the first magnetic layer and the second magnetic layer, the oxide layer including wustite crystal grains of a wustite structure with a (1 1 1) plane orientation containing iron, a lattice spacing of a (1 1 1) plane of the wustite crystal grains being not less than 0.253 nanometers and not more than 0.275 nanometers.

In general, according to another embodiment, a magnetic recording and reproducing apparatus includes: a magnetic head assembly; and a magnetic recording medium on which information is recorded using the magneto-resistance effect element mounted on the magnetic head assembly, the magnetic head assembly including: the magneto-resistance effect element; a suspension mounted with the magneto-resistance effect element at one end; and an actuator arm connected to another end of the suspension, the magneto-resistance effect element including: a first electrode; a second electrode; a first magnetic layer provided between the first electrode and the second electrode; a second magnetic layer provided between the first magnetic layer and the second electrode; and an oxide layer of a metal oxide provided between the first magnetic layer and the second magnetic layer, the oxide layer including wustite crystal grains of a wustite structure with a (1 1 1) plane orientation containing iron, a lattice spacing of a (1 1 1) plane of the wustite crystal grains being not less than 0.253 nanometers and not more than 0.275 nanometers.

In general, according to another embodiment, a magnetic memory includes a magneto-resistance effect element including: a first electrode; a second electrode; a first magnetic layer provided between the first electrode and the second electrode; a second magnetic layer provided between the first magnetic layer and the second electrode; and an oxide layer of a metal oxide provided between the first magnetic layer and the second magnetic layer, the oxide layer including wustite crystal grains of a wustite structure with a (1 1 1) plane orientation containing iron, a lattice spacing of a (1 1 1) plane of the wustite crystal grains being not less than 0.253 nanometers and not more than 0.275 nanometers.

Hereinbelow, embodiments of the invention are described with reference to the drawings.

The drawings are schematic or conceptual; and the relationships between the thickness and width of portions, the proportions of sizes among portions, etc. are not necessarily the same as the actual values thereof. Further, the dimensions and proportions may be illustrated differently among drawings, even for identical portions.

In the specification of this application and the drawings, components similar to those described in regard to a drawing thereinabove are marked with the same reference numerals, and a detailed description is omitted as appropriate.

First Embodiment

FIG. 1 is a schematic cross-sectional view illustrating the configuration of a magneto-resistance effect element according to a first embodiment.

As shown in FIG. 1, a magneto-resistance effect element 110 according to the embodiment includes a first electrode 11, a second electrode 20, a first magnetic layer 14, a second magnetic layer 18, a nonmagnetic layer 16, and an oxide layer 21.

The second electrode 20 is stacked with the first electrode 11.

In the specification of this application, "stack" includes not only the state of being stacked in contact but also the case of being stacked via other components. Here, the stacking direction of the first electrode 11 and the second electrode 20 is defined as a Z-axis direction. One axis perpendicular to the Z-axis direction is defined as an X-axis direction. The direction perpendicular to the Z-axis direction and the X-axis direction is defined as a Y-axis direction. The second electrode 20 is stacked with the first electrode 11 along the Z-axis direction (the stacking direction).

The first magnetic layer 14 is provided between the first electrode 11 and the second electrode 20. The second magnetic layer 18 is provided between the first magnetic layer 14 and the second electrode 20. The nonmagnetic layer 16 is provided between the first magnetic layer 14 and the second magnetic layer 18. The nonmagnetic layer 16 is, for example, a spacer layer.

The oxide layer 21 is provided between the first electrode 11 and the second electrode 20. The oxide layer 21 is a metal oxide. The oxide layer 21 includes wustite crystal grains 21s with the (111) plane orientation of the wustite structure containing iron (Fe). The lattice spacing of the (111) plane of the wustite crystal grains 21s is not less than 0.253 nanometers (nm) and not more than 0.275 nm. Examples of the oxide layer 21 are described later.

In this example, the oxide layer 21 is provided between the nonmagnetic layer 16 and the second magnetic layer 18. The embodiment is not limited thereto, and the oxide layer 21 is provided in an arbitrary position between the first electrode 11 and the second electrode 20.

The first magnetic layer 14, the second magnetic layer 18, and the nonmagnetic layer 16 are occasionally referred to as a stacked body 10s. In this example, since the oxide layer 21 is provided between the nonmagnetic layer 16 and the second magnetic layer 18, the stacked body 10s includes also the oxide layer 21. The stacked body 10s corresponds to a spin valve film.

A ferromagnetic material is used for the first magnetic layer 14 and the second magnetic layer 18. The behavior of the change in the magnetization direction of the first magnetic layer 14 is different from the behavior of the change in the magnetization direction of the second magnetic layer 18. For example, the magnetization direction of the second magnetic layer 18 changes with the external magnetic field relatively easily. The second magnetic layer 18 is, for example, a free layer. The magnetization direction of the first magnetic layer 14 is, for example, substantially fixed in one direction. Alternatively, the magnetization direction of the second magnetic layer 18 is less likely to change with the external magnetic field than the magnetization direction of the first magnetic layer 14. The second magnetic layer 18 is, for example, a pinned layer. The second magnetic layer 18 is, for example, a reference layer.

The first electrode 11 and the second electrode 20 can pass a current through the stacked body 10s. The electric resistance of the stacked body 10s when a current is passed through the stacked body 10s via the first electrode 11 and the second electrode 20 changes with the relative angle between the magnetization direction of the first magnetic layer 14 and the magnetization direction of the second magnetic layer 18. The magneto-resistance effect element 110 functions as a magnetic sensor by the change in the relative angle between the magnetization direction of the first magnetic layer 14 and the magnetization direction of the second magnetic layer 18 in accordance with the external magnetic field. The read operation of information written in a magnetic recording medium, for example, can be performed using the magneto-resistance effect element 110. Furthermore, the operation of the storage and reproduction of a magnetic memory can be performed using the magneto-resistance effect element 110.

There is a TMR head including a spin valve film with high sensitivity which utilizes the tunneling magneto-resistance (TMR) effect. The spin valve film has a sandwich structure in which a spacer layer (a nonmagnetic layer) is placed between two ferromagnetic layers. Examples of the magneto-resistance effect element using a spin valve film include a CIP (current in plane)-GMR element, a CPP (current perpendicular to plane)-GMR element, a TMR (tunneling magneto-resistance) element, etc. In the CIP-GMR element, a sense current is passed parallel to the surface of the spin valve film, and in the CPP-GMR element and the TMR element, a sense current is passed in a direction almost perpendicular to the surface of the spin valve film. In the system in which a current is passed in a direction perpendicular to the film surface, a metal layer is used as the spacer layer in the CPP-GMR element, and an insulating layer is used as the spacer layer in the TMR element.

The magneto-resistance effect element 110 according to the embodiment is, for example, a current-perpendicular-to-plane magneto-resistance effect element. As described later, the magneto-resistance effect element 110 can employ the operation of the CPP-GMR element or the operation the TMR element.

Some magneto-resistance effect elements have a configuration in which a thin film spin filter (SF) layer of an oxide or a nitride is interposed in a ferromagnetic layer or at the interface between a ferromagnetic layer and a nonmagnetic spacer layer. The SF layer has the spin filter effect of inhibiting the current passage of up spin electrons or down spin electrons. The MR ratio can be improved by the SF layer. The oxide layer 21 according to the embodiment functions as, for example, the SF layer.

The MR ratio in the magneto-resistance effect element 110 depends on the spin-dependent scattering (bulk scattering) in the magnetic layer and the spin-dependent interface scattering at the interface between the magnetic layer and the spacer layer. The MR ratio is improved by using a material of large spin-dependent scattering for the magnetic layer and the spacer layer.

Examples of the magneto-resistance effect element according to the embodiment will now be further described.

Figure 2:
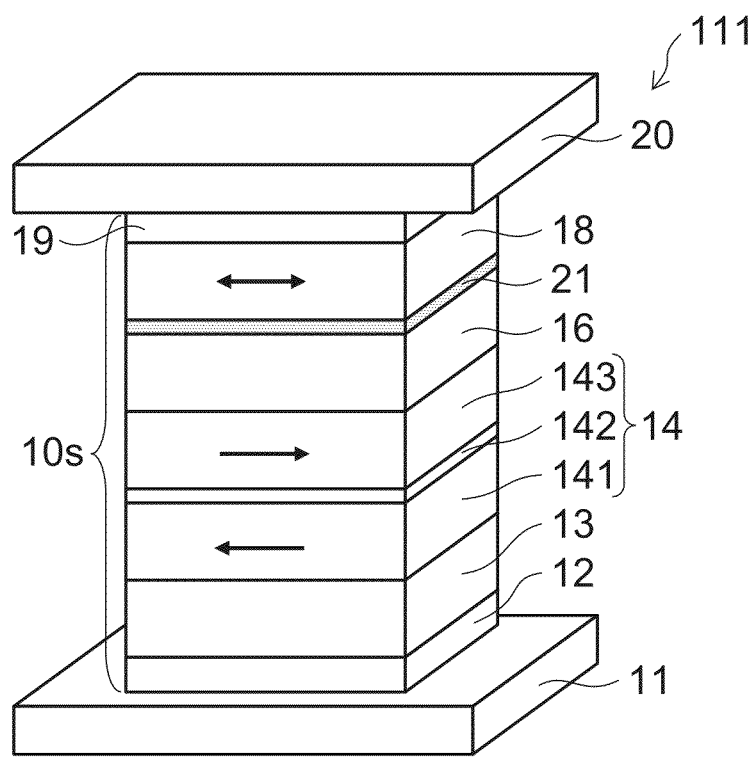
FIG. 2 is a schematic perspective view illustrating a configuration of a magneto-resistance effect element according to the first embodiment.

FIG. 2 is a schematic perspective view illustrating the configuration of a magneto-resistance effect element according to the first embodiment.

As shown in FIG. 2, a magneto-resistance effect element 111 according to the embodiment includes the first electrode 11, the second electrode 20, the first magnetic layer 14, the second magnetic layer 18, the nonmagnetic layer 16, and the oxide layer 21 mentioned above.

In this example, an underlayer 12 is provided on the first electrode 11, and a pinning layer 13 is provided on the underlayer 12. In the underlayer 12, for example, a buffer layer (not shown) and a seed layer (not shown) are stacked. The buffer layer is provided on the first electrode side, and the seed layer is provided on the pinning layer 13 side.

The first magnetic layer 14 is provided on the pinning layer 13. In this example, a pinned layer in which the magnetization direction is fixed is used as the first magnetic layer 14.

In this example, the first magnetic layer 14 includes a lower pinned layer 141 provided on the pinning layer 13, a magnetic coupling layer 142 provided on the lower pinned layer 141, and an upper pinned layer 143 provided on the magnetic coupling layer 142.

The nonmagnetic layer 16 is provided on the first magnetic layer 14. The nonmagnetic layer 16 functions as, for example, a spacer layer. The nonmagnetic layer 16 contains a material made of a nonmagnetic substance.

The oxide layer 21 is provided on the nonmagnetic layer 16.

The second magnetic layer 18 is provided on the oxide layer 21. In this example, a free layer in which the magnetization direction rotates is used as the second magnetic layer 18.

A cap layer 19 is provided on the second magnetic layer 18. The cap layer 19 protects the magneto-resistance effect element 110 from degradation such as oxidation, for example.

The second electrode 20 is provided on the cap layer 19.

In the embodiment, the vertical relationship between the first electrode 11 and the second electrode 20 is arbitrary. In FIG. 1, the first magnetic layer 14, the nonmagnetic layer 16, the oxide layer 21, the second magnetic layer 18, and the second electrode 20 are provided in this order on the first electrode 11, but the vertical relationships are arbitrary.

In the magneto-resistance effect elements 110 and 111 having such configurations, the MR ratio can be greatly improved by providing the oxide layer 21 mentioned above. Examples of the oxide layer 21 will now be described.

Figure 3:
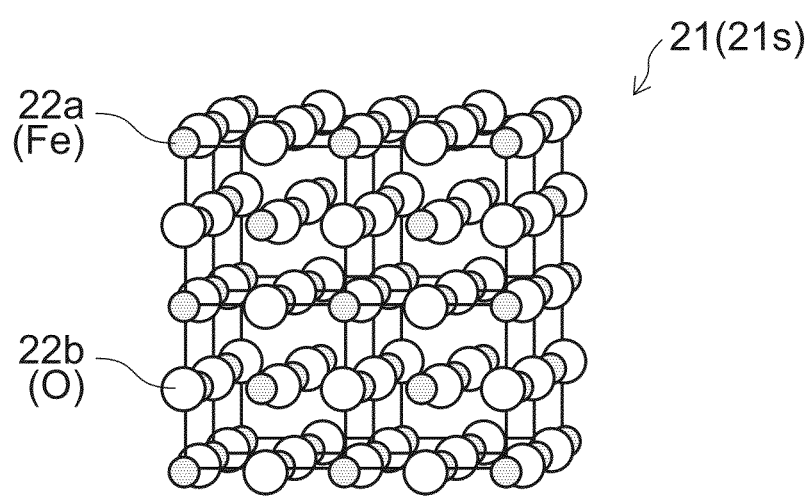
FIG. 3 is a schematic view illustrating a configuration of the magneto-resistance effect element according to the first embodiment.

FIG. 3 is a schematic view illustrating the configuration of the magneto-resistance effect element according to the first embodiment.

FIG. 3 illustrates the configuration of the wustite crystal grains 21s of the oxide layer 21. As shown in FIG. 3, the wustite crystal grains 21s has a NaCl structure. The wustite crystal grains 21s contain Fe atoms 22a and oxygen atoms 22b, and the wustite crystal grains 21s have the wustite structure that is one of the NaCl structures.

When a metal element is denoted by Me and the oxygen element is denoted by O, the chemical formula of the metal oxide of the wustite structure can be substantially expressed as MeO. Since the oxygen element becomes a divalent negative ion, the metal element of the metal oxide becomes a divalent positive ion ($Me^{2+}$). The wustite crystal grains 21s is expressed as, for example, the chemical formula of $Fe_{0.95}O_1$. This iron oxide of the wustite structure is called "wustite." Wustite is stable when it has a composition of approximately $Fe_{0.95}O_{1.00}$. The oxygen concentration in the metal oxide is approximately 51 atomic percent (at. %).

Figure 4A:
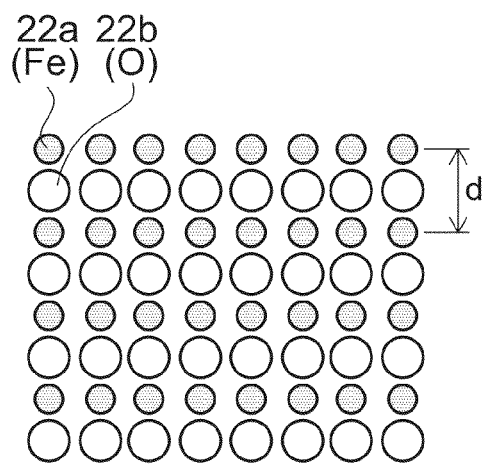
FIG. 4A and FIG. 4B are schematic views illustrating a configuration of the magneto-resistance effect element.
Figure 4B:
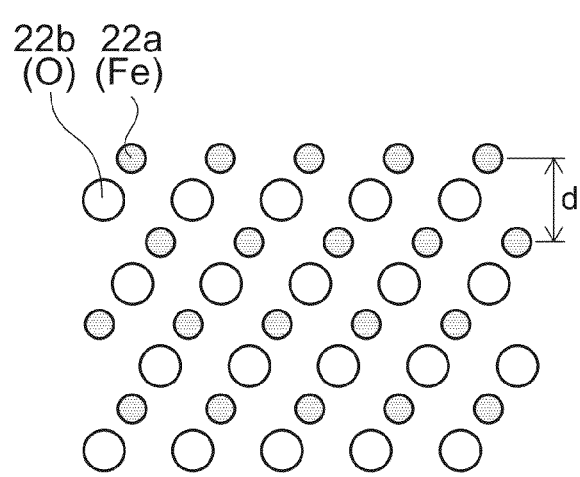

FIG. 4A and FIG. 4B are schematic views illustrating the configuration of the magneto-resistance effect element.

The drawings show the atomic layer structure in the [1 1 1] direction of $Me_{0.95}O_1$ (i.e., $Fe_{0.95}O_1$). FIG. 4A is a cross-sectional view taken along a plane perpendicular to the [−1 −1 2] direction. FIG. 4B is a cross-sectional view taken along a plane perpendicular to the [1 −1 0] direction.

As shown in FIG. 4A and FIG. 4B, a unit of Me/O/Me/O is repeated in the atomic layer structure in the [1 1 1] direction of $Me_{0.95}O_1$. Here, in the case where Me is an Fe atom, the bulk value of the lattice spacing d in the [1 1 1] direction of $Fe_{0.95}O_1$ (i.e., the bulk value of the lattice spacing d of the (1 1 1) plane of $Fe_{0.95}O_1$) is 0.25 nm. In the case where Me is a Zn atom, also the bulk value of the lattice spacing d in the [1 1 1] direction of ZnO (i.e., the bulk value of the lattice spacing d of the (1 1 1) plane of ZnO) is 0.25.

In the magneto-resistance effect element 110 according to the embodiment, the oxide layer 21 includes the wustite crystal grains 21s, and the lattice spacing d of the (1 1 1) plane of the wustite crystal grains 21s is 0.253 nm or more. That is, the lattice spacing d of the (1 1 1) plane of the wustite crystal grains 21s is larger than the bulk value (0.25 nm) of the lattice spacing d of the (1 1 1) plane of $Fe_{0.95}O_1$. Thereby, the MR ratio can be improved.

Such a configuration is based on the new findings found by an experiment independently conducted by the inventor of this application. This experiment will now be described. In this experiment, samples having the configuration of the magneto-resistance effect element 111 illustrated in FIG. 2 were fabricated.

Samples C1-1 to C1-5 and Samples E1-1 to E1-3 shown in Table 1 will now be described. In the following, "(nm)" after the name of the material indicates the thickness of the layer of the material. Furthermore, "Material A/Material B" indicates that a layer of Material B is provided on a layer of Material A.

TABLE 1

|      | tm (nm) | d (nm) | MR (%) | RA (Ω μm²) |
|------|---------|--------|--------|------------|
| C1-1 | 4       | —      | 1.5    | 0.05       |
| C1-2 | 8       | —      | 2.5    | 0.05       |
| C1-3 | 3       | 0.25   | 10     | 0.2        |
| C1-4 | 4       | 0.25   | 12     | 0.19       |
| C1-5 | 5       | 0.252  | 14     | 0.19       |
| E1-1 | 6       | 0.253  | 21     | 0.2        |
| E1-2 | 7       | 0.257  | 23.5   | 0.2        |
| E1-3 | 8       | 0.261  | 26     | 0.21       |

The configuration of Sample E1-1 is as follows:
The underlayer 12: Ta (1 nm)/Ru (2 nm)
The pinning layer 13: $Ir_{22}Mn_{78}$ (7 nm)
The first magnetic layer 14: $Co_{75}Fe_{25}$ (4.4 nm)/Ru (0.9 nm)/$Fe_{50}Co_{50}$ (6 nm)
The nonmagnetic layer 16: Cu (1.5 nm)
The oxide layer 21: Zn—Fe—O (1.5 nm)
The second magnetic layer 18: $Fe_{50}Co_{50}$ (6 nm)
The cap layer 19: Cu (1 nm)/Ta (2 nm)/Ru (5 nm)

The stacked body mentioned above was formed on the first electrode 11 provided on a substrate, and then anneal treatment at 280° C. for 5 hours was performed. After that, the second electrode 20 was formed.

In the first magnetic layer 14, $Co_{75}Fe_{25}$ (4.4 nm) corresponds to the lower pinned layer 141, Ru (0.9 nm) corresponds to the magnetic coupling layer 142, and $Fe_{50}Co_{50}$ (6 nm) corresponds to the upper pinned layer 143.

In the fabrication of the oxide layer 21, an Fe layer with a thickness of 1 nm was formed on the nonmagnetic layer 16, and a Zn layer with a thickness of 0.24 nm was formed on the Fe layer. Next, surface oxidation was performed to covert the two layers into a mixed oxide of Zn and Fe (hereinafter, written as Zn—Fe—O). In the conversion into the oxide, ion-assisted oxidation (IAO) treatment was used as the surface oxidation, and after the surface oxidation, RF plasma treatment using Ar gas was performed. Thus, the oxide layer 21 is formed.

In this experiment, the thickness tm (nm) of the upper pinned layer 143 and the second magnetic layer 18 ($Fe_{50}CO_{50}$) was changed. That is, in Samples E1-1, E1-2, and E1-3, the thickness tm is 6 nm, 7 nm, and 8 nm, respectively.

In Samples C1-1 and C1-2, the oxide layer 21 is not provided in the configuration mentioned above. In Samples C1-3, C1-4, and C1-5, the oxide layer 21 is provided, and the thickness tm of the upper pinned layer 143 and the second magnetic layer 18 is 3 nm, 4 nm, and 5 nm, respectively. Otherwise, the conditions are similar to those of Sample E1-1.

Table 1 shows the investigation results of the MR ratio (MR) and the resistance area RA of these samples.

As can be seen from Table 1, in Samples C1-1 and C1-2 in which the oxide layer 21 is not provided, the MR ratio (MR) is 1.5% to 2.5%. In Samples C1-3, C1-4, and C1-5 in which the oxide layer 21 is provided, the MR ratio is 10% to 14%, and the MR ratio is improved as compared to the case where the oxide layer 21 is not provided.

Furthermore, in the case where the oxide layer 21 is provided, it has been found that in Samples E1-1 to E1-3 in which the thickness tm of the upper pinned layer 143 and the second magnetic layer 18 is 6 nm to 8 nm, the MR ratio is 21% to 26%, and the MR ratio is very large as compared to the case where the thickness tm is 3 nm to 5 nm. As shown in Table 1, in Samples C1-3 to C1-5 and Samples E1-1 to E1-3 in which the oxide layer 21 is provided, the resistance area RA is approximately 0.2 Ωμm², and the resistance area RA is almost steady.

Thus, in the case where the oxide layer 21 is provided, the MR ratio is very large when the thickness tm of the upper pinned layer 143 and the second magnetic layer 18 is as thick as 6 nm or more. To analyze the cause of this, the crystal structure of the oxide layer 21 was investigated by cross-sectional TEM for Sample E1-3 and Sample C1-4.

Figure 5A:
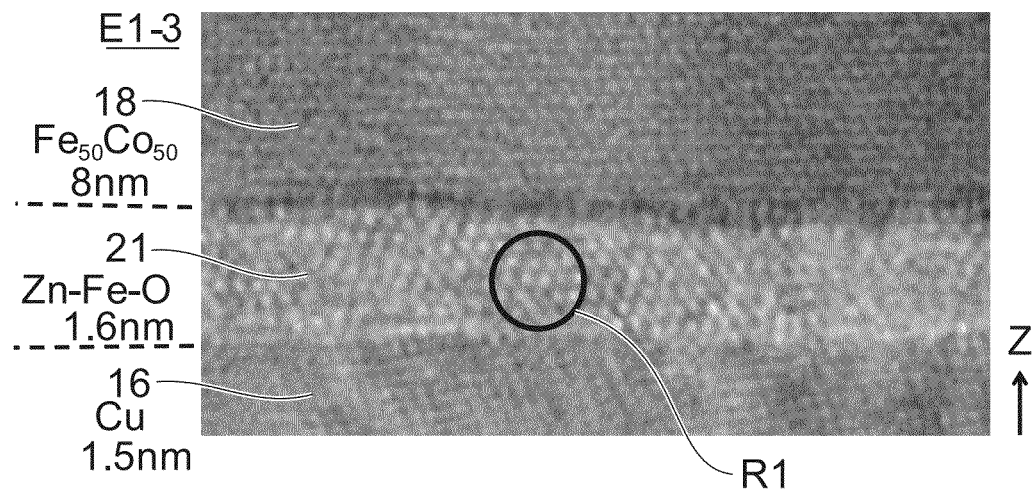
FIG. 5A and FIG. 5B are cross-sectional TEM images illustrating characteristics of the magneto-resistance effect element.
Figure 5B:
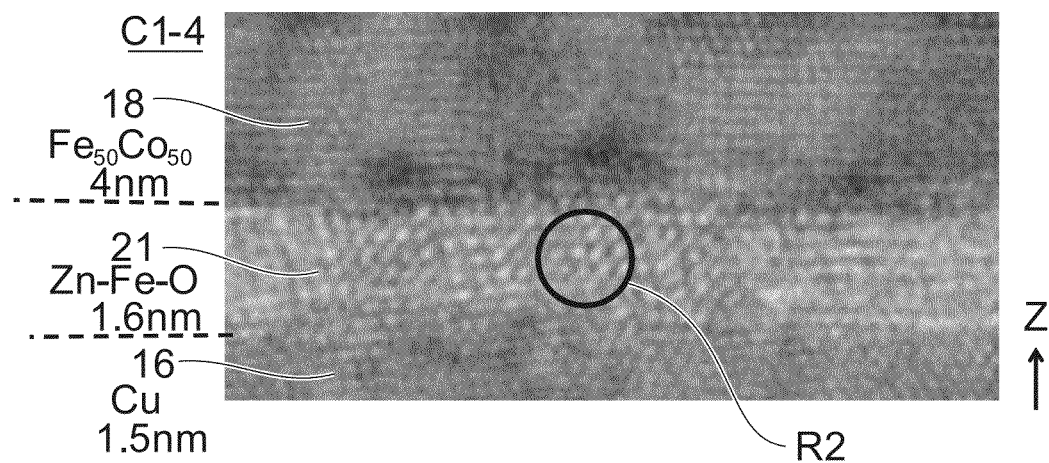

FIG. 5A and FIG. 5B are cross-sectional TEM images illustrating characteristics of the magneto-resistance effect element.

FIG. 5A and FIG. 5B show the cross-sectional TEM images of Sample E1-3 and Sample C1-4, respectively. As shown in FIG. 5A and FIG. 5B, in both Sample E1-3 and Sample C1-4, the oxide layer 21 with a thickness of approximately 1.5 nm is formed between the nonmagnetic layer 16 and the second magnetic layer 18. The oxide layer 21 is a substantially uniform Zn—Fe oxide layer. In both Sample C1-4 and Sample E1-3, the oxide layer 21 has a crystal structure. To investigate the crystal structure of the oxide layer 21 in detail, an FFT analysis was performed.

FIG. 6A and FIG. 6B are FFT analysis images illustrating characteristics of the magneto-resistance effect element.

FIG. 6A and FIG. 6B show diffraction patterns obtained by calculation using the results of the FFT analysis for Regions R1 and R2 surrounded by the circles shown in FIG. 5A and FIG. 5B, respectively.

The diffraction patterns illustrated in FIG. 6A and FIG. 6B agree with the reciprocal lattice map of wustite projected from the [1 −1 0] direction or the [−1 1 0] direction, with the [1 1 1] direction set on the upper side. From the drawings, it has been found that in both Sample E1-3 and Sample C1-4, the oxide layer 21 is a (1 1 1) orientation film of the wustite structure. Also for other samples (Samples E1-1 and E1-2 and Samples C1-3 and C1-5), it has been found through a similar analysis that the oxide layer 21 is a (1 1 1) orientation film of the wustite structure.

In Sample C1-4 illustrated in FIG. 6B, the lattice spacing d of the wustite (1 1 1) orientation plane of the oxide layer 21 is 0.250 nm, which is substantially equal to that of bulk wustite. In contrast, in Sample E1-3 illustrated in FIG. 6A, the lattice spacing d of the wustite (1 1 1) orientation plane of the oxide layer 21 was 0.260 nm, which was larger than the value of the bulk. That is, in Sample E1-3, the lattice spacing d is expanded in the perpendicular-to-film-surface direction to cause warpage. Table 1 similarly shows the investigation results of the lattice spacing d of the wustite (1 1 1) orientation plane for the samples mentioned above.

The results shown in Table 1 have revealed that the lattice spacing d of the wustite (1 1 1) orientation plane is widened when the thickness tm of the $Fe_{50}Co_{50}$ layer of the upper pinned layer 143 and the second magnetic layer 18 is increased. This is a phenomenon found by this experiment by the inventor of this application for the first time.

The (1 1 1) orientation plane of the wustite crystal of the oxide layer 21 and the bcc (1 1 0) orientation plane of $Fe_{50}Co_{50}$ are lattice-matched to be quasi-epitaxially grown. The lattice spacing d in the in-film-surface direction of the wustite (1 1 1) orientation plane is shorter than the lattice spacing in the in-film-surface direction of the bcc (1 1 0) orientation plane of $Fe_{50}Co_{50}$. In the quasi-epitaxial growth of such crystals with different lattice spacings, it is considered that a crystal with a wide lattice spacing is contracted and a crystal with a small lattice spacing is expanded in order to be lattice-matched. Hence, the lattice spacing in the in-film-surface direction of the wustite crystal lattice-matched to $Fe_{50}Co_{50}$ is contracted, and consequently the lattice spacing in the perpendicular-to-film-surface direction is expanded. In the case where the thickness tm of $Fe_{50}Co_{50}$ is thick, it is considered that, since the crystal of $Fe_{50}Co_{50}$ works to maintain the bulk value more, the change in the lattice spacing of $Fe_{50}Co_{50}$ is suppressed and the change in the lattice spacing of wustite is increased. It is considered that this mechanism leads to the finding of this time that the lattice spacing d of the wustite (1 1 1) orientation plane is increased when the thickness tm of the $Fe_{50}Co_{50}$ layer of the upper pinned layer 143 and the second magnetic layer 18 is thick.

In addition, this experiment has shown that a large MR ratio is obtained when the lattice spacing d of the wustite (1 1 1) orientation plane is large (wide). Also this is a phenomenon found by this experiment for the first time. In particular, a very large MR ratio was obtained in Samples E1-1, E1-2, and E1-3 in which the thickness tm of the $Fe_{50}Co_{50}$ layer was set to 6 nm or more and the lattice spacing d of the wustite (1 1 1) orientation plane was set to 0.253 nm or more.

The magneto-resistance effect elements 110 and 111 according to the embodiment have a configuration in which, based on such newly found findings, the oxide layer 21 includes the wustite crystal grains 21s with the (1 1 1) plane orientation of the wustite structure containing Fe and the lattice spacing of the (1 1 1) plane of the wustite crystal grains 21s is 0.253 nm or more. Thereby, a large MR ratio can be obtained.

In the band structure of the oxide layer 21 including the wustite crystal grains 21s, the difference between the state densities of up spin electrons and down spin electrons at the Fermi surface or the difference between the derivatives of the state densities of up spin electrons and down spin electrons is large when the lattice spacing d is larger than the bulk value. Therefore, it is considered that high spin-dependent scattering can be obtained at this time. Thus, it is considered that the MR ratio is improved by providing the oxide layer 21 of a structure in which the lattice spacing d is larger than the bulk value.

FIG. 7 is a graph illustrating characteristics of the magneto-resistance effect element.

FIG. 7 illustrates the profile of the crystal orientation dispersion for Sample E1-3. The crystal orientation dispersion illustrated in FIG. 7 is obtained by a procedure in which the FFT analysis of the cross-sectional TEM image illustrated in FIG. 6A is performed for a plurality of positions and the dispersion of the orientation of the (1 1 1) plane orientation plane is plotted against the perpendicular-to-film-surface direction. The horizontal axis is the dispersion angle ω, and the vertical axis is the number of regions (arbitrary scale) of FFT analysis where a (1 1 1) plane exists at each dispersion angle. The dispersion angle ω corresponds to the angle between the perpendicular-to-film-surface direction and the (1 1 1) plane orientation direction.

As shown in FIG. 7, in Sample E1-3, the crystal orientation dispersion angle of the oxide layer 21 was approximately 5 degrees. The smaller the crystal orientation dispersion angle is, the more preferable it is because a larger MR ratio can be obtained. The absolute value of the crystal orientation dispersion angle is preferably 10 degrees or less, and more preferably 5 degrees or less like Sample E1-3. When a similar analysis was made also for Samples E1-1 and E1-2, the absolute value of the crystal orientation dispersion angle was approximately 5 degrees also in these samples.

When an EDX line analysis was made for the cross-sectional TEM image of the oxide layer 21 of Samples E1-1, E1-2, and E1-3, the peaks of Zn, Fe, and O agreed in the position corresponding to the oxide layer 21. From this, it is found that during film-formation, Zn and Fe deposited in a stacked structure like Fe (1 nm)/Zn (0.24 nm) are mixed together by the energy assist in the surface oxidation, and a mixed oxide layer is formed.

In the magneto-resistance effect element according to the embodiment, it has been found through the TEM images and the EDX line analysis that similarly uniform oxide layers are formed.

The crystal structure of the oxide layer 21 can be analyzed also by obtaining a nano-diffraction pattern by applying an electron beam with a diameter of approximately 1 nm to the portion of the oxide layer 21 in the cross-sectional TEM sample of the magneto-resistance effect element.

In the foregoing, it is illustrated that the lattice spacing d of the wustite (1 1 1) orientation plane is widened when the thickness tm of the $Fe_{50}Co_{50}$ layer of the upper pinned layer 143 and the second magnetic layer 18 is large. The inventor of this application conducted another experiment and has found out that the lattice spacing d of the wustite (1 1 1) orientation plane is widened also when the configuration (e.g. composition) of the oxide layer 21 is changed. This experiment will now be described.

TABLE 2

|      |                   | d [nm] | MR [%] | RA [Ω μm²] |
| ---- | ----------------- | ------ | ------ | ---------- |
| C1-1 | —                 | —      | 1.5    | 0.05       |
| C1-6 | Fe0.8Zn0.2 1.8 nm | 0.25   | 12     | 0.2        |
| E2-1 | Fe0.7Zn0.3 1.8 nm | 0.253  | 23     | 0.21       |
| E2-2 | Fe0.5Zn0.5 1.8 nm | 0.26   | 26     | 0.21       |
| E2-3 | Fe0.3Zn0.7 1.8 nm | 0.26   | 26     | 0.21       |
| E2-4 | Fe0.1Zn0.9 1.8 nm | 0.26   | 18     | 0.2        |
| C1-7 | Zn 1.8 nm         | —      | 13     | 0.21       |

Sample C1-1 shown in Table 2 is the same as Sample C1-1 shown in Table 1. Sample C1-6 is the same as Sample C1-3 shown in Table 1 except that the thickness tm of the $Fe_{50}Co_{50}$ layer of the upper pinned layer 143 and the second magnetic layer 18 is set to 4 nm and the thickness of the oxide layer 21 is set to 2.5 nm. Table 2 shows also the matrix metal material of the oxide layer 21. Here, in the samples shown in Table 2, an Fe—Zn alloy is used as the matrix to be oxidized. In Samples E2-1 to E2-4, the Zn concentration to Fe in the oxide layer 21 is higher than the Zn concentration to Fe in the oxide layer 21 in Sample C1-6. The configurations of Samples E2-1 to E2-4 are the same as the configuration of Sample C1-6 except for the Zn concentration to Fe in the oxide layer 21. In Sample C1-7, the oxide layer 21 is formed based on only Zn.

Table 2 shows the investigation results of the MR ratio and the resistance area RA of these samples.

In Sample C1-6 and Samples E2-1 to E2-4 in which the oxide layer 21 is provided, the MR ratio is larger than Sample C1-1 in which the oxide layer 21 is not provided. This is the effect of providing the oxide layer 21. In Samples E2-1 to E2-4 in which the Zn concentration to Fe in the oxide layer 21 is increased, the MR ratio is improved as compared to Sample C1-6. In Sample C1-6 and Samples E2-1 to E2-4, the resistance areas RA are approximately 0.2 $\Omega\mu m^2$, which are substantially the same. In Sample C1-7, no crystal grains of NaCl (1 1 1) were observed.

To investigate the cause of the difference in the MR ratio between Sample C1-6 and Sample E2, the crystal structure of the oxide layer 21 in Sample E2-2 was investigated by cross-sectional TEM.

Figure 8:
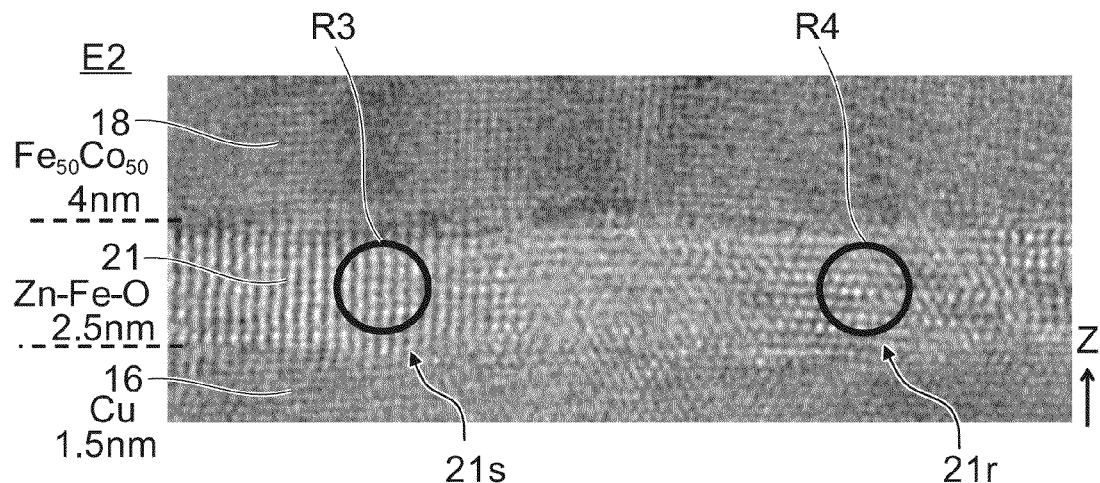
FIG. 8 is a cross-sectional TEM image illustrating characteristics of the magneto-resistance effect element.

FIG. 8 is a cross-sectional TEM image illustrating characteristics of the magneto-resistance effect element.

FIG. 8 shows a cross-sectional TEM image of Sample E2.

Figures 9A, 9B:
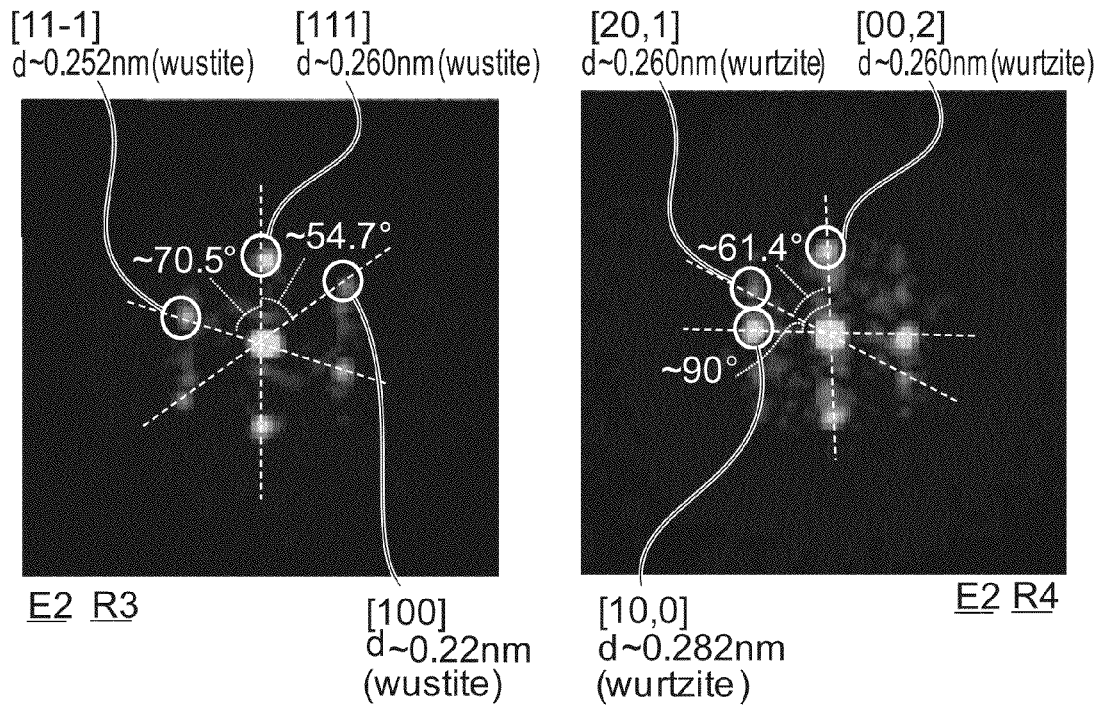
FIG. 9A and FIG. 9B are FFT analysis images illustrating characteristics of the magneto-resistance effect element.

FIG. 9A and FIG. 9B are FFT analysis images illustrating characteristics of the magneto-resistance effect element. FIG. 9A and FIG. 9B show diffraction patterns calculated from the results of an FFT analysis for Region R3 and Region R4 surrounded by the circles shown in FIG. 8.

As can be seen from FIG. 8, a uniform oxide layer 21 with a thickness of approximately 2.5 nm is formed also in Sample E2-2 using a Zn—Fe—O film with an increased Zn content.

As can be seen from FIG. 9A, in Region R3, a crystal grains with the wustite (1 1 1) orientation (the wustite crystal grains 21s) was observed. This structure is similar to the structure described in regard to Sample E1-3.

As can be seen from FIG. 9B, in Region R4, a diffraction spot of a (0 0 2) orientation film of the wurtzite structure was observed. In Region R4 in the oxide layer 21, a wurtzite (0 0 2) orientation crystal grains exists.

Thus, it has been found that a crystal grains with the wustite (1 1 1) orientation (the wustite crystal grains 21s) and a crystal grains with the wurtzite (0 0 2) orientation (a wurtzite crystal grains 21r) coexist in the oxide layer 21 in Sample E2-2.

In Sample E2-2, the oxide layer 21 further includes a crystal grains with the (0 0 2) orientation containing zinc (Zn) (the wurtzite crystal grains 21r) in addition to a crystal grains with the wustite (1 1 1) orientation (the wustite crystal grains 21s). The wurtzite crystal grains 21r has a portion overlapping with the wustite crystal grains 21s when projected onto a plane (e.g. the X-Z plane or the Y-Z plane) parallel to the thickness direction of the oxide layer 21 (the Z-axis direction). For example, the wurtzite crystal grains 21r is juxtaposed to the wustite crystal grains 21s in the X-Y plane.

The lattice spacing d of the (1 1 1) orientation plane of the wustite crystal grains 21s in Region R3 is 0.26 nm, and this value is a value that is more expanded than the bulk value, 0.25 nm. On the other hand, the lattice spacing d of the (0 0 2) orientation plane of the wurtzite structure in Region R4 is 0.26 nm.

Figures 10A, 10B:
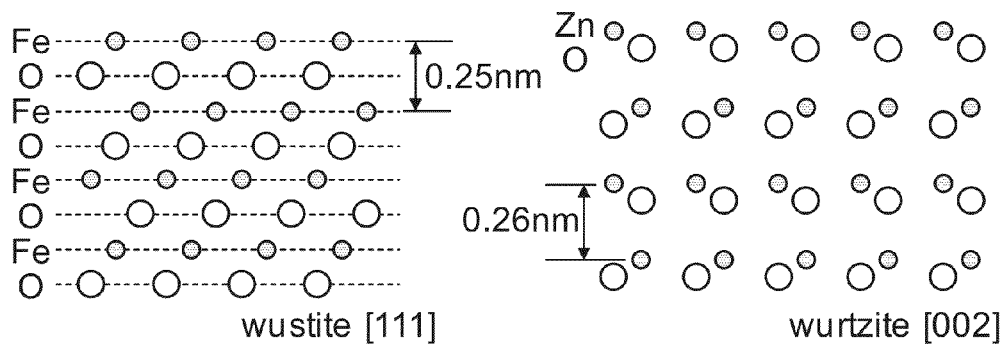
FIG. 10A and FIG. 10B are schematic views showing crystal structures of wustite and wurtzite.

FIG. 10A and FIG. 10B are schematic views showing the crystal structures of wustite and wurtzite.

FIG. 10A illustrates the atomic layer structure in the [1 1 1] direction of bulk wustite. FIG. 10B illustrates the atomic layer structure in the [0 0 2] direction of bulk wurtzite. As shown in FIG. 10A, the lattice spacing d of the (1 1 1) orientation plane of bulk wustite is 0.25 nm. As shown in FIG. 10B, the lattice spacing d of the (0 0 2) orientation plane of bulk wurtzite is 0.26 nm.

Figure 11:
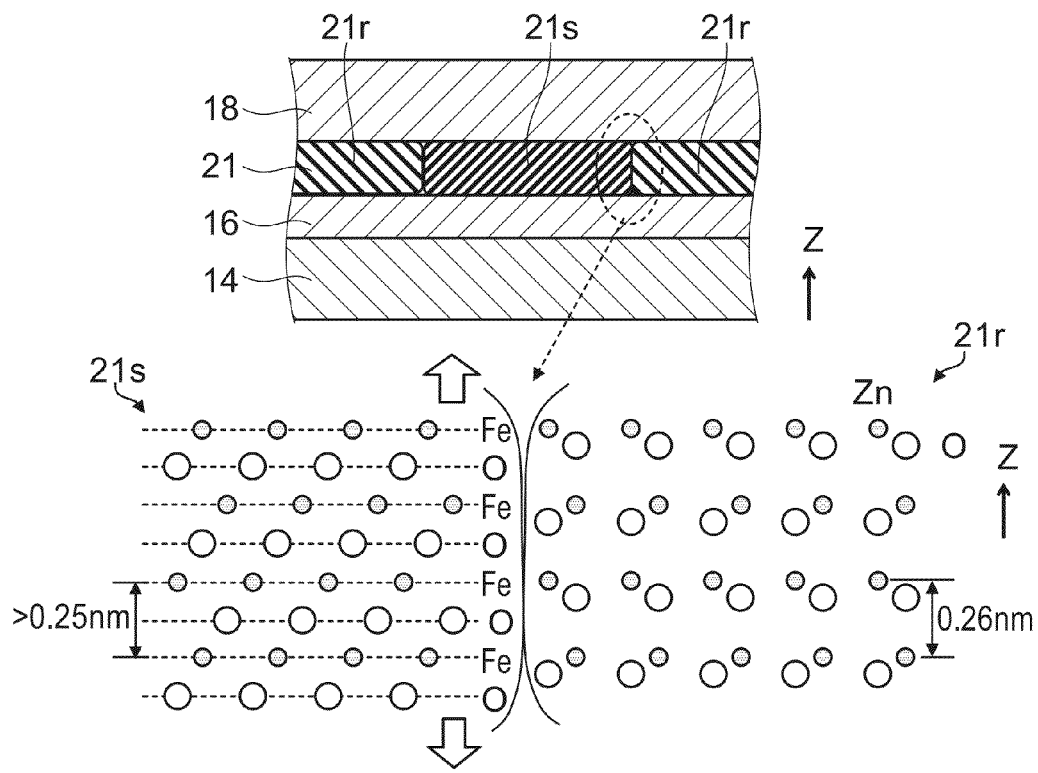
FIG. 11 is schematic views illustrating characteristics of the magneto-resistance effect element according to the first embodiment.

FIG. 11 is schematic views illustrating characteristics of the magneto-resistance effect element according to the first embodiment.

FIG. 11 illustrates the in-plane crystal template effect in the region (interface) between the wustite crystal grains 21s and the wurtzite crystal grains 21r.

As shown in FIG. 11, in the region (e.g. interface) between the wustite crystal grains 21s and the wurtzite crystal grains 21r, it is assumed that the lattice spacing d in the perpendicular-to-film-surface direction is 0.26 nm (the lattice spacing in wurtzite of bulk ZnO) in the wurtzite crystal grains 21r. It is assumed that the lattice spacing d in the perpendicular-to-film-surface direction is 0.25 nm (the lattice spacing in bulk wustite) in the wustite crystal grains 21s. When the wustite crystal grains 21s and the wurtzite crystal grains 21r like these coexist in the same film surface, it is considered that an in-plane crystal template effect occurs and the lattice spacing d in the (1 1 1) orientation plane of wustite is affected by the lattice spacing d of the wurtzite (0 0 2) plane to expand toward 0.26 nm.

It is considered that the lattice spacing d of the wustite crystal grains 21s has thereby expanded in the perpendicular-to-film-surface direction in Sample E2-2.

It has been found that also in Samples E2-1, E2-3, and E2-4, the lattice spacing d of the wustite crystal grains 21s has expanded in the perpendicular-to-film-surface direction as shown in Table 2.

On the other hand, as shown in Table 2, in Sample C1-6, the lattice spacing d of the wustite (1 1 1) orientation plane of the oxide layer 21 was 0.25 nm, which was substantially equal to the bulk value.

Thus, also in this example, it has been found that a large MR ratio is obtained by using the oxide layer 21 including the wustite crystal grains 21s that is expanded in the perpendicular-to-film-surface direction.

Here, as can be seen from Table 2, in the case of forming the oxide 21 in which a wustite crystal grains and a wurtzite crystal grains coexist in the same film surface, there is a preferable Zn concentration range. When the concentration of Zn contained in the matrix metal of the oxide 21 is too small, a wurtzite crystal grains is less likely to be formed. When the concentration of Zn is too large, a wustite crystal grains containing Fe is less likely to be formed. Furthermore, when the concentration of Zn is too large, the area ratio of wurtzite crystal grains to wustite crystal grains in the oxide 21 is increased, and the proportion with which conduction electrons passing through the oxide 21 pass through wustite crystal grains is decreased. In view of the above, in the matrix to be oxidized that forms the oxide 21, the concentration of Zn contained in the metal alloy containing Fe is preferably not less than 30 at. % and not more than 90 at. %, and more preferably not less than 30 at. % and not more than 70 at. %.

A method for forming the oxide layer 21 will now be described in regard to the case where the oxide layer 21 is provided between the nonmagnetic layer 16 and the second magnetic layer 18.

For example, a metal layer containing Fe and Zn that forms the oxide layer 21 is formed on the nonmagnetic layer 16.

Oxidation treatment is performed on the metal layer containing Zn and Fe. Ion-assisted oxidation (IAO), for example, may be used for the oxidation treatment. In the ion-assisted oxidation, for example, oxygen is supplied while the metal layer is irradiated with an ion beam of a rare gas or the like or plasma of a rare gas or the like.

In the case of using ion beam-assisted oxidation treatment, it is preferable that, for example, the acceleration voltage Vb be set not less than 30 V and not more than 130 V and the beam current Ib be set not less than 20 mA and not more than 200 mA. Examples of the conditions of the IAO are described later.

After the IAO, reduction treatment may be further performed. The oxygen concentration of the film of the matrix material after the oxidation treatment can be adjusted by the reduction treatment. Thereby, adjustment can be made to a structure having an oxygen content capable of exhibiting spin-dependent scattering strongly. As the reduction treatment, for example, at least one of irradiation with argon ions, irradiation with argon plasma, and heating is performed.

Another experiment conducted by the inventor of this application will now be described.

In this experiment, in the formation of the oxide layer 21, IAO using an ion beam was performed, and then Ar plasma treatment was performed.

The configurations of the underlayer 12, the pinning layer 13, the nonmagnetic layer 16, and the cap layer 19 are similar to those of Sample E1-1. In this experiment, the lower pinned layer 141 (a $Co_{75}Fe_{25}$ layer) of the first magnetic layer 14 and the magnetic coupling layer 142 (a Ru layer) were similar to those of Sample E1-1, and $Fe_{50}Co_{50}$ (4 nm) was used as the upper pinned layer 143. $Fe_{50}Co_{50}$ (4 nm) was used as the second magnetic layer 18. In the formation of the oxide layer 21, on the nonmagnetic layer 16, an Fe layer with a thickness of 1 nm was formed by sputtering and a Zn layer with a thickness of 0.24 nm was formed by sputtering; then, IAO was performed, after which Ar plasma treatment was performed. Thus, the oxide layer 21 is formed. Then, the second magnetic layer 18 and the cap layer 19 were formed on the oxide layer 21. After that, anneal treatment at 280° C. for 5 hours was performed, and then the second electrode 20 was formed.

The beam current Ib in the IAO was set to a constant value of 60 mA, and the acceleration voltage Vb was changed in a range of 60 V to 120 V. The plasma power Pw in the Ar plasma treatment was changed in a range of 20 W to 100 W. For these samples, the lattice spacing d of the (1 1 1) plane of the wustite crystal grains 21s of the oxide layer 21, the MR ratio, and the resistance area RA were investigated. Table 3 shows the investigation results.

TABLE 3

|  | Vb (V) | Pw (W) | d (nm) | MR (%) | RA (Ω μm²) |
|---|---|---|---|---|---|
| C1-1 | — | — | — | 1.5 | 0.05 |
| C3-1 | 60 | 20 | 0.25 | 10 | 0.2 |
| C3-2 | 60 | 30 | 0.252 | 11.5 | 0.2 |
| E3-1 | 60 | 40 | 0.253 | 18 | 0.2 |
| E3-2 | 60 | 50 | 0.257 | 19 | 0.2 |
| E3-3 | 60 | 60 | 0.260 | 20 | 0.21 |
| E3-4 | 60 | 70 | 0.265 | 20 | 0.2 |
| E3-5 | 60 | 80 | 0.270 | 21 | 0.2 |
| E3-6 | 60 | 100 | 0.275 | 20 | 0.2 |
| E3-7 | 70 | 20 | 0.253 | 19 | 0.21 |
| E3-8 | 80 | 20 | 0.256 | 20 | 0.2 |
| E3-9 | 90 | 20 | 0.260 | 21 | 0.22 |
| E3-10 | 100 | 20 | 0.265 | 21 | 0.17 |
| E3-11 | 110 | 20 | 0.270 | 22 | 0.18 |
| E3-12 | 120 | 20 | 0.275 | 21 | 0.18 |

As can be seen from Table 3, in Sample E3-1 to Sample E3-12, the lattice spacing d of the (1 1 1) plane of the wustite crystal grains 21s is not less than 0.253 nm and not more than 0.275 nm. In these samples, the MR ratio is 18% to 22%, which is very large as compared to Sample C1-1 and Samples C3-1 and C3-2. The resistance area RA of Sample E3-1 to Sample E3-12 was approximately 0.2, which is substantially equal to the value of Samples C3-1 and C3-2.

As can be seen from Table 3, when the power Pw of the Ar plasma treatment is 40 W or more, the lattice spacing d of the (1 1 1) plane of the wustite crystal grains 21s is 0.253 nm or more, and a large MR ratio is obtained. Any value of not less than 60 V and not more than 120 V may be used as the acceleration voltage Vb.

In the embodiment, in the case where zinc (Zn) is further contained in addition to Fe in the matrix material to be oxidized of the oxide layer 21, a high MR ratio can be obtained by making the lattice spacing of the (1 1 1) orientation plane of the wustite crystal grains 21s not less than 0.253 nm and not more than 0.275 nm. Here, the addition amount of the additive element of zinc may be set not less than 0.5 at. % and not more than 70 at. % in the metal alloy containing Fe of the matrix to be oxidized. When the addition amount of the additive element of the matrix to be oxidized is too large, the Fe content is relatively small. Therefore, the addition amount is more preferably set not less than 0.5 at. % and not more than 50 at. % from the viewpoint of obtaining a good wustite structure.

The oxide layer 21 according to the embodiment can be fabricated by appropriately setting treatment conditions including those of oxidation treatment, reduction treatment, etc. and making an appropriate energy assist. For example, in the case where ion beam-assisted oxidation treatment has been performed, when a rare gas is ionized or plasma-ized and applied in forming the oxide layer 21, the acceleration voltage Vb may be set not less than 40 V and not more than 120 V. At this time, the beam current Ib is preferably set not less than 40 mA and not more than 200 mA.

In the case where plasma such as RF plasma is used instead of an ion beam, the plasma power is preferably set to 20 W to 200 W.

In the reduction treatment, for example, in the case where Ar ion beam irradiation is performed, the acceleration voltage Vb is preferably set to 40 V to 130 V, and the beam current Ib is preferably set to 40 mA to 200 mA. In the case where plasma such as RF plasma is used instead of an ion beam, the plasma power Pw is preferably set to 20 W to 200 W. A value of not less than 40 W and not more than 100 W may be used as the plasma power Pw.

In the case where an ion beam or plasma is used in the oxidation treatment in the formation of the oxide layer 21, the irradiation conditions of the ion beam and the irradiation conditions of the plasma may be controlled to control the film stress of the Zn—Fe oxide; thus, the lattice spacing in the perpendicular-to-film-surface direction can be controlled.

In the case where an ion beam or plasma is used in performing the reduction treatment in the formation of the oxide layer 21, the irradiation conditions of the ion beam and the irradiation conditions of the plasma may be controlled to control the film stress of the Zn—Fe oxide; thus, the lattice spacing in the perpendicular-to-film-surface direction can be controlled.

Examples of the configurations of the magneto-resistance effect elements 110 and 111 according to the embodiment will now be further described.

As mentioned above, the wustite crystal grains 21s included in the oxide layer 21 may further contain at least one of cobalt (Co) and nickel (Ni) in addition to Fe.

In the case where the wustite crystal grains 21s contains at least one material selected from the group consisting of Co, Ni, and Zn in addition to Fe, the lattice spacing d of the (1 1 1) plane orientation of the metal oxide of these elements is made 0.253 nm or more, and thereby a large MR ratio can be obtained.

Co and Ni have magnetism at room temperature similarly to Fe. When the wustite crystal grains 21s of the oxide layer 21 contains an oxide of at least one of Co and Ni, a spin filtering layer having a higher spin filtering effect is obtained.

In the case where an ultrathin oxide layer 21 is interposed in the first magnetic layer 14 or the second magnetic layer 18, also the oxide material having no magnetism exhibits magnetism, and a spin filter effect is obtained. In the case where the oxide layer 21 contains an oxide of at least one of Co and Ni in addition to Fe, magnetism may be easily exhibited to obtain a high spin filter effect without being constrained by the limitation of the thickness of the oxide layer 21.

The wustite crystal grains 21s may further contain, for example, zinc (Zn) in addition to Fe. The wustite crystal grains 21s may further contain at least one of tin, indium, and cadmium in addition to Fe.

When the oxide layer 21 contains an oxide material (an oxide semiconductor) containing Zn, In, Sn, and Cd such as ZnO, $In_2O_3$, $SnO_2$, ZnO, CdO, $CdIn_2O_4$, $Cd_2SnO_4$, and $Zn_2SnO_4$, for example, a spin filtering layer with a low resistivity is obtained. These oxide semiconductors are semiconductors having a band gap of 3 eV or more. By employing a composition slightly shifted from the stoichiometric composition to the reduction side, an intrinsic defect such as an oxygen vacancy forms a donor level. Consequently, the conduction electron density reaches a value of approximately not less than $10^{18}$ cm$^{-3}$ and not more than $10^{19}$ cm$^{-3}$. In the band structure of these conductive oxides, the valence band is mainly formed by the 2p orbital of the oxygen atom, and the conduction band is formed by an s orbital of the metal atom. When the carrier density becomes higher than $10^{18}$ cm$^{-3}$, the Fermi level reaches the conduction band to form a degenerate state, for example. Such oxide semiconductors are called n-type degenerate semiconductors, and have a sufficient concentration and mobility of conduction electrons to achieve a low resistivity.

When the wustite crystal grains 21s further contains at least one of zinc (Zn), tin, indium, and cadmium in addition to Fe, the resistivity of the wustite crystal grains 21s can be reduced. Reducing the resistivity of the wustite crystal grains 21s is preferable in terms of obtaining a high MR ratio because the probability of the occurrence of a "spin flip" can be reduced in which a conduction electron loses its spin information when passing through the wustite crystal grains 21s.

The wustite crystal grains 21s may further contain, for example, at least one of copper, titanium, vanadium, chromium, manganese, aluminum, silicon, magnesium, gallium, germanium, platinum, palladium, silver, zirconium, hafnium, and tantalum in addition to Fe.

By adding such an additive element, the band structure can be changed to achieve high spin-dependent scattering. Furthermore, by adding these additive elements, high heat resistance can be obtained. Although the mechanism of the improvement in heat resistance has not yet been completely revealed, this is presumed to be because the density of oxygen vacancies of the wustite crystal grains 21s formed by being slightly shifted from the stoichiometric composition to the reduction side is decreased by the promotion of the reoxidation caused by heat, and the carrier density is changed. Another reason for the improvement in heat resistance may be that the elements mentioned above fall under group III or IV dopants, and these dopants prevent the promotion of the reoxidation of the wustite crystal grains 21s caused by heat, therefore can suppress the change in the carrier density in the wustite crystal grains 21s, and further can suppress the change in the resistivity against heat.

In the case where an oxide layer 21 of a magnetic material is used, the oxide layer 21 itself has the properties of spin-dependent bulk scattering and spin-dependent interface scattering. On the other hand, in the case where an oxide layer 21 of a nonmagnetic material is used, by using it in contact with a metal ferromagnetic material, spin polarization occurs in the nonmagnetic oxide layer due to the spin accumulation effect from the metal ferromagnetic material. Also in such a case, high spin-dependent scattering can be obtained. A significantly large MR ratio can be achieved when the metal oxide forming the oxide layer 21 contains iron (Fe) and zinc (Zn).

In the embodiment, the oxide layer 21 may be disposed in an arbitrary position between the first electrode 11 and the second electrode 20.

FIG. 12A to FIG. 12J are schematic cross-sectional views illustrating the configurations of magneto-resistance effect elements according to the first embodiment.

Figure 12A:
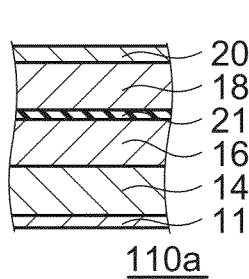
FIG. 12A to FIG. 12J are schematic cross-sectional views illustrating configurations of magneto-resistance effect elements according to the first embodiment.

As shown in FIG. 12A, in a magneto-resistance effect element 110a according to the embodiment, the oxide layer 21 is disposed between the nonmagnetic layer 16 and the second magnetic layer 18.

Figure 12B:
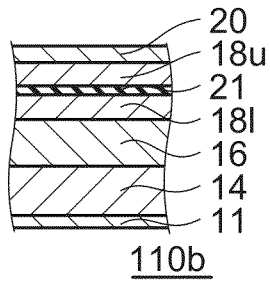

As shown in FIG. 12B, in a magneto-resistance effect element 110b according to the embodiment, the oxide layer 21 is disposed between a second magnetic layer 18l and a third magnetic layer 18u. The third magnetic layer 18u is disposed between the second magnetic layer 18l and the second electrode 20. The second magnetic layer 18l and the third magnetic layer 18u may be regarded as corresponding to the second magnetic layer 18 described in regard to FIG. 1. In this case, the oxide layer 21 corresponds to being disposed in the second magnetic layer 18.

Figure 12C:
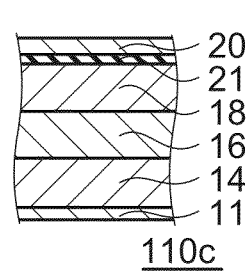

As shown in FIG. 12C, in a magneto-resistance effect element 110c according to the embodiment, the oxide layer 21 is disposed between the second magnetic layer 18 and the second electrode 20.

Figure 12D:
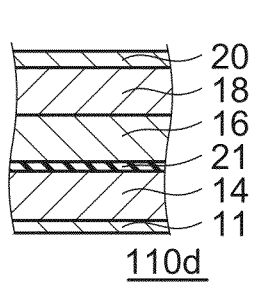

As shown in FIG. 12D, in a magneto-resistance effect element 110d according to the embodiment, the oxide layer 21 is disposed between the first magnetic layer 14 and the nonmagnetic layer 16.

Figure 12E:
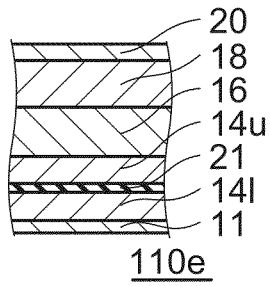

As shown in FIG. 12E, in a magneto-resistance effect element 110e according to the embodiment, the oxide layer 21 is disposed between a first magnetic layer 14u and a fourth magnetic layer 14l. The fourth magnetic layer 14l is disposed between the first magnetic layer 14u and the first electrode 11. The first magnetic layer 14u and the fourth magnetic layer 14l may be regarded as corresponding to the first magnetic layer 14 described in regard to FIG. 1. In this case, the oxide layer 21 corresponds to being disposed in the first magnetic layer 14.

Figure 12F:
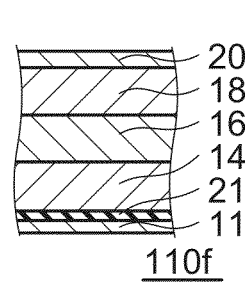

As shown in FIG. 12F, in a magneto-resistance effect element 110f according to the embodiment, the oxide layer 21 is disposed between the first electrode 11 and the first magnetic layer 14.

Figure 12G:
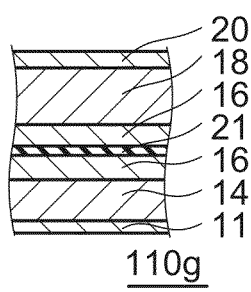

As shown in FIG. 12G, in a magneto-resistance effect element 110g according to the embodiment, the oxide layer 21 is disposed between a first nonmagnetic layer 16l and a second nonmagnetic layer 16u. The second nonmagnetic layer 16u is disposed between the first nonmagnetic layer 16l and the second magnetic layer 18. The first nonmagnetic layer 16l and the second nonmagnetic layer 16u may be regarded as corresponding to the nonmagnetic layer 16 described in regard to FIG. 1. In this case, the oxide layer 21 corresponds to being disposed in the nonmagnetic layer 16.

Figure 12H:
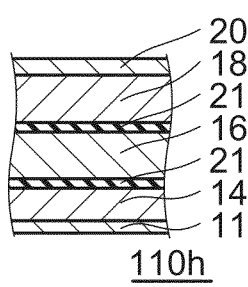

As shown in FIG. 12H, in a magneto-resistance effect element 110h according to the embodiment, two oxide layers 21 are provided. One oxide layer 21 is disposed between the first magnetic layer 14 and the nonmagnetic layer 16, and the other oxide layer 21 is disposed between the nonmagnetic layer 16 and the second magnetic layer 18.

Figure 12I:
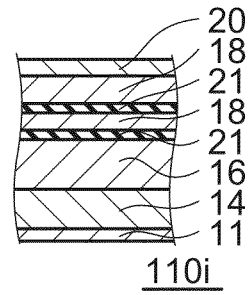

As shown in FIG. 12I, in a magneto-resistance effect element 110i according to the embodiment, two oxide layers 21 are provided. One oxide layer 21 is disposed between the nonmagnetic layer 16 and the second magnetic layer 18, and the other oxide layer 21 is disposed between the second magnetic layer 18 and the second electrode 20. As in the case of the magneto-resistance effect elements 110h and 110i, the oxide layer 21 may be provided in plural.

Figure 12J:
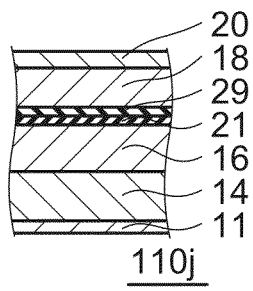

As shown in FIG. 12J, a magneto-resistance effect element 110j according to the embodiment further includes an intermediate nonmagnetic layer 29. The oxide layer 21 is provided between the nonmagnetic layer 16 and the second magnetic layer 18. The intermediate nonmagnetic layer 29 is disposed between the oxide layer 21 and the second magnetic layer 18. The thickness of the intermediate nonmagnetic layer 29 is preferably, for example, 2 nm or less. Thereby, spin accumulation from the magnetic layer into the oxide layer 21 is made and a sufficient spin filtering effect can be exhibited.

Also in the magneto-resistance effect elements 110a to 110j, the lattice spacing d of the (1 1 1) plane of the wustite crystal grains 21s included in the oxide layer 21 is not less than 0.253 nm and not more than 0.275 nm. Thereby, a large MR ratio is obtained.

The thickness of the oxide layer 21 is preferably not less than 0.5 nm and not more than 4 nm. In a range of 0.5 nm or more, for example, it is easy to obtain a uniform oxide layer 21. In a range of 4 nm or less, for example, the increase in the element resistance can be suppressed.

Examples of the configuration of the magneto-resistance effect element 110 (111) will now be described with reference to FIG. 2. At least one of copper (Cu) and gold (Au), for example, is used for the first electrode 11 and the second electrode 20. By using a material with a relatively small electric resistance as these electrodes, a current can be efficiently supplied to the stacked body 10s.

A buffer layer not shown in FIG. 2 absorbs the roughness of the surface of the first electrode 11, and improves the crystallinity of a layer stacked on the buffer layer, for example. As the buffer layer, for example, at least one metal selected from the group consisting of tantalum (Ta), titanium (Ti), vanadium (V), tungsten (W), zirconium (Zr), hafnium (Hf), and chromium (Cr) may be used. Also an alloy containing at least one of them may be used. The thickness of the buffer layer is preferably not less than 1 nm and not more than 10 nm. The thickness is more preferably not less than 1 nm and not more than 5 nm. If the thickness of the buffer layer is too thin, the buffer effect is lost. On the other hand, if the thickness of the buffer layer is too thick, the series resistance not contributing to the MR ratio is increased. In the case where a seed layer is formed on the buffer layer and the seed layer has a buffer effect, the buffer layer does not necessarily need to be provided. A tantalum layer with a thickness of 1 nm, for example, may be used as the buffer layer.

A seed layer not shown in FIG. 2 controls the crystal orientation and crystal grainsize of a layer stacked on the seed layer. As the seed layer, a metal having the fcc structure (face-centered cubic structure), the hcp structure (hexagonal close-packed structure), or the bcc structure (body-centered cubic structure) and the like may be used.

By using ruthenium (Ru) having the hcp structure or NiFe having the fcc structure as the seed layer, for example, the crystal orientation of a spin valve film thereon can be made the fcc (1 1 1) orientation. In the case where the pinning layer 13 is IrMn, a good fcc (1 1 1) orientation is achieved. In the case where the pinning layer 13 is PtMn, an ordered fct (1 1 1) structure (face-centered tetragonal structure) is obtained. When an fcc metal is used as the second magnetic layer 18 and the first magnetic layer 14, a good fcc (1 1 1) orientation can be achieved. When a bcc metal is used as the second magnetic layer 18 and the first magnetic layer 14, a good bcc (1 1 0) orientation can be obtained. The thickness of the seed layer is preferably not less than 1 nm and not more than 5 nm. The thickness is more preferably not less than 1 nm and not more than 3 nm. Thereby, the function as the seed layer that improves the crystal orientation can be sufficiently exhibited. A ruthenium layer with a thickness of 2 nm, for example, may be used as the seed layer.

As the seed layer, a NiFe-based alloy (e.g. $Ni_xFe_{100-x}$ (x=90% to 50%, preferably 75% to 85%)) may be used. As the seed layer, $(Ni_xFe_{100-x})_{100-y}X_y$ (X=Cr, V, Nb, Hf, Zr, or Mo) in which a third element X is added to NiFe into non-magnetism may be used. In the NiFe-based seed layer, it is relatively easy to obtain a good crystal orientation, and the half width of the rocking curve can be made not less than 3 degrees and not more than 5 degrees.

The seed layer may have not only the function of improving the crystal orientation but also the function of controlling the crystal grainsize of the spin valve film. Specifically, the crystal grainsize of the spin valve film can be controlled to not less than 5 nm and not more than 20 nm. Thereby, even when the size of the magneto-resistance effect element is decreased, the MR ratio can be improved while the variation in characteristics is suppressed.

By setting the crystal grainsize of the seed layer not less than 5 nm and not more than 20 nm, for example, the diffuse reflection of electrons and the number of inelastic scattering sites due to crystal grains boundaries are reduced. This crystal grainsize is obtained when a ruthenium layer with a thickness of nm is used as the seed layer. In the case where $(Ni_xFe_{100-x})_{100-y}Z_y$ (Z being Cr, V, Nb, Hf, Zr, or Mo) is used as the seed layer, it is easy to obtain this crystal grainsize when the composition ratio y of the third element Z is set to approximately 0% to 30% (including the case of y being 0) and the thickness is set to approximately 2 nm.

The crystal grainsize of the spin valve film can be determined by the grain size of the crystal grains of a layer disposed between the seed layer and the nonmagnetic layer 16. For example, it can be determined by cross-sectional TEM etc. For example, in the case of a bottom-type spin valve film in which the first magnetic layer 14 is located below the nonmagnetic layer 16, the crystal grainsize of the spin valve film can be determined by the crystal grainsize of the pinning layer 13 (an antiferromagnetic layer) formed on the seed layer and the first magnetic layer 14.

The pinning layer 13 fixes the magnetization by, for example, providing unidirectional anisotropy to a ferromagnetic layer formed thereon that forms the first magnetic layer 14. An antiferromagnetic layer, for example, may be used as the pinning layer 13. An antiferromagnetic material such as IrMn, PtMn, PdPtMn, or RuRhMn may be used for the pinning layer 13. In the case where the magneto-resistance effect element is used for a head adapted to high recording density, IrMn is advantageous. IrMn can be provided with unidirectional anisotropy at a thinner thickness than PtMn. Therefore, IrMn is suitable for gap narrowing for high density recording.

The thickness of the pinning layer 13 is appropriately set in order to provide sufficiently strong unidirectional anisotropy. In the case where the pinning layer 13 is made of PtMn or PdPtMn, a thickness of not less than 8 nm and not more than 20 nm is preferable, and a thickness of not less than 10 nm and not more than 15 nm is more preferable. In the case where the pinning layer 13 is made of IrMn, unidirectional anisotropy can be provided even at a thinner thickness than in the case of PtMn and the like; and a thickness of not less than 4 nm and not more than 18 nm is preferable, and a thickness of not less than 5 nm and not more than 15 nm is more preferable. $Ir_{22}Mn_{78}$ with a thickness of 7 nm, for example, is used for the pinning layer 13.

A hard magnetic layer may be used as the pinning layer 13. As the hard magnetic layer, for example, CoPt (Co=50% to 85%), $(Co_xPt_{100-x})_{100-y}Cr_y$ (x=50% to 85%, y=0% to 40%), FePt (Pt=40% to 60%), or the like may be used. Since the resistivity of a hard magnetic layer (in particular, CoPt) is relatively small, the increase in the series resistance and the resistance area RA can be suppressed when a hard magnetic layer is used as the pinning layer 13.

The resistance area RA is the product of the cross-sectional area perpendicular to the stacking direction of the stacked film of the magneto-resistance effect element and the resistance between the first electrode 11 and the second electrode 20 when a current is passed perpendicularly to the film surface of the stacked film of the magneto-resistance effect element.

The crystal orientation of the spin valve film and the pinning layer 13 can be measured by X-ray diffraction. The half width of the rocking curve at the fcc (1 1 1) peak of the spin valve film, the fct (1 1 1) peak of the pinning layer 13 (PtMn), or the bcc (1 1 0) peak of the pinning layer 13 (PtMn) is made not less than 3.5 degrees and not more than 6 degrees. Thereby, good orientation can be obtained. The dispersion angle of the orientation can be determined also from diffraction spots using cross-sectional TEM.

The lower pinned layer 141, the magnetic coupling layer 142, and the upper pinned layer 143 are stacked in this order from the pinning layer 13 side in the first magnetic layer 14.

The pinning layer 13 and the lower pinned layer 141 are coupled by magnetic exchange coupling so as to have unidirectional anisotropy. The lower pinned layer 141 and the upper pinned layer 143 sandwiching the magnetic coupling layer 142 are strongly coupled such that the directions of the magnetizations are antiparallel to each other.

For the lower pinned layer 141, for example, a $Co_xFe_{100-x}$ alloy (x=0% to 100%) or a $Ni_xFe_{100-x}$ alloy (x=0% to 100%), or these alloys doped with a nonmagnetic element may be used. Also a single element of Co, Fe, or Ni, or an alloy of at least one of them may be used as the lower pinned layer 141. Also a $(Co_xFe_{100-x})_{100-y}B_y$ alloy (x=0% to 100%, y=0% to 30%) may be used as the lower pinned layer 141. By using an amorphous alloy such as $(Co_xFe_{100-x})_{100-y}B_y$, the variation between elements can be suppressed even when the element size of the magneto-resistance effect element is decreased.

The thickness of the lower pinned layer 141 is preferably not less than 1.5 nm and not more than 5 nm. Thereby, for example, the unidirectional anisotropic magnetic field strength by the pinning layer 13 and the antiferromagnetic coupled magnetic field between the lower pinned layer 141 and the upper pinned layer 143 via the magnetic coupling layer 142 can be kept strong.

If the lower pinned layer 141 is too thin, since also the upper pinned layer 143 that influences the MR ratio is made thin, the MR ratio is reduced. On the other hand, if the lower pinned layer 141 is too thick, it is difficult to obtain a sufficient unidirectional anisotropic magnetic field necessary for device operations.

The magnetic thickness (saturation magnetization Bs×thickness t (Bs·t product)) of the lower pinned layer 141 is, for example, preferably substantially equal to the magnetic thickness of the upper pinned layer 143.

For example, in the case where the upper pinned layer 143 is $Fe_{50}Co_{50}$ (3 nm), since the saturation magnetization of $Fe_{50}Co_{50}$ in a thin film form is approximately 2.2 T, the magnetic thickness in the upper pinned layer 143 is 2.2 T×3 nm=6.6 Tnm. On the other hand, since the saturation magnetization of $Co_{75}Fe_{25}$ is approximately 2.1 T, the thickness t of the lower pinned layer 141 providing a magnetic thickness equal to the above is 6.6 Tnm/2.1 T=3.15 nm. In this case, $Co_{75}Fe_{25}$ with a thickness of approximately 3.2 nm is preferably used as the lower pinned layer 141.

The magnetic coupling layer 142 causes an antiferromagnetic coupling between the lower pinned layer 141 and the upper pinned layer 143 sandwiching the magnetic coupling layer 142 to form a synthetic pinned structure. Ru, for example, may be used as the magnetic coupling layer 142. The thickness of the magnetic coupling layer 142 is preferably not less than 0.8 nm and not more than 1 nm. Also any material other than Ru may be used for the magnetic coupling layer 142 to the extent that the material can cause a sufficient antiferromagnetic coupling between the lower pinned layer 141 and the upper pinned layer 143 sandwiching the magnetic coupling layer 142. As the thickness of the magnetic coupling layer 142, a thickness of not less than 0.3 nm and not more than 0.6 nm corresponding to the 1st peak of the RKKY (Ruderman-Kittel-Kasuya-Yosida) coupling may be used instead of a thickness of not less than 0.8 nm and not more than 1 nm corresponding to the 2nd peak of the RKKY coupling. A Ru layer with a thickness of 0.9 nm, for example, is used as the magnetic coupling layer 142. Thereby, a more highly reliable coupling is stably obtained.

The upper pinned layer 143 is a magnetic layer directly contributing to the MR effect. The material and thickness of the upper pinned layer 143 are appropriately set in order to obtain a large MR ratio.

$Fe_{50}Co_{50}$, for example, may be used as the upper pinned layer 143. $Fe_{50}Co_{50}$ is a magnetic material having the bcc structure. This material has a large spin-dependent interface scattering effect, and can therefore achieve a large MR ratio. As FeCo-based alloys having the bcc structure, $Fe_xCo_{100-x}$ (x=30% to 100%) or $Fe_xCo_{100-x}$ doped with an additive element is given. $Fe_{40}Co_{60}$ to $Fe_{80}Co_{20}$, for example, may be used as the upper pinned layer 143.

In the case where the upper pinned layer 143 is formed of a magnetic layer having the bcc structure which can easily increase the MR ratio, the thickness of the entire magnetic layer is preferably 1.5 nm or more. Thereby, the bcc structure can be kept stable. Since the metal material used for the spin valve film is mostly the fcc structure or the fct structure, there is a case where only the upper pinned layer 143 has the bcc structure. Hence, if the thickness of the upper pinned layer 143 is too thin, it is difficult to keep the bcc structure stable, and a large MR ratio cannot be obtained.

As the material of the upper pinned layer 143, for example, also a $(Co_xFe_{100-x})_{100-y}B_y$ alloy (x=0% to 100%, y=0% to 30%) may be used. In the case where an amorphous alloy such as $(Co_xFe_{100-x})_{100-y}B_y$ is used, for example, the variation between elements resulting from crystal grains can be suppressed even when the element size of the magneto-resistance effect element is decreased. Furthermore, in the case where such an amorphous alloy is used, the upper pinned layer 143 can be made a flat film. Therefore, for example, a tunnel insulating layer formed on the upper pinned layer 143 can be made flat. Since the defect density of the tunnel insulating layer can be reduced by the flattening of the tunnel insulating layer, a large MR ratio can be obtained at a low resistance area. For example, in the case where MgO is used as the material of the tunnel insulating layer, the (1 0 0) orientation of the MgO layer formed on the upper pinned layer 143 can be strengthened by using an amorphous alloy such as $(Co_xFe_{100-x})_{100-y}B_y$. A large MR ratio can be obtained by increasing the (1 0 0) orientation of the MgO layer. The $(Co_xFe_{100-x})_{100-y}B_y$ alloy crystallizes by means of the MgO (1 0 0) plane as a template when annealed. Consequently, good crystal matching between MgO and the $(Co_xFe_{100-x})_{100-y}B_y$ alloy can be obtained. A large MR ratio can be obtained by obtaining good crystal matching.

The thicker the upper pinned layer 143 is, the more easily a large MR ratio is obtained. However, the upper pinned layer 143 is preferably thin in order to obtain a large pin-fixed magnetic field, and there is a trade-off. When an FeCo alloy layer having the bcc structure, for example, is used as the upper pinned layer 143, the thickness of the upper pinned layer 143 is preferably 1.5 nm or more. Thereby, the bcc structure is stabilized. Also when a CoFe alloy layer of the fcc structure is used as the upper pinned layer 143, a thickness of 1.5 nm or more is preferable, and thereby a large MR ratio is obtained. On the other hand, to obtain a large pin-fixed magnetic field, the thickness of the upper pinned layer 143 is preferably 5 nm or less, and more preferably 4 nm or less. The thickness of the upper pinned layer 143 is preferably not less than 1.5 nm and not more than 5 nm, and more preferably not less than 2.0 nm and not more than 4 nm.

For the upper pinned layer 143, a $Co_{90}Fe_{10}$ alloy having the fcc structure or Co or a Co alloy having the hcp structure may be used. As the upper pinned layer 143, a metal such as Co, Fe, or Ni or an alloy containing at least one of them may be used. For example, a large MR ratio can be obtained by using an FeCo alloy material having the bcc structure, a Co alloy having a cobalt content of 50% or more, or a material with a Ni content of 50% or more as the upper pinned layer 143.

As the upper pinned layer 143, also a layer of a Heusler magnetic alloy such as $Co_2MnGe$, $Co_2FeGe$, $Co_2MnSi$, $Co_2FeSi$, $Co_2MnAl$, $Co_2FeAl$, $Co_2MnGa_{0.5}Ge_{0.5}$, and $Co_2FeGa_{0.5}Ge_{0.5}$ may be used.

The nonmagnetic layer 16 cuts the magnetic connection between the first magnetic layer 14 and the second magnetic layer 18. A nonmagnetic metal layer containing at least one element selected from copper (Cu), silver (Ag), and gold (Au), for example, is used as the nonmagnetic layer 16. A CCP spacer layer or a tunnel insulating spacer layer, for example, is used as the nonmagnetic layer 16. In the case where a CCP spacer layer is used, for example, a structure may be used in which a copper (Cu) metal path is formed in an aluminum oxide ($Al_2O_3$) insulating layer. In the case where a tunnel insulating layer is used, for example, at least one of magnesium oxide (MgO), aluminum oxide ($Al_2O_3$), titanium oxide ($TiO_2$), and zinc oxide (ZnO) may be used as the tunnel insulating layer.

The second magnetic layer 18 is, for example, a layer containing a ferromagnetic material in which the magnetization direction changes with the external magnetic field. A two-layer configuration of $Co_{90}Fe_{10}$ (1 nm)/$Ni_{83}Fe_{17}$ (3.5 nm), for example, may be used as the second magnetic layer 18. A single layer of $Co_{90}Fe_{10}$ (4 nm) not using a NiFe layer may be used as the second magnetic layer 18. A two-layer configuration such as CoFe/NiFe/CoFe may be used as the second magnetic layer 18.

$Co_{90}Fe_{10}$, for example, is preferably used for the second magnetic layer 18. Among CoFe alloys, $Co_{90}Fe_{10}$ has stable soft magnetic properties. In the case where a CoFe alloy having a composition near $Co_{90}Fe_{10}$ is used as the second magnetic layer 18, the thickness is preferably set not less than 0.5 nm and not more than 4 nm. $Co_xFe_{100-x}$ (x=70% to 90%) may be used for the second magnetic layer 18.

As the second magnetic layer 18, a configuration may be used in which a CoFe layer or an Fe layer of not less than 1 nm and not more than 2 nm and an ultrathin Cu layer of not less than 0.1 nm and not more than 0.8 nm are alternately stacked in plural.

An amorphous magnetic layer of CoZrNb or the like may be used as part of the second magnetic layer 18. However, even when an amorphous magnetic layer is used, a magnetic layer having a crystal structure is used as a portion of the second magnetic layer 18 in contact with the nonmagnetic layer 16, which portion greatly influences the MR ratio.

One crystal layer, for example, may be used as the second magnetic layer 18. A stacked configuration of a crystal layer/an amorphous layer formed on the nonmagnetic layer 16, for example, may be used as the second magnetic layer 18. A stacked configuration of a crystal layer/an amorphous layer/a crystal layer formed on the nonmagnetic layer 16, for example, may be used as the second magnetic layer 18. In all of these configurations, a crystal layer is provided at the interface with the nonmagnetic layer 16 of the second magnetic layer 18.

As the second magnetic layer 18, for example, also a layer of a Heusler magnetic alloy such as $Co_2MnGe$, $Co_2FeGe$, $Co_2MnSi$, $Co_2FeSi$, $Co_2MnAl$, $Co_2FeAl$, $Co_2MnGa_{0.5}Ge_{0.5}$, or $Co_2FeGa_{0.5}Ge_{0.5}$ may be used.

The cap layer 19 protects the spin valve film. A plurality of metal layers, for example, are used as the cap layer 19. A two-layer structure of a Cu layer and a Ru layer (Cu (1 nm)/Ru (10 nm)), for example, may be used as the cap layer 19. Also a Ru/Cu layer in which Ru is disposed on the second magnetic layer 18 side and the like may be used as the cap layer 19. In this case, the thickness of Ru is preferably not less than 0.5 nm and not more than 2 nm. The cap layer 19 of this configuration is used in the case where NiFe is used as the second magnetic layer 18. Ru is not solid-soluble with Ni, and can therefore reduce the magnetostriction of an interface mixing layer formed between the second magnetic layer 18 and the cap layer 19.

In the case where the cap layer 19 is either of Cu/Ru and Ru/Cu, the thickness of the Cu layer is preferably not less than 0.5 nm and not more than 10 nm, and the thickness of the Ru layer may be not less than 0.5 nm and not more than 5 nm. Since Ru has a high resistivity, it is not preferable to use an excessively thick Ru layer. A thickness in the range mentioned above is preferably used.

Another metal layer may be provided as the cap layer 19 instead of the Cu layer and the Ru layer. The configuration of the cap layer 19 is arbitrary. Other materials may be used as the cap layer 19 to the extent that they can protect the spin valve film. The MR ratio and long-term reliability may change with the material of the cap layer 19. From these points of view, Cu and Ru are preferably used as the cap layer 19.

Figure 13:
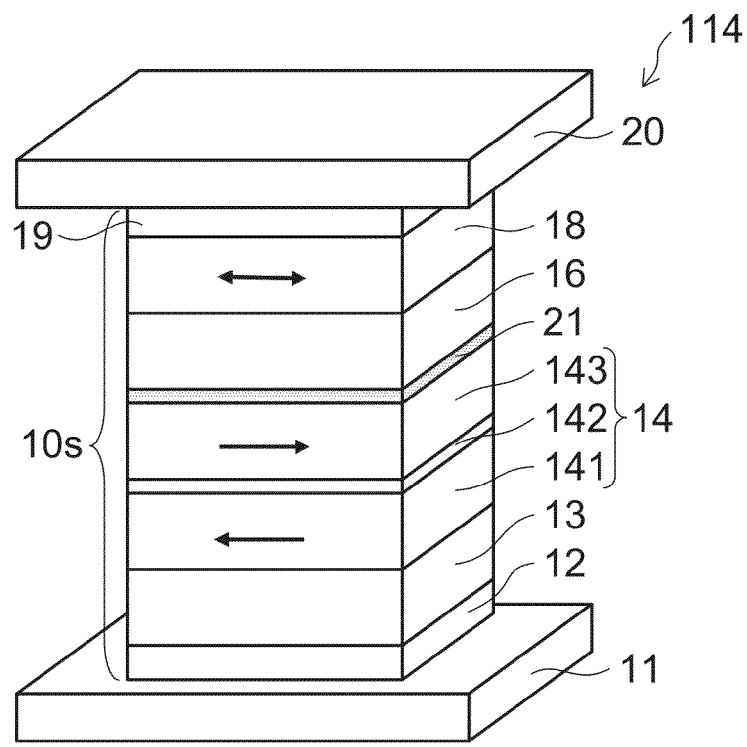
FIG. 13 is a schematic perspective view illustrating a configuration of another magneto-resistance effect element according to the first embodiment.

FIG. 13 is a schematic perspective view illustrating the configuration of another magneto-resistance effect element according to the first embodiment.

As shown in FIG. 13, in a magneto-resistance effect element 114 according to the embodiment, the oxide layer 21 is provided between the first magnetic layer 14 and the nonmagnetic layer 16. Otherwise, the configuration is similar to the magneto-resistance effect element 111, and a description is omitted.

The magneto-resistance effect element 114 has, for example, the following configuration:

The underlayer 12: Ta (1 nm)/Ru (2 nm)
The pinning layer 13: $Ir_{22}Mn_{78}$ (7 nm)
The first magnetic layer 14: $Co_{75}Fe_{25}$ (4.4 nm)/Ru (0.9 nm)/$Fe_{50}Co_{50}$ (4 nm)
The oxide layer 21: Zn—Fe—O (1.5 nm)
The nonmagnetic layer 16: Cu (1.5 nm)
The second magnetic layer 18: $Fe_{50}Co_{50}$ (4 nm)
The cap layer 19: Cu (1 nm)/Ta (2 nm)/Ru (5 nm)

In the above, when the thickness of the upper pinned layer 143 ($Fe_{50}Co_{50}$) of the first magnetic layer 14 and the thickness tm of the second magnetic layer 18 ($Fe_{50}Co_{50}$) were set to 4 nm, samples in which the formation conditions for the oxide layer 21 were changed were fabricated. In the formation of the oxide layer 21, on the nonmagnetic layer 16, an Fe layer with a thickness of 1 nm was formed by sputtering and a Zn layer with a thickness of 0.24 nm was formed by sputtering; then, IAO was performed, after which Ar plasma treatment was performed. The beam current Ib in the IAO was set to a constant value of 60 mA, and the acceleration voltage Vb was changed in a range of 60 V to 120 V. The plasma power Pw in the Ar plasma treatment was changed in a range of 20 W to 100 W. For these samples, the lattice spacing d of the (1 1 1) plane of the wustite crystal grains 21s of the oxide layer 21, the MR ratio, and the resistance area RA were investigated. Table 4 shows the investigation results.

TABLE 4

|  | Vb (V) | Pw (W) | d (nm) | MR (%) | RA ($\Omega \mu m^2$) |
| --- | --- | --- | --- | --- | --- |
| C1-1 | — | — | — | 1.5 | 0.05 |
| C4-1 | 60 | 20 | 0.25 | 8 | 0.2 |
| C4-2 | 60 | 30 | 0.252 | 9.8 | 0.2 |
| E4-1 | 60 | 40 | 0.253 | 16 | 0.21 |
| E4-2 | 60 | 50 | 0.257 | 17 | 0.2 |
| E4-3 | 60 | 60 | 0.260 | 17.2 | 0.21 |
| E4-4 | 60 | 70 | 0.265 | 17.1 | 0.2 |
| E4-5 | 60 | 80 | 0.270 | 17 | 0.18 |
| E4-6 | 60 | 100 | 0.275 | 16.8 | 0.17 |
| E4-7 | 70 | 20 | 0.253 | 17.2 | 0.21 |
| E4-8 | 80 | 20 | 0.256 | 17 | 0.2 |
| E4-9 | 90 | 20 | 0.260 | 17.1 | 0.22 |
| E4-10 | 100 | 20 | 0.265 | 17.5 | 0.21 |
| E4-11 | 110 | 20 | 0.270 | 17.2 | 0.18 |
| E4-12 | 120 | 20 | 0.275 | 17 | 0.18 |

As can be seen from Table 4, in Sample E4-1 to Sample E4-12, the lattice spacing d of the (1 1 1) plane of the wustite crystal grains 21s is not less than 0.253 nm and not more than 0.275 nm. A large MR ratio is obtained in these samples. The resistance area RA of Sample E4-1 to Sample E4-12 is approximately 0.2, which is substantially equal to the value of Samples C4-1 and C4-2.

Figure 14:
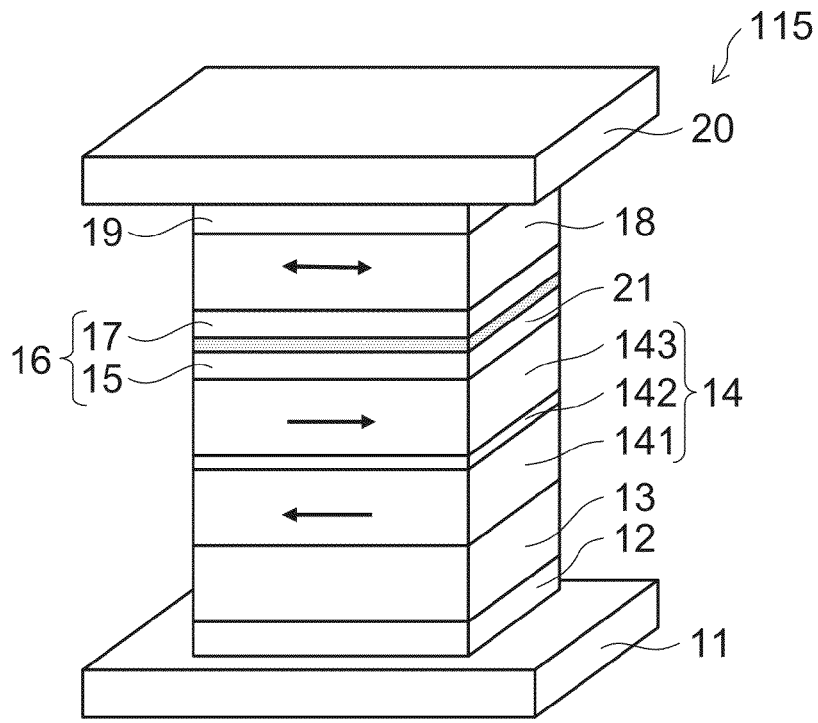
FIG. 14 is a schematic perspective view illustrating a configuration of another magneto-resistance effect element according to the first embodiment.

FIG. 14 is a schematic perspective view illustrating the configuration of another magneto-resistance effect element according to the first embodiment.

As shown in FIG. 14, in a magneto-resistance effect element 115 according to the embodiment, a lower metal layer 15 and an upper metal layer 17 are provided as the nonmagnetic layer 16. The lower metal layer 15 is disposed between the first magnetic layer 14 and the second magnetic layer 18. The upper metal layer 17 is disposed between the lower metal layer 15 and the second magnetic layer 18. The oxide layer 21 is disposed between the lower metal layer 15 and the upper metal layer 17. The nonmagnetic layer 16 can be regarded as including the lower metal layer 15 and the upper metal layer 17. Alternatively, for example, it is also possible to regard one of the lower metal layer 15 and the upper metal layer 17 as the nonmagnetic layer 16 illustrated in FIG. 1, and regard the other of the lower metal layer 15 and the upper metal layer 17 as another nonmagnetic layer. Otherwise, the configuration is similar to the magneto-resistance effect element 111, and a description is omitted.

The magneto-resistance effect element 115 has, for example, the following configuration:

The underlayer 12: Ta (1 nm)/Ru (2 nm)
The pinning layer 13: $Ir_{22}Mn_{78}$ (7 nm)
The first magnetic layer 14: $Co_{75}Fe_{25}$ (4.4 nm)/Ru (0.9 nm)/$Fe_{50}Co_{50}$ (4 nm)
The lower metal layer 15: Cu (0.5 nm)
The oxide layer 21: Zn—Fe—O (1.5 nm)
The upper metal layer 17: Cu (0.5 nm)
The second magnetic layer 18: $Fe_{50}Co_{50}$ (4 nm)
The cap layer 19: Cu (1 nm)/Ta (2 nm)/Ru (5 nm)

In the above, when the thickness of the upper pinned layer 143 ($Fe_{50}Co_{50}$) of the first magnetic layer 14 and the thickness tm of the second magnetic layer 18 ($Fe_{50}Co_{50}$) were set to 4 nm, samples in which the formation conditions for the oxide layer 21 were changed were fabricated. In the formation of the oxide 21, on the lower metal layer 15, an Fe layer with a thickness of 1 nm was formed by sputtering and a Zn layer with a thickness of 0.24 nm was formed by sputtering; then, IAO was performed, after which Ar plasma treatment was performed. The beam current Ib in the IAO was set to a constant value of 60 mA, and the acceleration voltage Vb was changed in a range of 60 V to 120 V. The plasma power Pw in the Ar plasma treatment was changed in a range of 20 W to 100 W. For these samples, the lattice spacing d of the (1 1 1) plane of the wustite crystal grains 21s of the oxide layer 21, the MR ratio, and the resistance area RA were investigated. Table 5 shows the investigation results.

TABLE 5

|  | Vb (V) | Pw (W) | d (nm) | MR (%) | RA ($\Omega \mu m^2$) |
| --- | --- | --- | --- | --- | --- |
| C1-1 | — | — | — | 1.5 | 0.05 |
| C5-1 | 60 | 20 | 0.25 | 10 | 0.2 |
| C5-2 | 60 | 30 | 0.252 | 10.5 | 0.24 |
| E5-1 | 60 | 40 | 0.253 | 18 | 0.21 |
| E5-2 | 60 | 50 | 0.257 | 18.2 | 0.22 |
| E5-3 | 60 | 60 | 0.260 | 18.3 | 0.21 |
| E5-4 | 60 | 70 | 0.265 | 18.4 | 0.2 |
| E5-5 | 60 | 80 | 0.270 | 18 | 0.18 |
| E5-6 | 60 | 100 | 0.275 | 17.5 | 0.17 |
| E5-7 | 70 | 20 | 0.253 | 17.9 | 0.23 |
| E5-8 | 80 | 20 | 0.256 | 18.3 | 0.22 |
| E5-9 | 90 | 20 | 0.260 | 18.3 | 0.21 |
| E5-10 | 100 | 20 | 0.265 | 18.5 | 0.21 |
| E5-11 | 110 | 20 | 0.270 | 18 | 0.18 |
| E5-12 | 120 | 20 | 0.275 | 17.6 | 0.18 |

As can be seen from Table 5, in Sample 5-1 to Sample 5-12, the lattice spacing d of the (1 1 1) plane of the wustite crystal grains 21s is not less than 0.253 nm and not more than 0.275 nm. A large MR ratio is obtained in these samples. The resistance area RA of Sample 5-1 to Sample 5-12 is approximately 0.2, which is substantially equal to the value of Samples C5-1 and C5-2.

Figure 15:
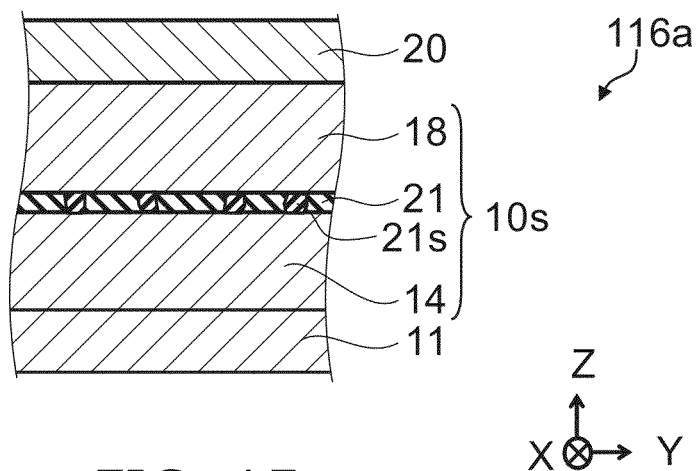
FIG. 15 is a schematic cross-sectional view illustrating a configuration of another magneto-resistance effect element according to the first embodiment.

FIG. 15 is a schematic cross-sectional view illustrating the configuration of another magneto-resistance effect element according to the first embodiment.

As shown in FIG. 15, a magneto-resistance effect element 116a according to the embodiment includes the first electrode 11, the second electrode 20, the first magnetic layer 14, the second magnetic layer 18, and the oxide layer 21. The first magnetic layer 14 is provided between the first electrode 11 and the second electrode 20, and the second magnetic layer 18 is provided between the first magnetic layer 14 and the second electrode 20. The oxide layer 21 is provided between the first magnetic layer 14 and the second magnetic layer 18.

That is, in the magneto-resistance effect element 116a, the oxide layer 21 is used in place of the nonmagnetic layer 16 in the magneto-resistance effect element 110 mentioned above. Also in this case, a metal oxide is used for the oxide layer 21. The oxide layer 21 includes wustite crystal grains 21s with the (1 1 1) plane orientation of the wustite structure containing iron. The lattice spacing d of the (1 1 1) plane of the wustite crystal grains 21s is not less than 0.253 nm and not more than 0.275 nm. Also in the magneto-resistance effect element 116a, a magneto-resistance effect element with a large MR ratio can be provided.

Figure 16:
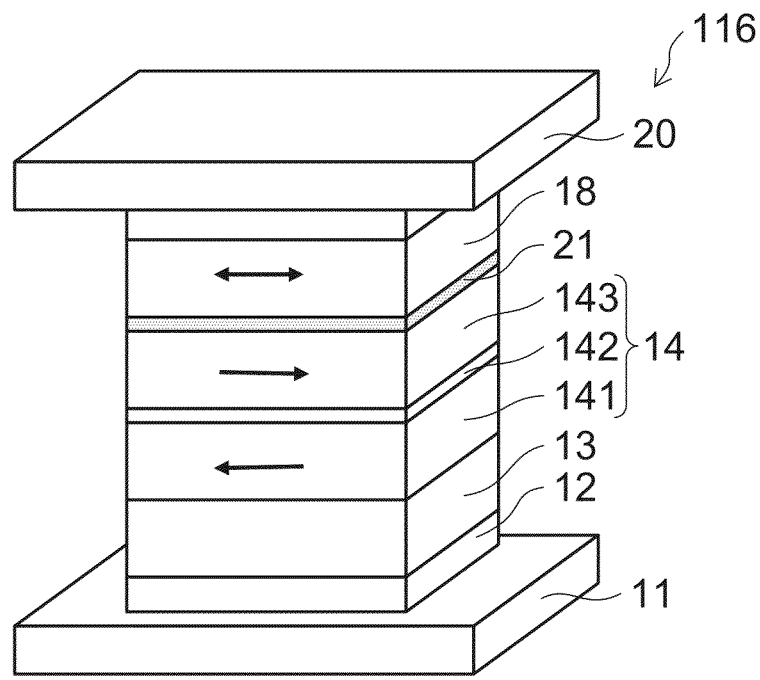
FIG. 16 is a schematic perspective view illustrating a configuration of another magneto-resistance effect element according to the first embodiment.

FIG. 16 is a schematic perspective view illustrating the configuration of another magneto-resistance effect element according to the first embodiment.

As shown in FIG. 16, a magneto-resistance effect element 116 has a similar configuration to the magneto-resistance effect element 116a. The magneto-resistance effect element 116 has, for example, the following configuration:

The underlayer 12: Ta (1 nm)/Ru (2 nm)
The pinning layer 13: $Ir_{22}Mn_{78}$ (7 nm)
The first magnetic layer 14: $Co_{75}Fe_{25}$ (4.4 nm)/Ru (0.9 nm)/$Fe_{50}Co_{50}$ (4 nm)
The oxide layer 21: Zn—Fe—O (1.5 nm)
The second magnetic layer 18: $Fe_{50}Co_{50}$ (4 nm)
The cap layer 19: Cu (1 nm)/Ta (2 nm)/Ru (5 nm)

In the above, when the thickness of the upper pinned layer 143 ($Fe_{50}Co_{50}$) of the first magnetic layer 14 and the thickness tm of the second magnetic layer 18 ($Fe_{50}Co_{50}$) were set to 4 nm, samples in which the formation conditions for the oxide layer 21 were changed were fabricated. In the formation of the oxide layer 21, on the first magnetic layer 14, an Fe layer with a thickness of 1 nm was formed by sputtering and a Zn layer with a thickness of 0.24 nm was formed by sputtering; then, IAO was performed, after which Ar plasma treatment was performed. The beam current Ib in the IAO was set to a constant value of 60 mA, and the acceleration voltage Vb was changed in a range of 60 V to 120 V. The plasma power Pw in the Ar plasma treatment was changed in a range of 20 W to 100 W. For these samples, the lattice spacing d of the (1 1 1) plane of the wustite crystal grains 21s of the oxide layer 21, the MR ratio, and the resistance area RA were investigated. Table 6 shows the investigation results.

TABLE 6

|  | Vb (V) | Pw (W) | d (nm) | MR (%) | RA (Ω μm²) |
| --- | --- | --- | --- | --- | --- |
| C1-1 | — | — | — | 1.5 | 0.05 |
| C6-1 | 60 | 20 | 0.25 | 7 | 0.2 |
| C6-2 | 60 | 30 | 0.252 | 8 | 0.24 |
| E6-1 | 60 | 40 | 0.253 | 16.5 | 0.21 |
| E6-2 | 60 | 50 | 0.258 | 16.7 | 0.22 |
| E6-3 | 60 | 60 | 0.260 | 17 | 0.21 |
| E6-4 | 60 | 70 | 0.265 | 16.8 | 0.2 |
| E6-5 | 60 | 80 | 0.270 | 17 | 0.18 |
| E6-6 | 60 | 100 | 0.275 | 17.2 | 0.17 |
| E6-7 | 70 | 20 | 0.253 | 16.2 | 0.23 |
| E6-8 | 80 | 20 | 0.256 | 16.3 | 0.22 |
| E6-9 | 90 | 20 | 0.260 | 16.7 | 0.22 |
| E6-10 | 100 | 20 | 0.265 | 16.7 | 0.21 |
| E6-11 | 110 | 20 | 0.270 | 16.5 | 0.18 |
| E6-12 | 120 | 20 | 0.275 | 16.2 | 0.17 |

As can be seen from Table 6, in Sample E6-1 to Sample E6-12, the lattice spacing d of the (1 1 1) plane of the wustite crystal grains 21s is not less than 0.253 nm and not more than 0.275 nm. A large MR ratio is obtained in these samples. The resistance area RA of Sample E6-1 to Sample E6-12 is approximately 0.2, which is substantially equal to the value of Samples C6-1 and C6-2.

Figure 17:
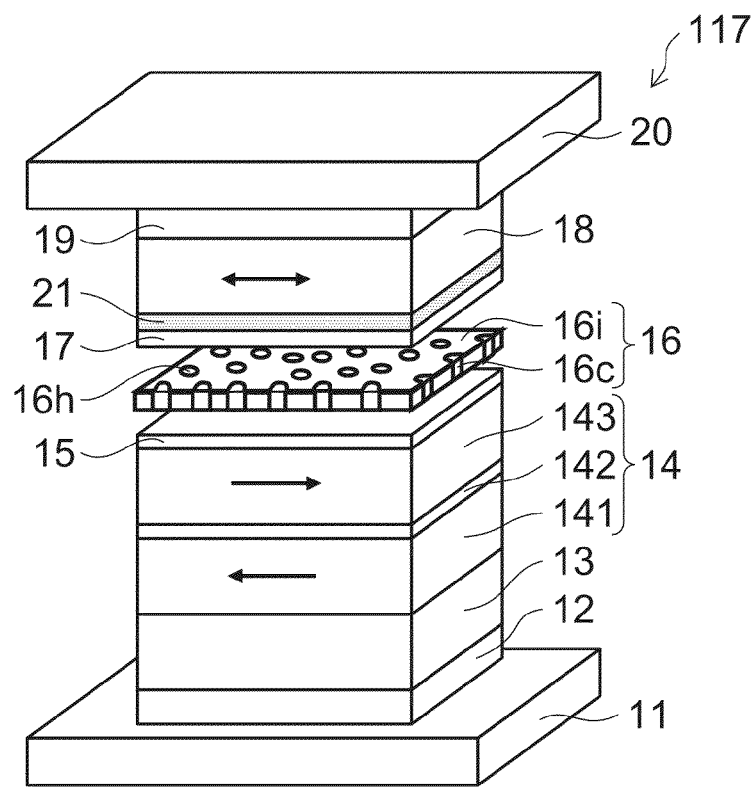
FIG. 17 is a schematic perspective view illustrating a configuration of another magneto-resistance effect element according to the first embodiment.

FIG. 17 is a schematic perspective view illustrating the configuration of another magneto-resistance effect element according to the first embodiment.

As shown in FIG. 17, in a magneto-resistance effect element 117 according to the embodiment, the oxide layer 21 is provided between the nonmagnetic layer 16 and the second magnetic layer 18. The nonmagnetic layer 16 includes an insulating member 16i and conductive members 16c. Through holes 16h are provided in the insulating member 16i. The conductive member 16c is embedded in the through hole 16h. The lower metal layer 15 is provided between the first magnetic layer 14 and the nonmagnetic layer 16. The upper metal layer 17 is provided between the second magnetic layer 18 and the nonmagnetic layer 16. The oxide layer 21 is provided between the upper metal layer 17 and the second magnetic layer 18. Otherwise, the configuration is similar to the magneto-resistance effect element 111, and a description is omitted.

The nonmagnetic layer 16 has a configuration of, for example, a CCP (current-confined-path)-NOL (nano-oxide layer). In the CCP-NOL, for example, an oxide layer (NOL) including current paths in the thickness direction is used as a spacer layer included in the CPP-GMR element. In this element, the MR ratio is increased by the current-confined-path (CCP) effect. Such an element is called, for example, a CCP-CPP element.

The magneto-resistance effect element 117 has, for example, the following configuration:

The underlayer 12: Ta (1 nm)/Ru (2 nm)
The pinning layer 13: $Ir_{22}Mn_{78}$ (7 nm)
The first magnetic layer 14: $Co_{75}Fe_{25}$ (4.4 nm)/Ru (0.9 nm)/$Fe_{50}Co_{50}$ (4 nm)
The lower metal layer 15: Cu (0.25 nm)
The nonmagnetic layer 16: a current-confined-path layer (1.5 nm) in which Cu metal paths are formed in an $Al_2O_3$ insulating layer
The upper metal layer 17: Cu (0.25 nm)
The oxide layer 21: Zn—Fe—O (1.5 nm)
The second magnetic layer 18: $Fe_{50}Co_{50}$ (4 nm)
The cap layer 19: Cu (1 nm)/Ta (2 nm)/Ru (5 nm)

In the above, when the thickness of the upper pinned layer 143 ($Fe_{50}Co_{50}$) of the first magnetic layer 14 and the thickness tm of the second magnetic layer 18 ($Fe_{50}Co_{50}$) were set to 4 nm, samples in which the formation conditions for the oxide layer 21 were changed were fabricated. In the formation of the oxide layer 21, on the upper metal layer 17, an Fe layer with a thickness of 1 nm was formed by sputtering and a Zn layer with a thickness of 0.24 nm was formed by sputtering; then, IAO was performed, after which Ar plasma treatment was performed. The beam current Ib in the IAO was set to a constant value of 60 mA, and the acceleration voltage Vb was changed in a range of 60 V to 120 V. The plasma power Pw in the Ar plasma treatment was changed in a range of 20 W to 100 W. For these samples, the lattice spacing d of the (1 1 1) plane of the wustite crystal grains 21s of the oxide layer 21, the MR ratio, and the resistance area RA were investigated. Table 7 shows the investigation results.

TABLE 7

| | Vb (V) | Pw (W) | d (nm) | MR (%) | RA (Ω μm$^2$) |
|---|---|---|---|---|---|
| C1-1 | — | — | — | 1.5 | 0.39 |
| C7-1 | 60 | 20 | 0.25 | 15.5 | 0.38 |
| C7-2 | 60 | 30 | 0.252 | 15.4 | 0.4 |
| E7-1 | 60 | 40 | 0.253 | 24.5 | 0.37 |
| E7-2 | 60 | 50 | 0.258 | 25 | 0.36 |
| E7-3 | 60 | 60 | 0.260 | 25.5 | 0.36 |
| E7-4 | 60 | 70 | 0.265 | 25 | 0.34 |
| E7-5 | 60 | 80 | 0.270 | 25 | 0.33 |
| E7-6 | 60 | 100 | 0.275 | 24.5 | 0.37 |
| E7-7 | 70 | 20 | 0.253 | 25 | 0.37 |
| E7-8 | 80 | 20 | 0.256 | 25 | 0.36 |
| E7-9 | 90 | 20 | 0.260 | 25.2 | 0.34 |
| E7-10 | 100 | 20 | 0.265 | 25.5 | 0.34 |
| E7-11 | 110 | 20 | 0.270 | 25 | 0.33 |
| E7-12 | 120 | 20 | 0.275 | 24.4 | 0.33 |

As can be seen from Table 7, in Sample E7-1 to Sample E7-12, the lattice spacing d of the (1 1 1) plane of the wustite crystal grains 21s is not less than 0.253 nm and not more than 0.275 nm. A large MR ratio is obtained in these samples. The resistance area RA of Sample E7-1 to Sample E7-12 is approximately 0.33 to 0.4, which is substantially equal to the value of Samples C7-1 and C7-2.

Samples will now be described in which the formation conditions for the oxide layer 21 are changed in the configuration of the magneto-resistance effect element 111 illustrated in FIG. 2. In the following samples, the thickness of the upper pinned layer 143 ($Fe_{50}Co_{50}$) of the first magnetic layer 14 and the thickness tm of the second magnetic layer 18 ($Fe_{50}Co_{50}$) are 4 nm. After a layer that forms the oxide layer 21 was formed, IAO was performed and then Ar plasma treatment was performed. The beam current Ib in the IAO was set to a constant value of 60 mA, and the acceleration voltage Vb was changed in a range of 60 V to 120 V. The plasma Pw in the Ar plasma treatment was changed in a range of 20 W to 100 W.

In the samples shown in Table 8, in the formation of the oxide layer 21, an Fe layer with a thickness of 1.2 nm was formed on the nonmagnetic layer 16 by sputtering. In this example, an Fe—O layer is used as the oxide layer 21.

TABLE 8

| | Vb (V) | Pw (W) | d (nm) | MR (%) | RA (Ω μm$^2$) |
|---|---|---|---|---|---|
| C1-1 | — | — | — | 1.5 | 0.05 |
| C8-1 | 60 | 20 | 0.25 | 8 | 0.2 |
| C8-2 | 60 | 30 | 0.252 | 8.2 | 0.23 |
| E8-1 | 60 | 40 | 0.253 | 14.5 | 0.22 |
| E8-2 | 60 | 50 | 0.257 | 14.6 | 0.22 |
| E8-3 | 60 | 60 | 0.260 | 15 | 0.21 |
| E8-4 | 60 | 70 | 0.265 | 15 | 0.19 |
| E8-5 | 60 | 80 | 0.270 | 15.1 | 0.19 |
| E8-6 | 60 | 100 | 0.275 | 15 | 0.18 |
| E8-7 | 70 | 20 | 0.253 | 14.2 | 0.24 |
| E8-8 | 80 | 20 | 0.256 | 14.5 | 0.22 |
| E8-9 | 90 | 20 | 0.260 | 14.8 | 0.22 |
| E8-10 | 100 | 20 | 0.265 | 15 | 0.19 |
| E8-11 | 110 | 20 | 0.270 | 15 | 0.18 |
| E8-12 | 120 | 20 | 0.275 | 15.1 | 0.18 |

As can be seen from Table 8, in Sample E8-1 to Sample E8-12, the lattice spacing d of the (1 1 1) plane of the wustite crystal grains 21s is not less than 0.253 nm and not more than 0.275 nm. A large MR ratio is obtained in these samples. The resistance area RA of Sample E8-1 to Sample E8-12 is approximately 0.2, which is substantially equal to the value of Samples C8-1 and C8-2.

In the formation of the oxide layer 21 in the samples shown in Table 9, on the nonmagnetic layer 16, an $Fe_{50}Co_{50}$ layer with a thickness of 1 nm was formed by sputtering, and further a Zn layer with a thickness of 0.25 nm was formed.

TABLE 9

| | Vb (V) | Pw (W) | d (nm) | MR (%) | RA (Ω μm$^2$) |
|---|---|---|---|---|---|
| C1-1 | — | — | — | 1.5 | 0.05 |
| C9-1 | 60 | 20 | 0.25 | 12.5 | 0.21 |
| C9-2 | 60 | 30 | 0.252 | 13 | 0.22 |
| E9-1 | 60 | 40 | 0.253 | 21 | 0.21 |
| E9-2 | 60 | 50 | 0.257 | 22.2 | 0.2 |
| E9-3 | 60 | 60 | 0.260 | 22.8 | 0.23 |
| E9-4 | 60 | 70 | 0.265 | 23 | 0.2 |
| E9-5 | 60 | 80 | 0.270 | 23 | 0.21 |
| E9-6 | 60 | 100 | 0.275 | 23 | 0.19 |
| E9-7 | 70 | 20 | 0.253 | 22 | 0.21 |
| E9-8 | 80 | 20 | 0.256 | 22.2 | 0.2 |
| E9-9 | 90 | 20 | 0.260 | 23 | 0.22 |
| E9-10 | 100 | 20 | 0.265 | 23.2 | 0.19 |
| E9-11 | 110 | 20 | 0.270 | 23.2 | 0.19 |
| E9-12 | 120 | 20 | 0.275 | 23 | 0.18 |

As can be seen from Table 9, in Sample E9-1 to Sample E9-12, the lattice spacing d of the (1 1 1) plane of the wustite crystal grains 21s is not less than 0.253 nm and not more than 0.275 nm. A large MR ratio is obtained in these samples. The resistance area RA of Sample E9-1 to Sample E9-12 is approximately 0.2, which is substantially equal to the value of Samples C9-1 and C9-2.

In the samples shown in Table 10, in the formation of the oxide layer 21, an $Fe_{50}Co_{50}$ layer with a thickness of 1.2 nm was formed on the nonmagnetic layer 16 by sputtering.

TABLE 10

| | Vb (V) | Pw (W) | d (nm) | MR (%) | RA (Ω μm$^2$) |
|---|---|---|---|---|---|
| C1-1 | — | — | — | 1.5 | 0.05 |
| C10-1 | 60 | 20 | 0.25 | 7.5 | 0.21 |
| C10-2 | 60 | 30 | 0.252 | 8 | 0.22 |
| E10-1 | 60 | 40 | 0.253 | 15 | 0.21 |
| E10-2 | 60 | 50 | 0.257 | 15.2 | 0.2 |
| E10-3 | 60 | 60 | 0.260 | 15.3 | 0.23 |
| E10-4 | 60 | 70 | 0.265 | 15 | 0.2 |
| E10-5 | 60 | 80 | 0.270 | 15 | 0.21 |
| E10-6 | 60 | 100 | 0.275 | 14.9 | 0.19 |
| E10-7 | 70 | 20 | 0.253 | 14.8 | 0.21 |
| E10-8 | 80 | 20 | 0.256 | 15.2 | 0.2 |
| E10-9 | 90 | 20 | 0.260 | 15.2 | 0.22 |
| E10-10 | 100 | 20 | 0.265 | 15.5 | 0.19 |
| E10-11 | 110 | 20 | 0.270 | 15.5 | 0.19 |
| E10-12 | 120 | 20 | 0.275 | 15 | 0.18 |

As can be seen from Table 10, in Sample E10-1 to Sample E10-12, the lattice spacing d of the (1 1 1) plane of the wustite crystal grains 21s is not less than 0.253 nm and not more than 0.275 nm. A large MR ratio is obtained in these samples. The resistance area RA of Sample E10-1 to Sample E10-12 is approximately 0.2, which is substantially equal to the value of Samples C10-1 and C10-2.

In the samples shown in Table 11, in the formation of the oxide layer 21, an $Fe_{50}Ni_{20}$ layer with a thickness of 1.2 nm was formed on the nonmagnetic layer 16 by sputtering.

TABLE 11

| | Vb (V) | Pw (W) | d (nm) | MR (%) | RA (Ω μm$^2$) |
|---|---|---|---|---|---|
| C1-1 | — | — | — | 1.5 | 0.05 |
| C11-1 | 60 | 20 | 0.25 | 7.5 | 0.21 |

TABLE 11-continued

|       | Vb (V) | Pw (W) | d (nm) | MR (%) | RA (Ω μm²) |
|-------|--------|--------|--------|--------|------------|
| C11-2 | 60     | 30     | 0.252  | 8      | 0.22       |
| E11-1 | 60     | 40     | 0.253  | 15     | 0.21       |
| E11-2 | 60     | 50     | 0.257  | 15.2   | 0.2        |
| E11-3 | 60     | 60     | 0.260  | 15.3   | 0.23       |
| E11-4 | 60     | 70     | 0.265  | 15     | 0.2        |
| E11-5 | 60     | 80     | 0.270  | 15     | 0.21       |
| E11-6 | 60     | 100    | 0.275  | 14.9   | 0.19       |
| E11-7 | 70     | 20     | 0.253  | 14.8   | 0.21       |
| E11-8 | 80     | 20     | 0.256  | 15.2   | 0.2        |
| E11-9 | 90     | 20     | 0.260  | 15.2   | 0.22       |
| E11-10| 100    | 20     | 0.265  | 15.5   | 0.19       |
| E11-11| 110    | 20     | 0.270  | 15.5   | 0.19       |
| E11-12| 120    | 20     | 0.275  | 15     | 0.18       |

As can be seen from Table 11, in Sample E1'-1 to Sample E11-12, the lattice spacing d of the (1 1 1) plane of the wustite crystal grains 21s is not less than 0.253 nm and not more than 0.275 nm. A large MR ratio is obtained in these samples. The resistance area RA of Sample E1'-1 to Sample E11-12 is approximately 0.2, which is substantially equal to the value of Samples C11-1 and C11-2.

Thus, also in the case where nickel (Ni) is further contained in addition to Fe in the matrix material to be oxidized of the oxide layer 21, a high MR ratio can be obtained by making the lattice spacing of the (1 1 1) orientation plane of the wustite crystal grains 21s not less than 0.253 nm and not more than 0.275 nm. Here, the addition amount of the additive element of nickel may be set not less than 0.5 at. % and not more than 70 at. % in the metal alloy containing Fe of the matrix to be oxidized. When the addition amount of the additive element of the matrix to be oxidized is too large, the Fe content is relatively small. Therefore, the addition amount is more preferably set not less than 0.5 at. % and not more than 50 at. % from the viewpoint of obtaining a good wustite structure.

Also in the case where cobalt (Co) is further contained in addition to Fe in the matrix material to be oxidized of the oxide layer 21, a high MR ratio can be obtained by making the lattice spacing of the (1 1 1) orientation plane of the wustite crystal grains 21s not less than 0.253 nm and not more than 0.275 nm. Here, the addition amount of the additive element of cobalt may be set not less than 0.5 at. % and not more than 70 at. % in the metal alloy containing Fe of the matrix to be oxidized. When the addition amount of the additive element of the matrix to be oxidized is too large, the Fe content is relatively small. Therefore, the addition amount is more preferably set not less than 0.5 at. % and not more than 50 at. % from the viewpoint of obtaining a good wustite structure.

In the samples shown in Table 12, in the formation of the oxide layer 21, an Fe layer with a thickness of 1 nm was formed on the nonmagnetic layer 16, and a Sn layer with a thickness of 0.24 nm was formed on the Fe layer by sputtering.

TABLE 12

|       | Vb (V) | Pw (W) | d (nm) | MR (%) | RA (Ω μm²) |
|-------|--------|--------|--------|--------|------------|
| C1-1  | —      | —      | —      | 1.5    | 0.05       |
| C12-1 | 60     | 20     | 0.25   | 11.5   | 0.21       |
| C12-2 | 60     | 30     | 0.252  | 12.2   | 0.24       |
| E12-1 | 60     | 40     | 0.253  | 17.5   | 0.21       |
| E12-2 | 60     | 50     | 0.257  | 17.8   | 0.22       |
| E12-3 | 60     | 60     | 0.260  | 18     | 0.21       |
| E12-4 | 60     | 70     | 0.265  | 18.2   | 0.2        |
| E12-5 | 60     | 80     | 0.270  | 18.1   | 0.18       |
| E12-6 | 60     | 100    | 0.275  | 16     | 0.17       |
| E12-7 | 70     | 20     | 0.253  | 16.2   | 0.23       |
| E12-8 | 80     | 20     | 0.256  | 17     | 0.22       |
| E12-9 | 90     | 20     | 0.260  | 17.2   | 0.21       |
| E12-10| 100    | 20     | 0.265  | 17.5   | 0.21       |
| E12-11| 110    | 20     | 0.270  | 17.2   | 0.18       |
| E12-12| 120    | 20     | 0.275  | 17     | 0.18       |

As can be seen from Table 12, in Sample E12-1 to Sample E12-12, the lattice spacing d of the (1 1 1) plane of the wustite crystal grains 21s is not less than 0.253 nm and not more than 0.275 nm. A large MR ratio is obtained in these samples. The resistance area RA of Sample E12-1 to Sample E12-12 is approximately 0.2, which is substantially equal to the value of Samples C12-1 and C12-2.

Thus, also in the case where tin (Sn) is further contained in addition to Fe in the matrix material to be oxidized of the oxide layer 21, a high MR ratio can be obtained by making the lattice spacing of the (1 1 1) orientation plane of the wustite crystal grains 21s not less than 0.253 nm and not more than 0.275 nm. Here, the addition amount of the additive element of tin may be set not less than 0.5 at. % and not more than 70 at. % in the metal alloy containing Fe of the matrix to be oxidized. When the addition amount of the additive element of the matrix to be oxidized is too large, the Fe content is relatively small. Therefore, the addition amount is more preferably set not less than 0.5 at. % and not more than 50 at. % from the viewpoint of obtaining a good wustite structure.

In the samples shown in Table 13, in the formation of the oxide layer 21, an Fe layer with a thickness of 1 nm was formed on the nonmagnetic layer 16, and an In layer with a thickness of 0.24 nm was formed on the Fe layer by sputtering.

TABLE 13

|       | Vb (V) | Pw (W) | d (nm) | MR (%) | RA (Ω μm²) |
|-------|--------|--------|--------|--------|------------|
| C1-1  | —      | —      | —      | 1.5    | 0.05       |
| C13-1 | 60     | 20     | 0.25   | 11     | 0.23       |
| C13-2 | 60     | 30     | 0.252  | 11.5   | 0.22       |
| E13-1 | 60     | 40     | 0.253  | 16.2   | 0.21       |
| E13-2 | 60     | 50     | 0.258  | 16.5   | 0.22       |
| E13-3 | 60     | 60     | 0.260  | 17     | 0.21       |
| E13-4 | 60     | 70     | 0.265  | 17     | 0.2        |
| E13-5 | 60     | 80     | 0.270  | 17.5   | 0.18       |
| E13-6 | 60     | 100    | 0.275  | 17.3   | 0.17       |
| E13-7 | 70     | 20     | 0.253  | 16     | 0.23       |
| E13-8 | 80     | 20     | 0.256  | 16.8   | 0.22       |
| E13-9 | 90     | 20     | 0.260  | 17     | 0.22       |
| E13-10| 100    | 20     | 0.265  | 16.8   | 0.21       |
| E13-11| 110    | 20     | 0.270  | 16.5   | 0.18       |
| E13-12| 120    | 20     | 0.275  | 16.5   | 0.17       |

As can be seen from Table 13, in Sample E13-1 to Sample E13-12, the lattice spacing d of the (1 1 1) plane of the wustite crystal grains 21s is not less than 0.253 nm and not more than 0.275 nm. A large MR ratio is obtained in these samples. The resistance area RA of Sample E13-1 to Sample E13-12 is approximately 0.2, which is substantially equal to the value of Samples C13-1 and C13-2.

Thus, also in the case where indium (In) is further contained in addition to Fe in the matrix material to be oxidized of the oxide layer 21, a high MR ratio can be obtained by making the lattice spacing of the (1 1 1) orientation plane of the wustite crystal grains 21s not less than 0.253 nm and not more than 0.275 nm. Here, the addition amount of the additive element of indium may be set not less than 0.5 at. % and not more than 70 at. % in the metal alloy containing Fe of the matrix to be oxidized. When the addition amount of the additive element of the matrix to be oxidized is too large, the Fe content is relatively small. Therefore, the addition amount is more preferably set not less than 0.5 at. % and not more than 50 at. % from the viewpoint of obtaining a good wustite structure.

In the samples shown in Table 14, in the formation of the oxide layer 21, an $Fe_{90}Cd_{10}$ layer, an $Fe_{90}Cu_{10}$ layer, an $Fe_{90}Ti_{10}$ layer, an $Fe_{90}V_{10}$ layer, an $Fe_{90}Cr_{10}$ layer, an $Fe_{90}Mn_{10}$ layer, an $Fe_{90}Al_{10}$ layer, an $Fe_{90}Si_{10}$ layer, an $Fe_{90}Mg_{10}$ layer, an $Fe_{90}Pt_{10}$ layer, an $Fe_{90}Pd_{10}$ layer, an $Fe_{90}Ag_{10}$ layer, an $Fe_{90}Zr_{10}$ layer, an $Fe_{90}Hf_{10}$ layer, or an $Fe_{90}Ta_{10}$ layer was formed on the nonmagnetic layer 16. The thickness of these layers is 1.2 nm. In this experiment, the beam current Ib in the IAO was set to a constant value of 60 mA, and also the acceleration voltage Vb was set to a constant value of 60 V. The plasma power Pw was switched between 20 W and 40 W.

TABLE 14

| | | | Vb (V) | Pw (W) | d (nm) | MR (%) | RA ($\Omega \mu m^2$) |
|---|---|---|---|---|---|---|---|
| C1-1 | | | — | — | — | 1.5 | 0.05 |
| C14-1 | Fe0.9Cd0.1 | 1.2 nm | 60 | 20 | 0.25 | 9 | 0.23 |
| E14-1 | Fe0.9Cd0.1 | 1.2 nm | 60 | 40 | 0.253 | 16 | 0.22 |
| C14-2 | Fe0.9Cu0.1 | 1.2 nm | 60 | 20 | 0.25 | 8.8 | 0.23 |
| E14-2 | Fe0.9Cu0.1 | 1.2 nm | 60 | 40 | 0.253 | 15 | 0.21 |
| C14-3 | Fe0.9Ti0.1 | 1.2 nm | 60 | 20 | 0.25 | 8.5 | 0.22 |
| E14-3 | Fe0.9Ti0.1 | 1.2 nm | 60 | 40 | 0.253 | 15.5 | 0.2 |
| C14-4 | Fe0.9V0.1 | 1.2 nm | 60 | 20 | 0.25 | 8.2 | 0.23 |
| E14-4 | Fe0.9V0.1 | 1.2 nm | 60 | 40 | 0.253 | 14.5 | 0.21 |
| C14-5 | Fe0.9Cr0.1 | 1.2 nm | 60 | 20 | 0.25 | 8.3 | 0.22 |
| E14-5 | Fe0.9Cr0.1 | 1.2 nm | 60 | 40 | 0.253 | 14.8 | 0.22 |
| C14-6 | Fe0.9Mn0.1 | 1.2 nm | 60 | 20 | 0.25 | 8.3 | 0.22 |
| E14-6 | Fe0.9Mn0.1 | 1.2 nm | 60 | 40 | 0.253 | 14.9 | 0.21 |
| C14-7 | Fe0.9Al0.1 | 1.2 nm | 60 | 20 | 0.25 | 9 | 0.22 |
| E14-7 | Fe0.9Al0.1 | 1.2 nm | 60 | 40 | 0.253 | 15 | 0.21 |
| C14-8 | Fe0.9Si0.1 | 1.2 nm | 60 | 20 | 0.25 | 8.8 | 0.24 |
| E14-8 | Fe0.9Si0.1 | 1.2 nm | 60 | 40 | 0.253 | 14.2 | 0.22 |
| C14-9 | Fe0.9Mg0.1 | 1.2 nm | 60 | 20 | 0.25 | 9 | 0.25 |
| E14-9 | Fe0.9Mg0.1 | 1.2 nm | 60 | 40 | 0.253 | 14.8 | 0.21 |
| C14-10 | Fe0.9Ga0.1 | 1.2 nm | 60 | 20 | 0.25 | 9.4 | 0.21 |
| E14-10 | Fe0.9Ga0.1 | 1.2 nm | 60 | 40 | 0.253 | 16.5 | 0.21 |
| C14-11 | Fe0.9Ge0.1 | 1.2 nm | 60 | 20 | 0.25 | 9.3 | 0.22 |
| E14-11 | Fe0.9Ge0.1 | 1.2 nm | 60 | 40 | 0.253 | 15 | 0.21 |
| C14-12 | Fe0.9Pt0.1 | 1.2 nm | 60 | 20 | 0.25 | 9.2 | 0.13 |
| E14-12 | Fe0.9Pt0.1 | 1.2 nm | 60 | 40 | 0.253 | 14.5 | 0.21 |
| C14-13 | Fe0.9Pd0.1 | 1.2 nm | 60 | 20 | 0.25 | 9 | 0.22 |
| E14-13 | Fe0.9Pd0.1 | 1.2 nm | 60 | 40 | 0.253 | 15.4 | 0.21 |
| C14-14 | Fe0.9Ag0.1 | 1.2 nm | 60 | 20 | 0.95 | 8.8 | 0.23 |
| E14-14 | Fe0.9Ag0.1 | 1.2 nm | 60 | 40 | 0.253 | 15 | 0.21 |
| C14-15 | Fe0.9Zr0.1 | 1.2 nm | 60 | 20 | 0.25 | 9.4 | 0.22 |
| E14-15 | Fe0.9Zr0.1 | 1.2 nm | 60 | 40 | 0.253 | 15.2 | 0.2 |
| C14-16 | Fe0.9Hf0.1 | 1.2 nm | 60 | 20 | 0.25 | 8.8 | 0.21 |
| E14-16 | Fe0.9Hf0.1 | 1.2 nm | 60 | 40 | 0.253 | 15 | 0.2 |
| C14-17 | Fe0.9Ta0.1 | 1.2 nm | 60 | 20 | 0.25 | 8.2 | 0.21 |
| E14-17 | Fe0.9Ta0.1 | 1.2 nm | 60 | 40 | 0.253 | 10.2 | 0.2 |

As can be seen from Table 14, in Sample E14-1 to Sample E14-15, the lattice spacing d of the (1 1 1) plane of the wustite crystal grains 21s is not less than 0.253 nm and not more than 0.275 nm. A large MR ratio is obtained in these samples. The resistance area RA of Sample E14-1 to Sample E14-17 is approximately 0.2, which is substantially equal to the value of Sample C14-1 to Sample C14-17.

Thus, also in the case where at least one of copper, titanium, vanadium, chromium, manganese, aluminum, silicon, magnesium, gallium, germanium, platinum, palladium, silver, zirconium, hafnium, and tantalum is further contained in addition to Fe in the matrix material to be oxidized of the oxide layer 21, a high MR ratio can be obtained by making the lattice spacing of the (1 1 1) orientation plane of the wustite crystal grains 21s 0.253 nm or more. Furthermore, an oxide layer 21 having high heat resistance can be formed by adding the additive element mentioned above. Here, the addition amount of the additive element of copper, titanium, vanadium, chromium, manganese, aluminum, silicon, magnesium, gallium, germanium, platinum, palladium, silver, zirconium, hafnium, and tantalum may be set not less than 0.5 at. % and not more than 50 at. % in the metal alloy containing Fe of the matrix to be oxidized. An excessively large addition amount of the additive element of the matrix to be oxidized is not preferable from the viewpoint of obtaining a good wustite structure because the Fe content becomes relatively small.

Figure 18:
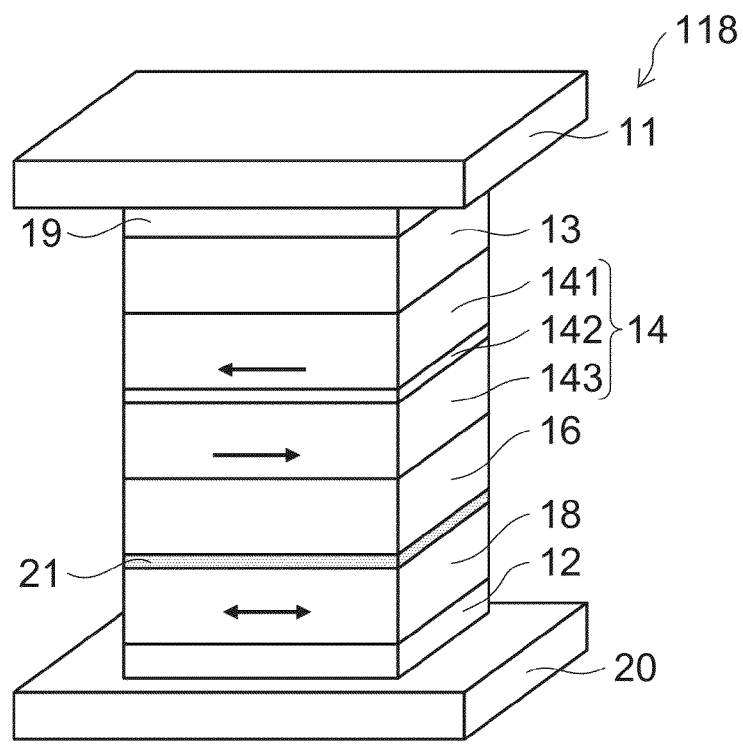
FIG. 18 is a schematic perspective view illustrating a configuration of another magneto-resistance effect element according to the first embodiment.

FIG. 18 is a schematic perspective view illustrating the configuration of another magneto-resistance effect element according to the first embodiment.

As shown in FIG. 18, in a magneto-resistance effect element 118 according to the embodiment, the underlayer 12, the second magnetic layer 18, the nonmagnetic layer 16, the first magnetic layer 14, the pinning layer 13, and the cap layer 19 are provided in this order on the second electrode 20. The oxide layer 21 is provided between the nonmagnetic layer 16 and the second magnetic layer 18. Otherwise, the configuration is similar to the magneto-resistance effect element 111, and a description is omitted.

The magneto-resistance effect element 118 is, for example, a magneto-resistance effect element of a top spin valve structure. Also in such a case where a top spin valve structure is used, high spin-dependent interface scattering can be exhibited and the MR ratio can be greatly improved by providing the oxide layer 21. Thus, a magneto-resistance effect element enabling high integration can be provided.

Figure 19:
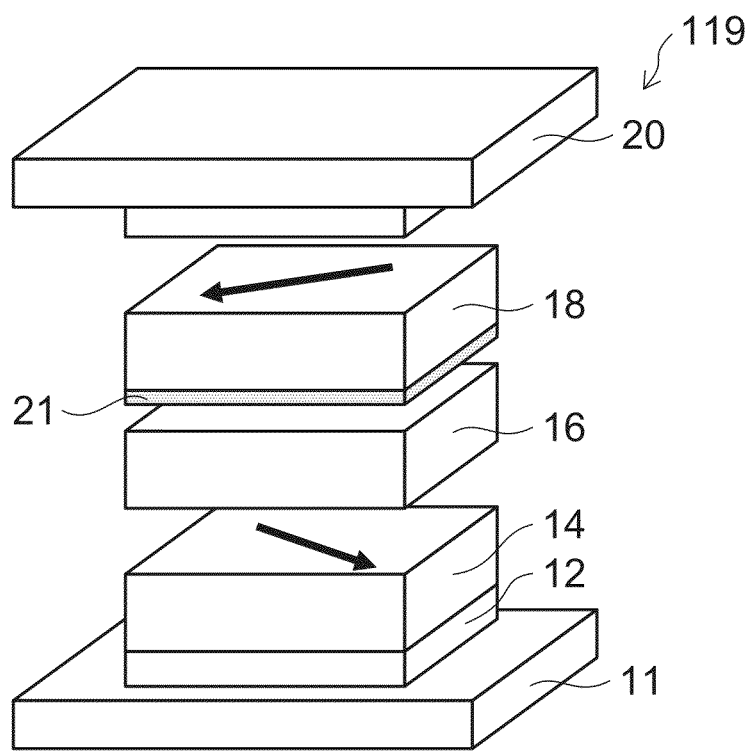
FIG. 19 is a schematic perspective view illustrating a configuration of another magneto-resistance effect element according to the first embodiment.

FIG. 19 is a schematic perspective view illustrating the configuration of another magneto-resistance effect element according to the first embodiment.

As shown in FIG. 19, in a magneto-resistance effect element 119 according to the embodiment, the magnetization direction of the first magnetic layer 14 and the magnetization direction of the second magnetic layer 18 are variable. In this example, the oxide layer 21 is disposed between the nonmagnetic layer 16 and the second magnetic layer 18.

In the magneto-resistance effect element 119, no pinned layer is provided, and two free layers are provided. In the magneto-resistance effect element 119, for example, in a state where a magnetic field from a magnetic recording medium is not applied, the angle between the magnetization direction of the first magnetic layer 14 and the magnetization direction of the second magnetic layer 18 is, for example, substantially 90 degrees. The relative angle of the two free layers is changed by the magnetic field from the magnetic recording medium. Thereby, the magneto-resistance effect element 119 can be used as, for example, a reproducing head. Such a magnetization alignment of 90 degrees can be obtained by the combination of a magnetic coupling via a spacer layer, a hard bias, etc. or some other methods.

Also in the magneto-resistance effect element 119, high spin-dependent interface scattering can be exhibited and the MR ratio can be greatly improved by providing the oxide layer 21. Thus, a magneto-resistance effect element enabling high integration can be provided.

Figure 20:
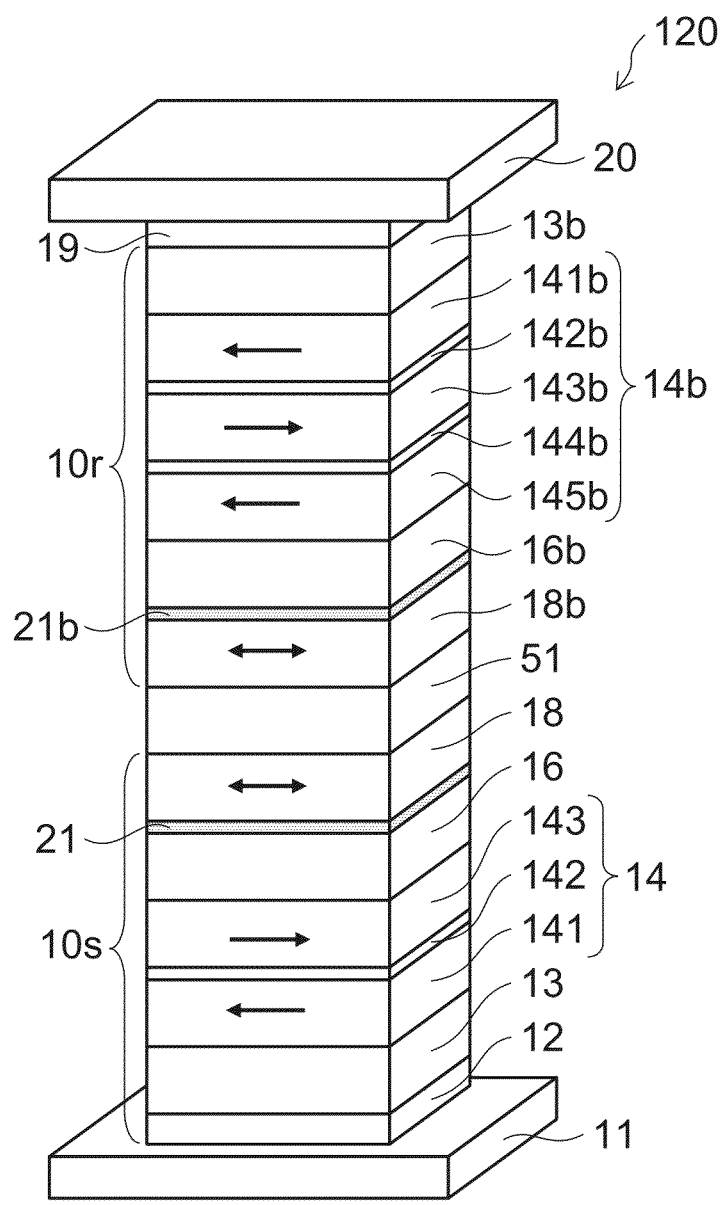
FIG. 20 is a schematic perspective view illustrating a configuration of another magneto-resistance effect element according to the first embodiment.

FIG. 20 is a schematic perspective view illustrating the configuration of another magneto-resistance effect element according to the first embodiment.

As shown in FIG. 20, in a magneto-resistance effect element 120 according to the embodiment, the stacked body 10s described above is provided between the first electrode 11 and the second electrode 20, and another stacked body 10r is further provided. In this example, the stacked body 10r is disposed between the stacked body 10s and the second electrode 20. Further, an intermediate layer 51 is provided between the stacked body 10s and the stacked body 10r.

The stacked body 10r includes, for example, a second magnetic layer 18b (e.g. a free layer), a first magnetic layer 14b (e.g. a pinned layer), a nonmagnetic layer 16b, and an oxide layer 21b. The first magnetic layer 14b is disposed between the second magnetic layer 18b and the second electrode 20. The nonmagnetic layer 16b is disposed between the second magnetic layer 18b and the first magnetic layer 14b. In this example, the oxide layer 21b is disposed between the second magnetic layer 18b and the nonmagnetic layer 16b. The stacked body 10r may further include a pinning layer 13b provided between the first magnetic layer 14b and the second electrode 20. The cap layer 19 may be provided between the pinning layer 13b and the second electrode 20.

The first magnetic layer 14b may include, for example, a lower pinned layer 145b provided on the nonmagnetic layer 16b, an antiparallel magnetic coupling layer 144b provided on the lower pinned layer 145b, a central pinned layer 143b provided on the antiparallel magnetic coupling layer 144b, an antiparallel magnetic coupling layer 142b provided on the central pinned layer 143b, and an upper pinned layer 141b provided on the antiparallel magnetic coupling layer 142b. The first magnetic layer 14b is, for example, a pinned layer.

The oxide layer 21b is, for example, a metal oxide. The oxide layer 21b includes the wustite crystal grains 21s with the (1 1 1) plane orientation of the wustite structure containing iron, and the lattice spacing of the (1 1 1) plane of the wustite crystal grains 21s is, for example, not less than 0.253 nm and not more than 0.275 nm. Thus, a plurality of stacked bodies may be provided in the magneto-resistance effect element 120.

The magneto-resistance effect element 120 has a differential structure in which two magneto-resistance effect elements in each of which the magnetization directions of pinned layers in contact with a nonmagnetic layer are oppositely fixed are connected in series. In the magneto-resistance effect element 120, the resistance changes of the two magneto-resistance effect elements connected behave in a reverse polarity manner to the external magnetic field. Consequently, output is obtained in a magnetization transition region of a perpendicular magnetic recording medium, in which region an upward medium magnetization and a downward medium magnetization are adjacent. That is, differential medium magnetic field detection can be performed.

For the intermediate layer 51, for example, a copper film with a thickness of 5 nm may be used. Also a nonmagnetic metal such as copper, gold, silver, ruthenium, iridium, osmium, rhenium, rhodium, and tantalum may be used as the intermediate layer 51. As the intermediate layer 51, also a stacked body may be used that includes a layer of a ferromagnetic metal selected from the group consisting of cobalt, iron, and nickel, a layer of a nonmagnetic metal selected from the group consisting of ruthenium, iridium, osmium, rhenium, and rhodium, and a layer provided between these layers of a metal that causes an antiferromagnetic coupling. In this case, the magnetization of the second magnetic layer 18 can be coupled with the magnetization of the second magnetic layer 18b in an antiparallel manner.

Also in the magneto-resistance effect element 120, high spin-dependent interface scattering can be exhibited and the MR ratio can be greatly improved by providing the oxide layer 21 (and the oxide layer 21b). Thus, a magneto-resistance effect element enabling high integration can be provided.

Second Embodiment

Figure 21:
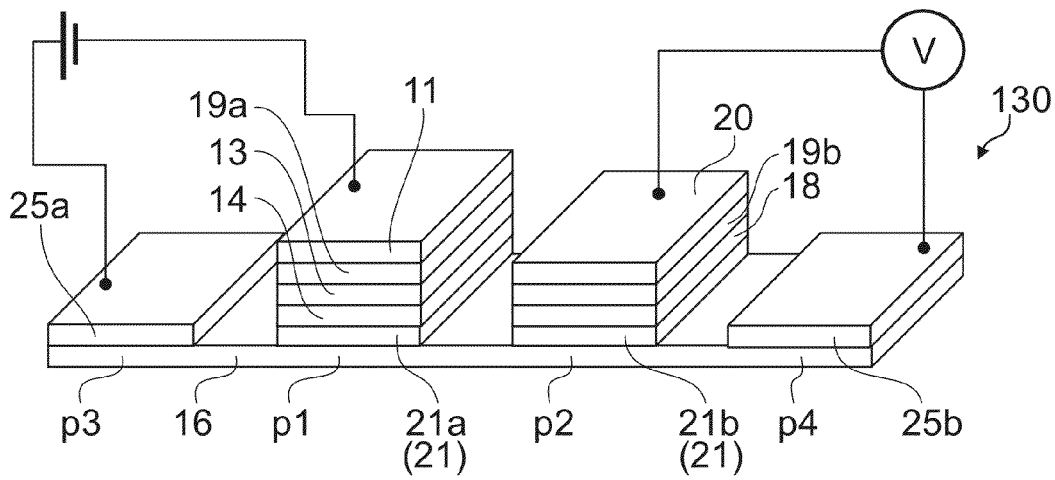
FIG. 21 is a schematic perspective view illustrating a configuration of a magneto-resistance effect element according to a second embodiment.

FIG. 21 is a schematic perspective view illustrating the configuration of a magneto-resistance effect element according to a second embodiment.

As shown in FIG. 21, a magneto-resistance effect element 130 according to the embodiment includes the nonmagnetic layer 16, the first electrode 11, the first magnetic layer 14, the second electrode 20, the second magnetic layer 18, and the oxide layer 21.

The nonmagnetic layer 16 includes a first portion p1 and a second portion p2. The second portion p2 is away from the first portion p1.

The first electrode 11 is stacked with the first portion p1. The first magnetic layer 14 is provided between the first portion p1 and the first electrode 11. The second electrode 20 is stacked with the second portion p2. The second magnetic layer 18 is provided between the second portion p2 and the second electrode 20.

The oxide layer 21 is provided at least one of between the first electrode 11 and the first portion p1 and between the second electrode 20 and the second portion p2. In this example, an oxide layer 21a and an oxide layer 21b are provided as the oxide layer 21. The oxide layer 21a is provided between the first electrode 11 and the first portion p1. The oxide layer 21b is provided between the second electrode 20 and the second portion p2. A metal oxide is used for the oxide layer 21. The oxide layer 21 (at least one of the oxide layer 21a and the oxide layer 21b) includes the wustite crystal grains 21s with the (1 1 1) plane orientation of the wustite structure containing iron. The lattice spacing d of the (1 1 1) plane of the wustite crystal grains 21s is not less than 0.253 nm and not more than 0.275 nm.

In this example, a cap layer 19a is provided between the first magnetic layer 14 and the first electrode 11, and a cap layer 19b is provided between the second magnetic layer 18 and the second electrode 20. The nonmagnetic layer 16 further includes a third portion p3 and a fourth portion p4. The first portion p1 and the second portion p2 are disposed between the third portion p3 and the fourth portion p4. The first portion p1 is disposed between the third portion p3 and the second portion p2. The second portion p2 is disposed between the fourth portion p4 and the first portion p1. In this example, a first electrode layer 25a electrically connected to the third portion p2 and a second electrode layer 25b electrically connected to the fourth portion p4 are provided.

In the magneto-resistance effect element 130, the first magnetic layer 14 is, for example, a pinned layer in which the magnetization direction is fixed. The second magnetic layer 18 is, for example, a free layer in which the magnetization direction is variable. The nonmagnetic layer 16 is, for example, in a band shape.

The vertical relationship between the nonmagnetic layer 16 and the first electrode 11 is arbitrary. The vertical relationship between the nonmagnetic layer 16 and the second electrode 20 is arbitrary. The first electrode 11 may be provided above the nonmagnetic layer 16, and the second electrode 20 may be provided under the nonmagnetic layer 16. Alternatively, the opposite vertical relationships are possible.

The magneto-resistance effect element 130 is, for example, a magneto-resistance effect element based on spin accumulation. The path for current passage is different from the path for voltage measurement. For example, when a current is passed between the first electrode 11 and the first electrode layer 25a, the voltage generated between the second electrode 20 and the second electrode layer 25b is read as the output.

When a current is passed between the first electrode 11 and the first electrode layer 25a, a spin current is generated in the first magnetic layer 14. Electrons that have traveled from the first electrode 11 and passed through the first magnetic layer 14 flow into the first electrode layer 25a through the nonmagnetic layer 16 as a path. At this time, electrons do not flow into the second portion p2 where the second magnetic layer 18 is formed. Therefore, the current is zero in the nonmagnetic layer 16 between the first portion p1 where the first magnetic layer 14 is formed and the second portion p2 where the second magnetic layer is formed. At this time, spin accumulation occurs near the interface between the first magnetic layer 14 and the nonmagnetic layer 16. Spins diffuse from the region where spins are accumulated, and a spin current is generated. The spin current is absorbed by the second magnetic layer 18 in the second portion p2. At this time, the electric potential of the second magnetic layer 18 varies with the relative angle between the magnetization of the second magnetic layer 18 and the magnetization of the first magnetic layer 14, and a voltage change occurs between the nonmagnetic layer 16 and the second magnetic layer 18. The voltage change is detected as the output. Thereby, a magneto-resistance effect element based on spin accumulation operates.

Also a system is possible in which, for example, a current is passed between the second electrode 20 and the second electrode layer 25b and the voltage generated between the first electrode 11 and the first electrode layer 25a is read as the output.

For the nonmagnetic layer 16, for example, a copper layer with a thickness of 30 nm may be used. Also a nonmagnetic metal such as gold, silver, ruthenium, iridium, osmium, rhenium, rhodium, and tantalum may be used as the nonmagnetic layer 16. Copper, silver, and gold are particularly preferable because they have a relatively long spin diffusion length.

When the distance between the first portion p1 where the first magnetic layer 14 is stacked and the second portion p2 where the second magnetic layer 18 is stacked is short, high output is obtained. The distance between the first portion p1 where the first magnetic layer 14 is stacked and the second portion p2 where the second magnetic layer 18 is stacked is preferably 1000 nm or less. The distance is more preferably 200 nm or less.

Also in such a magneto-resistance effect element based on spin accumulation, the output detected can be increased by using the oxide layer 21.

In the embodiment, the oxide layer 21 is provided at least one of between the first electrode 11 and the first portion p1 and between the second electrode 20 and the second portion p2. For example, the oxide layer 21 is provided between the first portion p1 and the first magnetic layer 14. For example, the oxide layer 21 is provided between the first magnetic layer 14 and the first electrode 11. For example, the oxide layer 21 is provided between the second portion p2 and the second magnetic layer 18. For example, the oxide layer 21 is provided between the second magnetic layer 18 and the second electrode 20. Any configuration and any formation method described in the first embodiment can be applied to the oxide layer 21.

The embodiment can provide a magneto-resistance effect element with a large MR ratio. Thus, a magneto-resistance effect element enabling high integration can be provided.

Third Embodiment

The embodiment relates to methods for manufacturing a magneto-resistance effect element.

A method for manufacturing a magneto-resistance effect element according to the embodiment includes, for example, forming the first electrode 11, forming the first magnetic layer 14 on the first electrode 11, forming the nonmagnetic layer 16 on the first magnetic layer 14, forming the second magnetic layer 18 on the nonmagnetic layer 16, forming the second electrode 20 on the second magnetic layer 18, and forming the oxide layer 21 of a metal oxide between the first electrode 11 and the second electrode 20. The forming the oxide layer 21 includes forming the oxide layer 21 that includes the wustite crystal grains 21s with the (1 1 1) plane orientation of the wustite structure containing iron and in which the lattice spacing of the (1 1 1) plane of the wustite crystal grains 21s is not less than 0.253 nm and not more than 0.275 nm. In the manufacturing method, the oxide layer 21 may be formed in an arbitrary position between the first electrode 11 and the second electrode 20.

Examples of the method for manufacturing the magneto-resistance effect element 111 will now be described.

Figure 22:
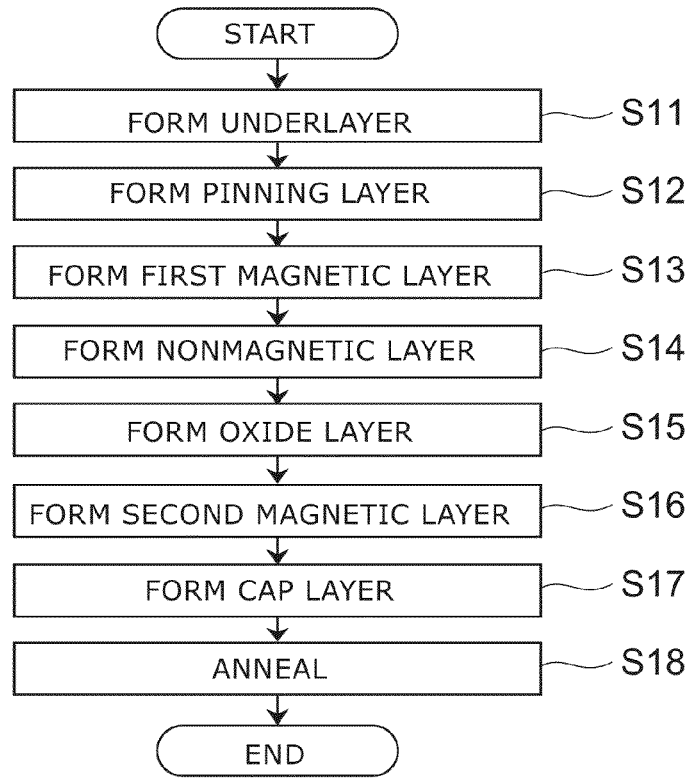
FIG. 22 is a flow chart illustrating a method for manufacturing a magneto-resistance effect element according to a third embodiment.

FIG. 22 is a flow chart illustrating a method for manufacturing a magneto-resistance effect element according to a third embodiment.

In the manufacturing method, a sputter method such as the DC magnetron sputter method and the RF magnetron sputter method, the ion beam sputter method, the vapor deposition method, the CVD (chemical vapor deposition) method, the MBE (molecular beam epitaxy) method, etc. may be used for the method for forming layers.

As shown in FIG. 22, the manufacturing method may include forming the unterlayer 12 (step S11), forming the pinning layer 13 (step S12), forming the first magnetic layer 14 (step S13), forming the nonmagnetic layer 16 (step S14), forming the oxide layer 21 (step S15), forming the second magnetic layer 18 (step S16), forming the cap layer 19 (step S17), and annealing (step S18).

In step S11, a substrate (not shown) in which the first electrode 11 is formed by a microfabrication process is used. Ta (1 nm)/Ru (2 nm), for example, is formed as the underlayer 12 on the first electrode 11. The Ta layer corresponds to a buffer layer for absorbing the unevenness etc. of the surface of the first electrode 11 etc. The Ru layer corresponds to a seed layer that controls the crystal orientation and crystal grainsize of a spin valve film formed thereon.

In step S12, an antiferromagnetic material, for example, is used for the pinning layer 13. At least one of IrMn, PtMn, PdPtMn, and RuRhMn, for example, is used for the pinning layer 13.

In step S13, for example, the lower pinned layer 141 ($Co_{75}Fe_{25}$ (4.4 nm)), the magnetic coupling layer 142 (Ru), and the upper pinned layer 143 ($Fe_{50}Co_{50}$ (4 nm)) that form the first magnetic layer 14 are sequentially stacked. The first magnetic layer 14 is, for example, a synthetic pinned layer.

In step S14, a metal layer that forms the nonmagnetic layer 16 is formed. The metal layer is, for example, one of Au, Ag, Cu, and Zn. Also a CCP-NOL, for example, may be formed as the nonmagnetic layer 16.

Step S15 includes, for example, forming a metal layer that forms the oxide layer 21 and oxidizing the metal layer.

In the forming the metal layer, for example, a metal layer containing Fe and Zn is deposited on the nonmagnetic layer 16. The metal layer containing Fe and Zn may be a stacked body of an Fe layer and a Zn layer such as, for example, Fe/Zn, Zn/Fe, or (Fe/Zn)×2. The metal layer containing Fe and Zn may be a single layer of an alloy such as, for example, $Zn_{50}Fe_{50}$.

The metal layer that forms the oxide layer 21 may contain Zn in addition to Fe. The metal layer that forms the oxide layer 21 may contain at least one of Co and Ni in addition to Fe. The metal layer that forms the oxide layer 21 may contain at least one of Sn, In, and Cd in addition to Fe. The metal layer that forms the oxide layer 21 may further contain at least one of copper, titanium, vanadium, chromium, manganese, aluminum, silicon, magnesium, gallium, germanium, platinum, palladium, silver, zirconium, hafnium, and tantalum in addition to Fe.

In the oxidizing the metal layer, for example, ion-assisted oxidation (IAO) is performed. In the IAO, for example, oxygen is supplied while the metal layer is irradiated with an ion beam or plasma of a rare gas or the like. In the ion-assisted oxidation, oxygen gas may be ionized or plasma-ized. By the energy assist to the metal layer by the irradiation with an ion beam, a stable, uniform oxide layer 21 can be formed. When forming one oxide layer 21, the formation of a metal layer and oxidation treatment may be repeatedly performed several times. In this case, it is preferable to divide a metal material layer of a prescribed thickness into thin layers and perform oxidation treatment on the thin metal material layers, rather than to fabricate the oxide layer 21 of a prescribed thickness by one round of deposition and oxidation treatment.

Furthermore, natural oxidation may be used in which a metal layer containing Zn and Fe is exposed to an oxygen atmosphere. However, an oxidation method using an energy assist is preferable in order to form a stable oxide.

In the case where the oxide layer 21 is formed using a stacked body of a Zn layer and an Fe layer, oxidation while performing ion beam irradiation is preferably performed in order to form an oxide layer 21 of uniformly mixed Zn and Fe.

In the case where an ion beam or plasma of a rare gas or the like is used, a gas containing at least one selected from the group consisting of argon, xenon, helium, neon, and krypton, for example, may be used as the rare gas.

As a method of the energy assist, other than ion beam irradiation, heating treatment etc. may be performed. In this case, for example, after the deposition of the metal layer, it is possible to supply oxygen while heating the metal layer at a temperature of not less than 100° C. and not more than 300° C.

Examples will now be described of the beam conditions when using ion beam-assisted oxidation treatment in the oxidation treatment for forming the oxide layer 21. In the case where the rare gas mentioned above is ionized or plasma-ized and applied when the oxide layer 21 is formed by oxidation treatment, the acceleration voltage Vb is preferably set not less than 30 V and not more than 130 V, and the beam current Ib is preferably set not less than 20 mA and not more than 200 mA. These conditions are significantly weak conditions as compared to the conditions in the case of performing ion beam etching. The oxide layer 21 can be formed also by using plasma such as RF plasma instead of an ion beam.

The incident angle of the ion beam may be appropriately altered within a range of not less than 0 degrees and not more than 80 degrees, assuming that the incident angle in the case of being incident perpendicularly to the film surface is 0 degrees and the incident angle in the case of being incident parallel to the film surface is 90 degrees. The treatment time in this process is preferably not less than 15 seconds and not more than 1200 seconds, and more preferably 30 seconds or more from the viewpoints of controllability etc. An excessively long treatment time is not preferable because the productivity of magneto-resistance effect elements is reduced. From these points of view, the treatment time is preferably not less than 30 seconds and not more than 600 seconds.

In the case of oxidation treatment using ions or plasma, the oxygen exposure amount is preferably not less than $1 \times 10^3$ L (Langmuir, 1 L=$1 \times 10^{-6}$ Torr×sec) and not more than $1 \times 10^4$ L in the case of IAO. In the case of natural oxidation, the oxygen exposure amount is preferably not less than $3 \times 10^3$ L and not more than $3 \times 10^4$ L.

Reduction treatment using a reducing gas may be performed after the oxidation treatment described above.

As the reducing gas, a gas containing at least one of the following may be used: ions of at least one of argon, helium, neon, krypton, and xenon; plasma of at least one of argon, helium, neon, krypton, and xenon; radicals of at least one of argon, helium, neon, krypton, and xenon; molecules of at least one of hydrogen and nitrogen; ions of at least one of hydrogen and nitrogen; plasma of at least one of hydrogen and nitrogen; and radicals of at least one of hydrogen and nitrogen. In particular, a gas containing at least one of plasma of at least one of argon, helium, neon, krypton, and xenon, ions of at least one of hydrogen and nitrogen, and plasma of at least one of hydrogen and nitrogen is preferably used as the reducing gas. A gas containing at least one of ions of argon and plasma of argon is preferably used as the reducing gas.

The oxygen concentration of the film of the matrix material after the oxidation treatment can be adjusted by the reduction treatment. Thereby, the structure of the oxide layer 21 can be adjusted to a structure having an oxygen concentration capable of strongly exhibiting spin-dependent scattering (the spin filtering effect). The reduction treatment may be performed while the film of the matrix material after the oxidation treatment is heated. For example, the reduction treatment may be performed on the matrix material heated at not less than 100° C. and not more than 300° C. The reduction treatment can be performed more efficiently by heating.

Water removal treatment of at least one of argon ion irradiation, argon plasma irradiation, and heating may be further performed on the film after the reduction treatment. Thereby, water produced in the reduction treatment can be removed.

In the fabrication of the oxide layer 21, oxidation treatment and reduction treatment may be repeated again after the processes mentioned above have been finished. The film can be reduced more efficiently by repeating the removal of water produced and reduction treatment alternately.

In regard to such a reduction treatment, examples of the beam conditions in the case where Ar ion beam irradiation is performed will now be described. In the case where the rare gas described above is ionized or plasma-ized and applied in the reduction treatment when forming the oxide layer 21, the acceleration voltage Vb is preferably set not less than 30 V and not more than 130 V, and the beam current Ib is preferably set not less than 20 mA and not more than 200 mA. These conditions are significantly weak conditions as compared to the conditions in the case of performing ion beam etching.

The oxide layer 21 can be formed also by using plasma such as RF plasma instead of an ion beam. The incident angle of the ion beam may be appropriately altered in a range of not less than 0 degrees and not more than 80 degrees, assuming that the incident angle in the case of being incident perpendicularly to the film surface is 0 degrees and the incident angle in the case of being incident parallel to the film surface is 90 degrees. The treatment time in this process is preferably not less than 15 seconds and not more than 1200 seconds, and more preferably 30 seconds or more from the viewpoints of controllability etc. An excessively long treatment time is not preferable because the productivity of magneto-resistance effect elements is reduced. From these points of view, the treatment time is preferably not less than 30 seconds and not more than 600 seconds.

Although the case where step S15 (forming the oxide layer 21) includes forming a metal layer that forms the oxide 21 and oxidizing the metal layer is described in the above, the oxide layer 21 may be formed by sputtering using an oxide target in step S15. For example, the oxide layer 21 may be formed by sputtering using an oxide target of $(Zn_{15}Fe_{85})_{0.95}O_1$ having the NaCl structure (the wustite structure), an oxide target of $(Zn_{15}Fe_{85})_3O_4$ having the spinel structure, or the like.

An additional oxidation treatment may be performed after deposition by sputtering using an oxide target. Furthermore, reduction treatment may be performed thereafter. By performing such an additional treatment, the oxygen concentration in the oxide layer 21 can be adjusted to an oxygen concentration of an Fe—Zn mixed oxide exhibiting a high spin-dependent scattering effect.

In the case where a CCP-NOL is used as the nonmagnetic layer 16, at least part of the processing for forming the oxide layer 21 of step S15 may be performed simultaneously with at least part of the processing for forming the CCP-NOL.

In step S16, for example, $Fe_{50}Co_{50}$ (1 nm)/$Ni_{90}Fe_{10}$ (3 nm) that forms the second magnetic layer 18 is formed on the oxide layer 21.

In step S17, for example, Cu (1 nm)/Ru (10 nm) that forms the cap layer 19 is formed on the second magnetic layer 18.

In step S18, anneal treatment is performed. After that, the second electrode 20 is formed on the cap layer 19.

The embodiment can provide a magneto-resistance effect element with a large MR ratio. Thus, a magneto-resistance effect element enabling high integration can be provided.

Another method for manufacturing a magneto-resistance effect element according to the embodiment includes, for example, forming the first electrode 11, forming the first magnetic layer 14 on the first electrode 11, forming the oxide layer 21 on the first magnetic layer 14, forming the second magnetic layer 18 on the oxide layer 21, and forming the second electrode 20 on the second magnetic layer 18. The forming the oxide layer 21 includes forming the oxide layer 21 that includes the wustite crystal grains 21s with the (1 1 1) plane orientation of the wustite structure containing iron and in which the lattice spacing of the (1 1 1) plane of the wustite crystal grains 21s is not less than 0.253 nm and not more than 0.275 nm.

Another method for manufacturing a magneto-resistance effect element according to the embodiment includes forming the nonmagnetic layer 16 including the first portion p1 and the second portion p2 away from the first portion p1, forming the first electrode 11 stacked with the first portion p1, forming the first magnetic layer 14 provided between the first portion p1 and the first electrode 11, forming the second electrode 20 stacked with the second portion p2, forming the second magnetic layer 18 provided between the second portion p2 and the second electrode 20, and forming the oxide layer 21 of a metal oxide at least one of between the first electrode 11 and the first portion p1 and between the second electrode 20 and the second portion p2. The forming the oxide layer 21 includes forming the oxide layer 21 that includes the wustite crystal grains 21s with the (1 1 1) plane orientation of the wustite structure containing iron and in which the lattice spacing of the (1 1 1) plane of the wustite crystal grains 21s is not less than 0.253 nm and not more than 0.275 nm. In the manufacturing method, the order of processes may be changed and a plurality of processes may be simultaneously performed within the extent of technical feasibility. For example, at least part of the formation of the first electrode 11 may be performed simultaneously with at least part of the formation of the second electrode 20.

In these manufacturing methods, any method mentioned above may be applied to the method for forming the oxide layer 21.

Fourth Embodiment

The embodiment relates to a magnetic head using the magneto-resistance effect element according to the first embodiment. In the embodiment, any magneto-resistance effect element according to the first embodiment may be used. In the following, the case where the magneto-resistance effect element 110 is used is described as an example.

Figure 23:
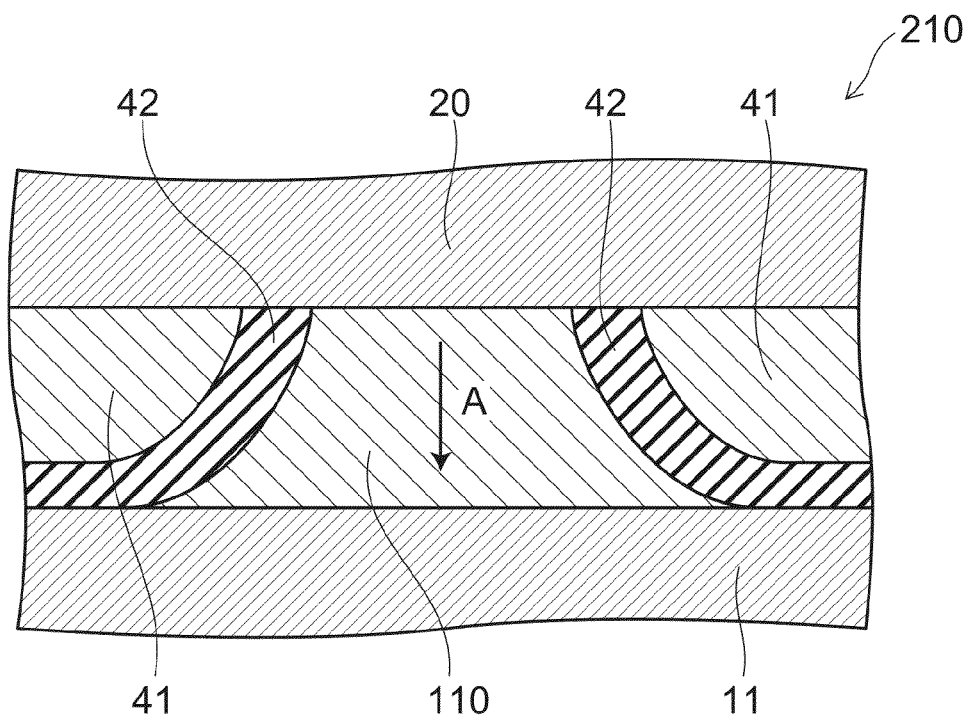
FIG. 23 and FIG. 24 are schematic cross-sectional views illustrating a configuration of a magnetic head according to a fourth embodiment.
Figure 24:
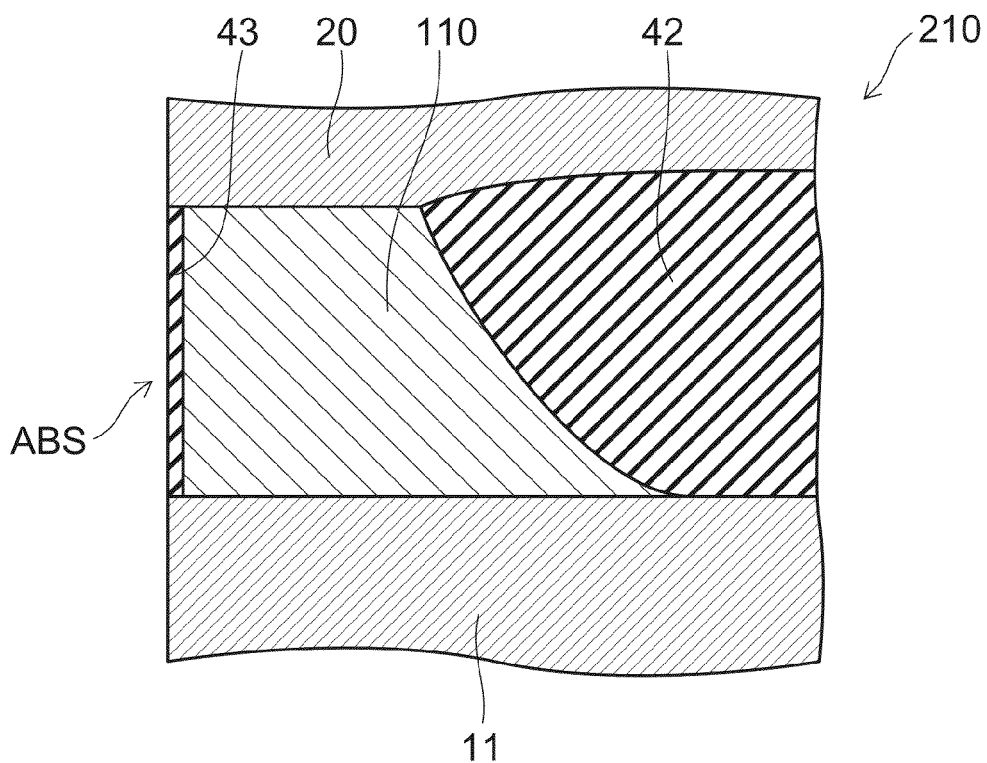

FIG. 23 and FIG. 24 are schematic cross-sectional views illustrating the configuration of a magnetic head according to a fourth embodiment.

FIG. 23 is a cross-sectional view of the magneto-resistance effect element 110 taken along a direction almost parallel to a medium facing surface opposed to a magnetic recording medium (not shown).

FIG. 24 is a cross-sectional view of the magneto-resistance effect element 110 taken along a direction perpendicular to the medium facing surface ABS.

In the drawings, the first electrode 11 and the second electrode 20 included in the magneto-resistance effect element 110 are shown, and the other configuration is omitted.

As shown in FIG. 23 and FIG. 24, a magnetic head 210 according to the embodiment includes the magneto-resistance effect element 110. The magnetic head 210 has, for example, a hard abutted structure. A bias magnetic field application film 41 and an insulating film 42 are provided to be stacked on both side surfaces of the magneto-resistance effect element 110.

As shown in FIG. 24, a protection layer 43 is provided at the medium facing surface ABS of the magnetic head 210.

The sense current to the magneto-resistance effect element 110 is passed in a direction almost perpendicular to the film surface of the magneto-resistance effect element 110 by the first electrode 11 and the second electrode 20, as indicated by arrow A. A bias magnetic field is applied to the magneto-resistance effect element 110 by the one pair of bias magnetic field application films 41 provided on the left and right sides of the magneto-resistance effect element 110. By the bias magnetic field, the magnetic anisotropy of the second magnetic layer 18 of the magneto-resistance effect element 110 is controlled into a single magnetic domain. Thereby, the magnetic domain structure is stabilized, and Barkhausen noise accompanying a movement of a magnetic domain wall can be suppressed.

The magneto-resistance effect element 110 has an improved MR ratio, and thus enables magnetic reproduction with high sensitivity when used for the magnetic head 210. A magnetic head with a high MR ratio can be provided.

Fifth Embodiment

A fifth embodiment relates to a magnetic recording and reproducing apparatus. The magnetic recording and reproducing apparatus is mounted with any magneto-resistance effect element according to the first embodiment. A magneto-resistance effect element head using any magneto-resistance effect element according to the first embodiment is used for the magnetic recording and reproducing apparatus. An example will now be described in which the magneto-resistance effect element 111 is mounted in the magnetic head.

Figure 25:
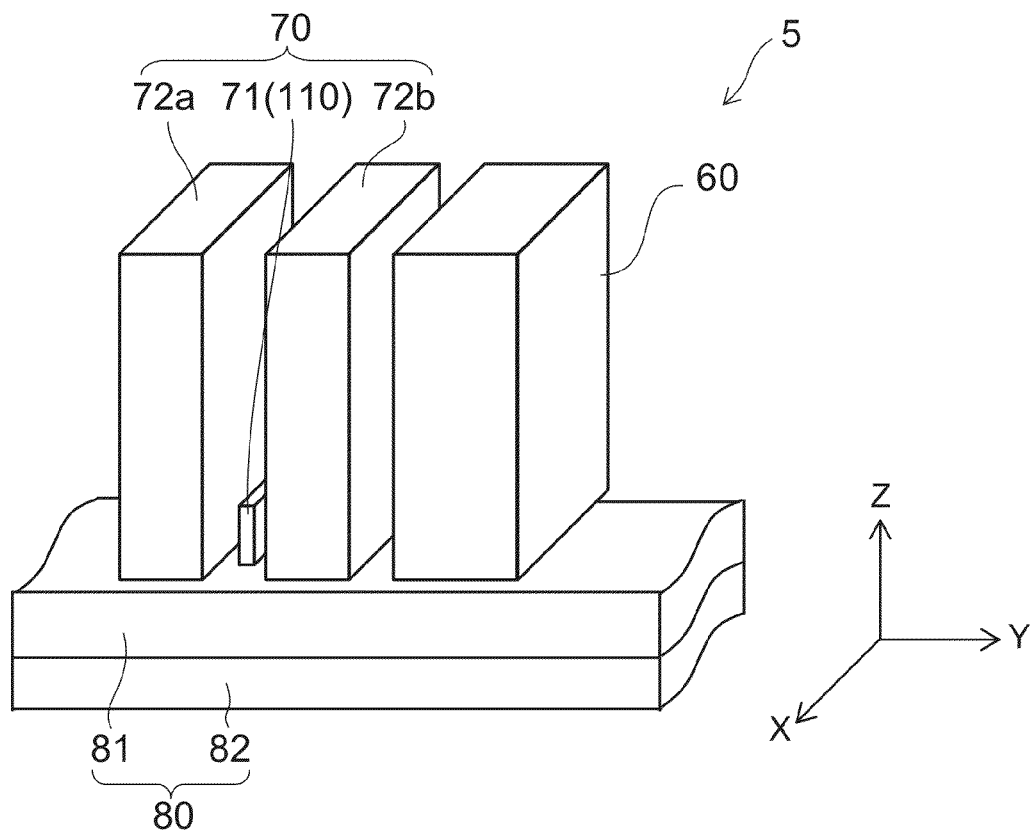
FIG. 25 is a schematic perspective view illustrating a configuration of part of a magnetic recording and reproducing apparatus according to a fifth embodiment.

FIG. 25 is a schematic perspective view illustrating the configuration of part of a magnetic recording and reproducing apparatus according to the fifth embodiment.

FIG. 25 illustrates the configuration of a magnetic head in which a magneto-resistance effect element is mounted.

As shown in FIG. 25, a magnetic head 5 in which the magneto-resistance effect element 110 according to the embodiment is mounted is provided opposite to a magnetic recording medium 80. The magnetic recording medium 80 includes a magnetic recording layer 81 and a backing layer 82. The magnetic recording layer 81 is opposed to the magnetic head 5.

The magnetic head 5 includes a writing head unit 60 opposed to the magnetic recording medium 80 and a reproducing head unit 70 juxtaposed to the writing head unit 60 and opposed to the magnetic recording medium 80.

However, the magnetic head 5 needs only to include the reproducing head unit 70, and the writing head unit 60 may be omitted and is provided as necessary. In the following, the magnetic recording and reproducing apparatus according to the embodiment is described using the case where the magnetic head 5 includes the writing head unit 60.

The reproducing head unit 70 includes a first magnetic shield layer 72a, a second magnetic shield layer 72b, and a magnetic reproducing element 71 provided between the first magnetic shield layer 72a and the second magnetic shield layer 72b. The magneto-resistance effect element 110, for example, according to the embodiment is used as the magnetic reproducing element 71.

The magnetic reproducing element 71 reads the direction of the magnetization of the magnetic recording layer 81 to read recorded information recorded in the magnetic recording medium 80.

The direction perpendicular to a surface of the magnetic recording layer 81 opposed to the magnetic head 5 is defined as the Z-axis direction. One direction perpendicular to the Z-axis direction is defined as the X-axis direction. The direction perpendicular to the Z-axis direction and the X-axis direction is defined as the Y-axis direction. As described later, the magnetic recording medium 80 may be shaped like, for example, a disc, and the relative positions of the magnetic recording medium 80 and the magnetic head 5 are changed along the circumference of the magnetic recording medium 80. The X-Y-Z coordinate system mentioned above may be defined in a range of a short distance near the magnetic head 5.

The magnetic recording medium 80 moves relative to the magnetic head 5 along a direction perpendicular to the Z-axis direction, for example. The magnetic head 5 controls the magnetization of each position of the magnetic recording layer 81 of the magnetic recording medium 80 to perform magnetic recording. The medium moving direction of the magnetic recording medium 80 is set to, for example, the Y-axis direction. The relative movement between the magnetic recording medium 80 and the magnetic head 5 may be made by the movement of the magnetic head 5, and it is sufficient that the magnetic recording medium 80 and the magnetic head 5 relatively move along a direction perpendicular to the Z-axis direction.

The magnetic head 5 is mounted in a head slider 3 described later, and the magnetic head 5 is held away from the magnetic recording medium 80 by the function of the head slider 3. A not-shown magnetic shield may be provided around the magneto-resistance effect element 110 to prescribe the detection resolution of the magnetic head 5.

Figure 26:
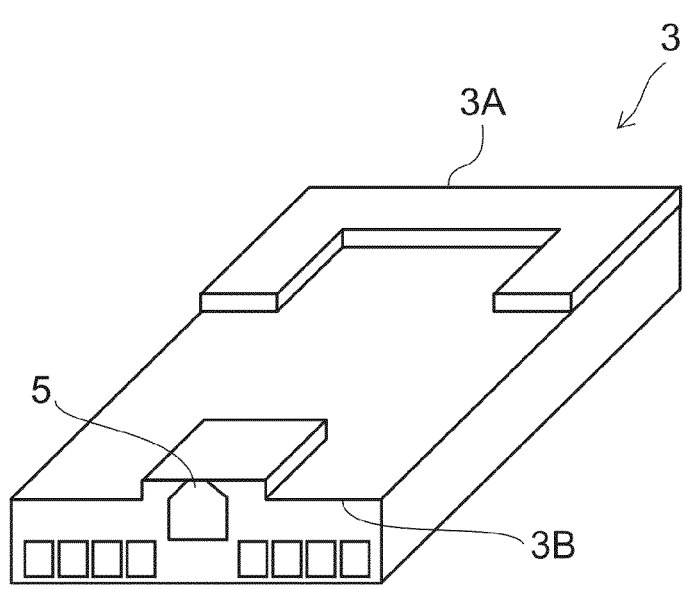
FIG. 26 is a schematic perspective view illustrating a configuration of part of a magnetic recording and reproducing apparatus according to the fifth embodiment.

FIG. 26 is a schematic perspective view illustrating the configuration of part of a magnetic recording and reproducing apparatus according to the fifth embodiment.

FIG. 26 illustrates the configuration of a head slider that is part of the magnetic recording and reproducing apparatus.

As illustrated in FIG. 26, the magnetic head 5 is mounted in a head slider 3. The head slider 3 contains $Al_2O_3$, TiC, or the like, and is designed and fabricated so as to be capable of moving relatively above/on the magnetic recording medium 80 such as a magnetic disk while flying above or being in contact with the magnetic recording medium 80.

The head slider 3 has, for example, an air inflow side 3A and an air outflow side 3B, and the magnetic head 5 is disposed at the side surface on the air outflow side 3B or the like. Thereby, the magnetic head 5 mounted in the head slider 3 moves relatively above/on the magnetic recording medium 80 while flying above or being in contact with the magnetic recording medium 80.

An example of the configuration of the whole magnetic recording and reproducing apparatus according to the embodiment will now be described using a magnetic recording and reproducing apparatus 250 as an example.

Figure 27:
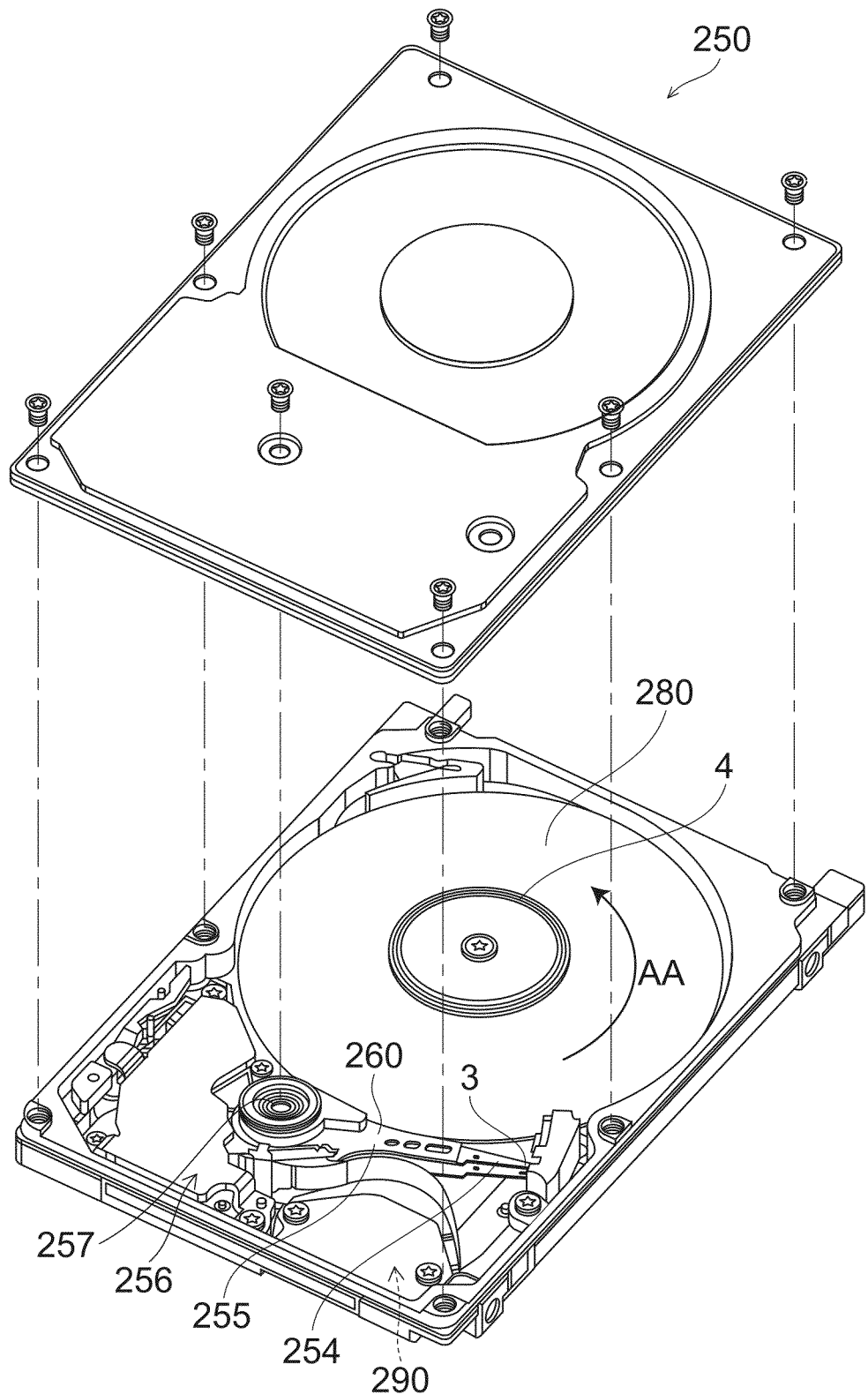
FIG. 27 is a schematic perspective view illustrating a configuration of a magnetic recording and reproducing apparatus according to the fifth embodiment.

FIG. 27 is a schematic perspective view illustrating the configuration of a magnetic recording and reproducing apparatus according to the fifth embodiment.

Figure 28A:
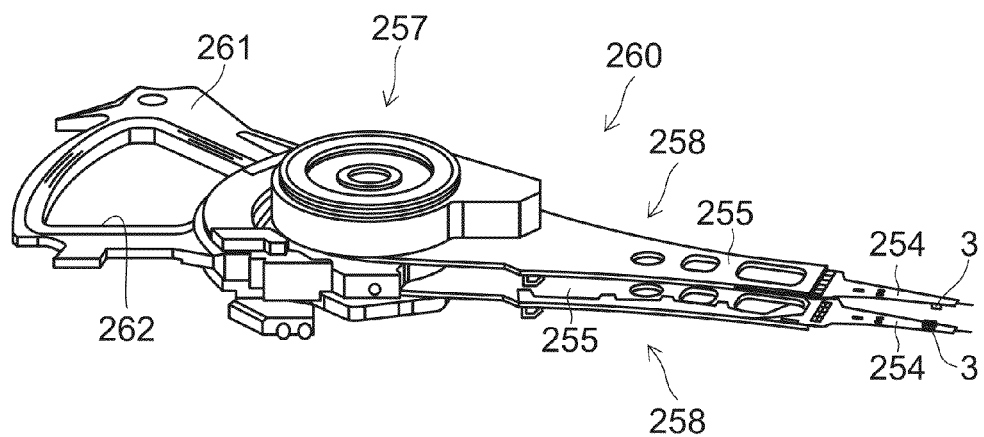
FIG. 28A and FIG. 28B are schematic perspective views illustrating a configuration of part of the magnetic recording and reproducing apparatus according to the fifth embodiment.
Figure 28B:
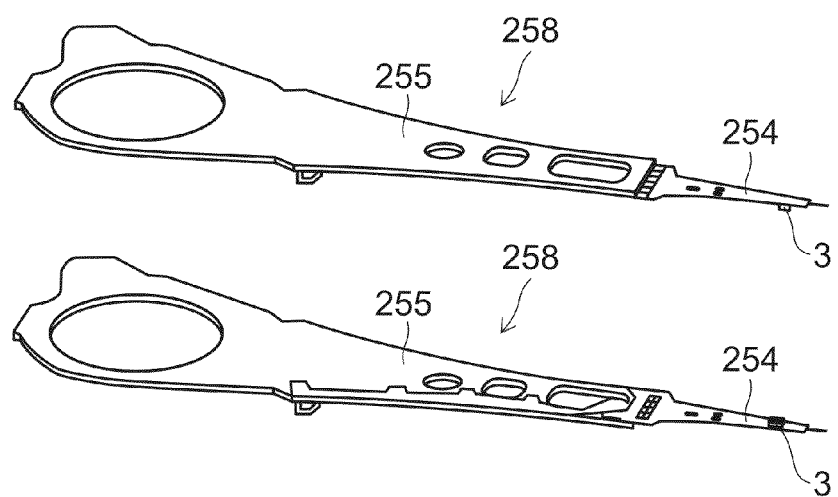

FIG. 28A and FIG. 28B are schematic perspective views illustrating the configuration of part of the magnetic recording and reproducing apparatus according to the fifth embodiment.

FIG. 28A illustrates an enlarged view of a head stack assembly 260 included in the magnetic recording and reproducing apparatus 250.

FIG. 28B illustrates a magnetic head assembly (a head gimbal assembly 258) that is part of the head stack assembly 260.

As shown in FIG. 27, a magnetic recording and reproducing apparatus 250 is an apparatus of a system using a rotary actuator. A recording medium disk 280 is mounted on a spindle motor 4, and is rotated in the direction of arrow AA by a not-shown motor that responds to a control signal from a not-shown driving device control unit. The magnetic recording and reproducing apparatus 250 may include a plurality of recording medium disks 280.

The head slider 3 that performs the recording and reproduction of information stored in the recording medium disk 280 is provided at the tip of a suspension 254 in a thin film form.

When the recording medium disk 280 rotates, the pressing pressure by the suspension 254 and the pressure generated at the medium facing surface of the head slider 3 are balanced, and the medium facing surface of the head slider 3 is held above the surface of the recording medium disk 280 with a prescribed flying height. Also what is called a "contact-traveling type" may be used in which the head slider 3 is in contact with the recording medium disk 280.

The suspension 254 is connected to one end of an actuator arm 255 including a bobbin that holds a not-shown driving coil and the like. A voice coil motor 256 that is a kind of linear motor is provided at the other end of the actuator arm 255. The voice coil motor 256 includes a not-shown driving coil wound around the bobbin of the actuator arm 255 and a magnetic circuit formed of a permanent magnet and an opposed yoke that are disposed opposite to each other so as to sandwich the driving coil.

The actuator arm 255 is held by not-shown ball bearings provided at two positions, the top and bottom, of a bearing portion 257, and can rotationally slide freely by means of the voice coil motor 256. Consequently, the magnetic head 5 can be moved to an arbitrary position on the recording medium disk 280.

As shown in FIG. 28A, a head stack assembly 260 includes the bearing portion 257, a head gimbal assembly 258, and a support frame 261. The head gimbal assembly 258 extends from the bearing portion 257. The support frame 261 extends from the bearing portion 257 in the opposite direction to the head gimbal assembly 258. The support frame 261 supports the coil 262 of the voice coil motor As shown in FIG. 28B, the head gimbal assembly 258 includes the actuator arm 255 extending from the bearing portion 257 and the suspension 254 extending from the actuator arm 255. The head slider 3 is provided at the tip of the suspension 254.

This specific example is an example in which two head gimbal assemblies 258 are provided, but the number of head gimbal assemblies 258 may be one.

Thus, the magnetic head assembly (the head gimbal assembly 258) includes the magnetic head 5, the head slider 3 mounted with the magnetic head 5, the suspension 254 mounted with the head slider 3 on one end, and the actuator arm 255 connected to the other end of the suspension 254. For example, the magnetic head assembly (the head gimbal assembly 258) includes the suspension 254 mounted with the magneto-resistance effect element 110 on one end and the actuator arm 255 connected to the other end of the suspension 254.

The suspension 254 includes lead wires (not shown) for writing and reading signals, for a heater for adjusting the flying height, and for other purposes, and the lead wires and the respective electrodes of the magnetic head 5 incorporated in the head slider 3 are electrically connected.

As shown in FIG. 27, a signal processing unit 290 is provided that uses the magnetic head 5 to perform the writing and reading of signals on the magnetic recording medium 80. The signal processing unit 290 is provided on the back side, in FIG. 27, of the magnetic recording and reproducing apparatus 250 illustrated in FIG. 27, for example. The input/output lines of the signal processing unit 290 are connected to the electrode pads of the head gimbal assembly 258 to be electrically connected to the magnetic head.

The magnetic recording and reproducing apparatus 250 includes the magnetic head assembly mentioned above and the magnetic recording medium 80 in which information is recorded using the magneto-resistance effect element 110 mounted on the magnetic head assembly.

The magnetic recording and reproducing apparatus 250 may further include, for example, in addition to the magnetic recording medium 80 and the magnetic head 5, a movable unit that relatively moves the magnetic recording medium 80 and the magnetic head 5 while opposing the magnetic recording medium 80 and the magnetic head 5 to each other in a state of keeping both apart or in contact, a position control unit that positions the magnetic head 5 at a prescribed recording position on the magnetic recording medium 80, and the signal processing unit 290 that uses the magnetic head 5 to perform the writing and reading of signals on the magnetic recording medium.

The recording medium disk 280 is used as the magnetic recording medium 80 mentioned above. The movable unit mentioned above may include the head slider 3. The position control unit mentioned above may include the head gimbal assembly 258.

Sixth Embodiment

The embodiment relates to a magnetic memory using the magneto-resistance effect element according to the first embodiment. By using any magneto-resistance effect element according to the first embodiment, for example, a magnetic memory such as a magnetic random access memory (MRAM) in which memory cells are arranged in a matrix configuration can be obtained. In the following, the case is described where the magneto-resistance effect element 110 is used.

Figure 29:
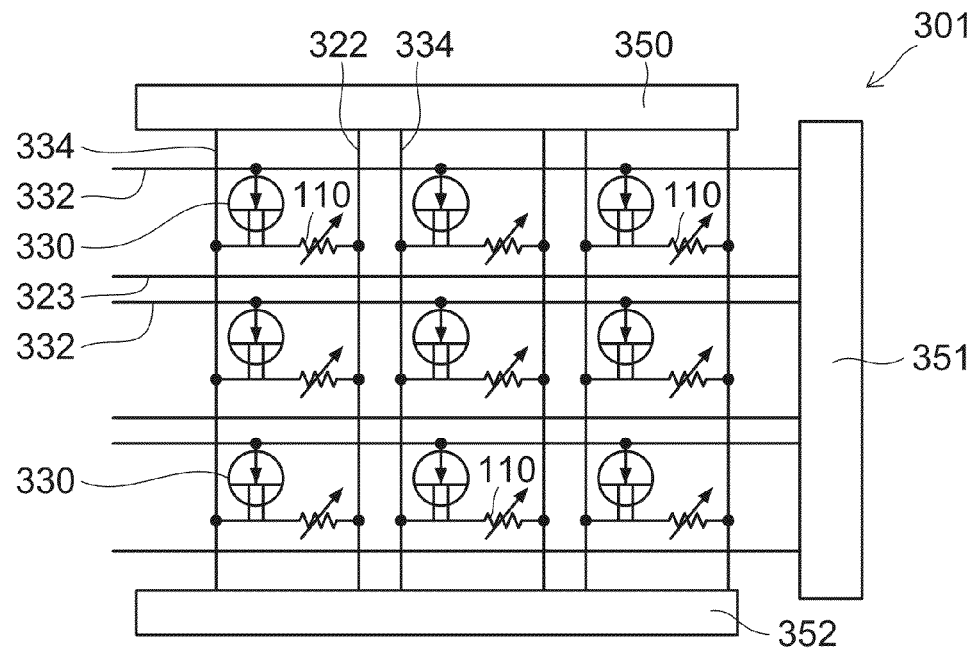
FIG. 29 is a schematic diagram illustrating a configuration of a magnetic memory according to a sixth embodiment.

FIG. 29 is a schematic diagram illustrating the configuration of a magnetic memory according to a sixth embodiment.

FIG. 29 illustrates the circuit configuration of a magnetic memory 301. The magnetic memory 301 includes a plurality of memory cells arranged in an array configuration.

As shown in FIG. 29, in the magnetic memory 301, a column decoder 350 and a row decoder 351 are provided in order to select one bit (one memory cell) in the array. A switching transistor 330 becomes ON through a bit line 334 connected to the column decoder 350 and a word line 332 connected to the row decoder 351, and the memory cell (the magneto-resistance effect element 110) is selected uniquely. Then, a sense amplifier 352 detects a current flowing through the magneto-resistance effect element 110 to read out bit information recorded in a memory layer (at least one of the first magnetic layer 14 and the second magnetic layer 18) included in the magneto-resistance effect element 110.

When writing information on each memory cell, a write current is passed through a specific write word line 323 and a specific bit line 322 to generate a magnetic field, and the magnetic field is applied to each memory cell.

Figure 30:
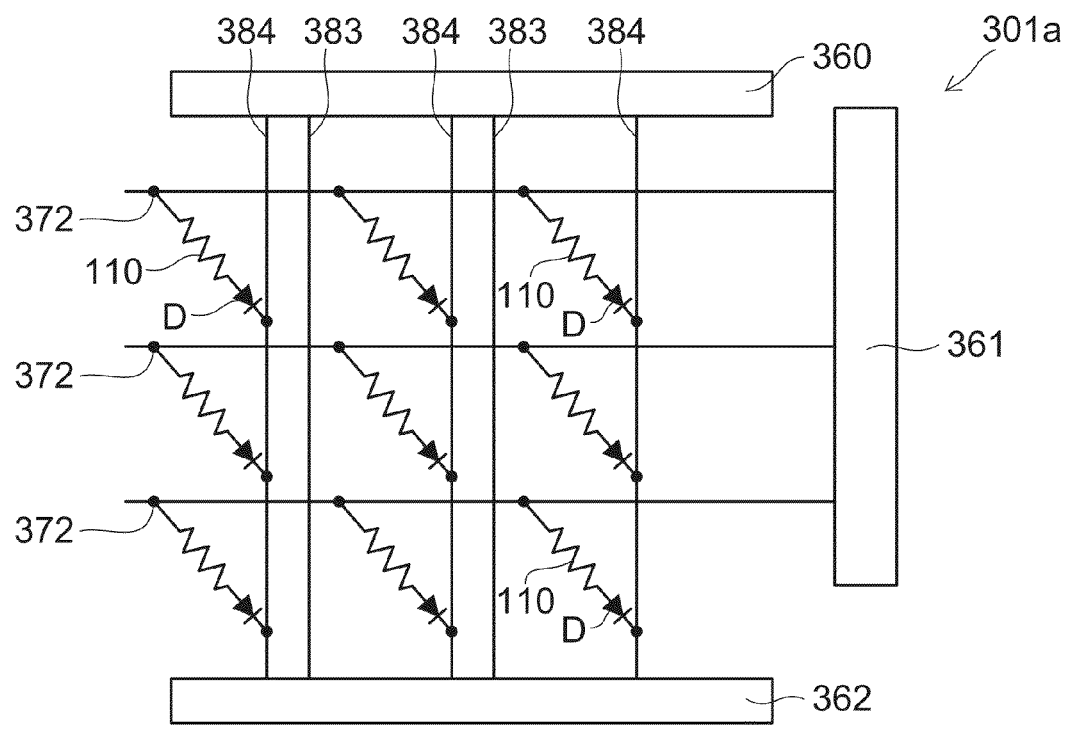
FIG. 30 is a schematic diagram illustrating a configuration of another magnetic memory according to the sixth embodiment.

FIG. 30 is a schematic diagram illustrating the configuration of another magnetic memory according to the sixth embodiment.

As shown in FIG. 30, in a magnetic memory 301a, bit lines 372 and word lines 384 drawn in a matrix configuration are each selected by decoders 360, 361, and 362 to select a specific memory cell in the array. Each memory cell has a configuration in which the magneto-resistance effect element 110 and a diode D are connected in series. The diode D reduces the possibility that a sense current will detour in a memory cell other than the selected magneto-resistance effect element 110. Writing is performed by a magnetic field generated by passing a write current through a specific bit line 372 and a specific write word line 383.

Figure 31:
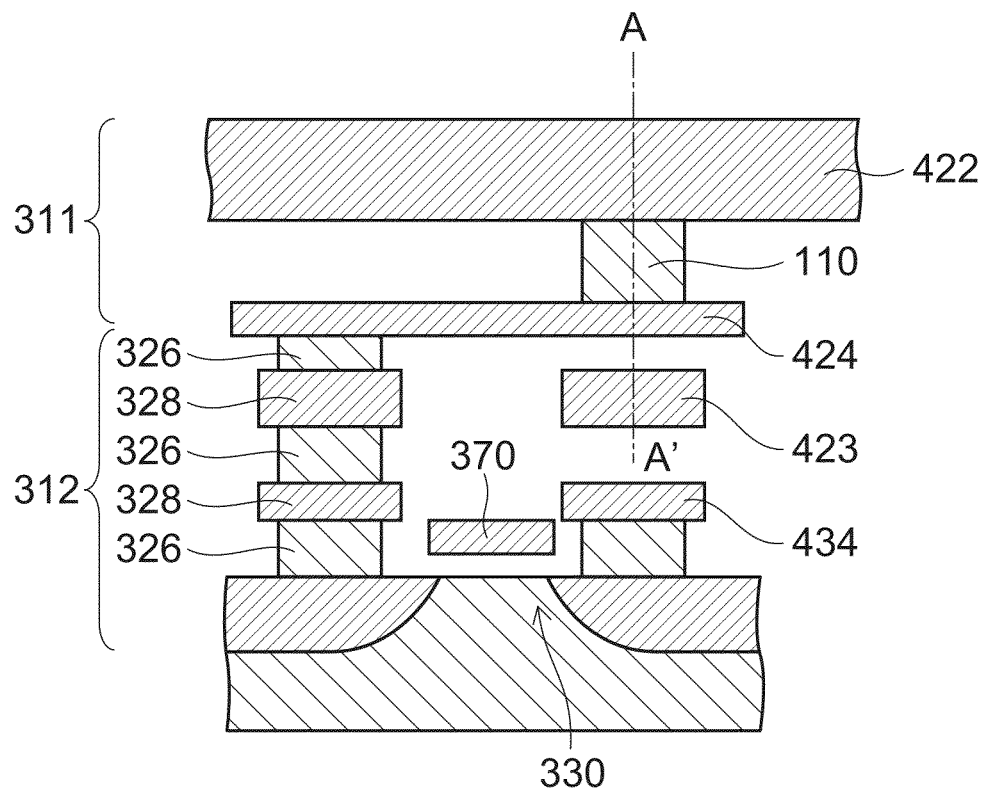
FIG. 31 is a schematic cross-sectional view illustrating a configuration of a magnetic memory according to the sixth embodiment.

FIG. 31 is a schematic cross-sectional view illustrating the configuration of a magnetic memory according to the sixth embodiment.

Figure 32:
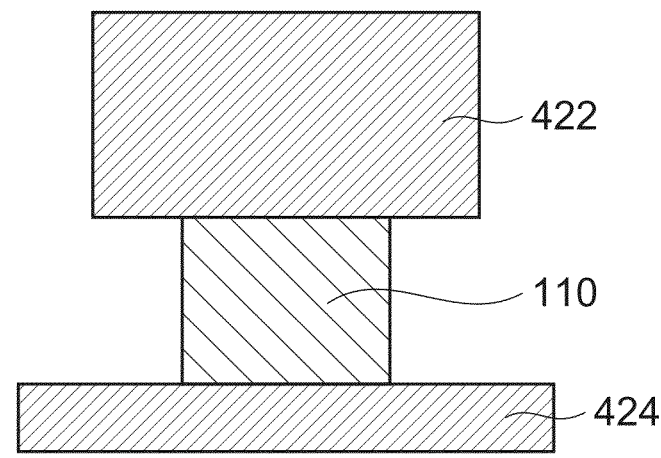
FIG. 32 is a cross-sectional view taken along line A-A' of FIG. 31.
Figure 32:
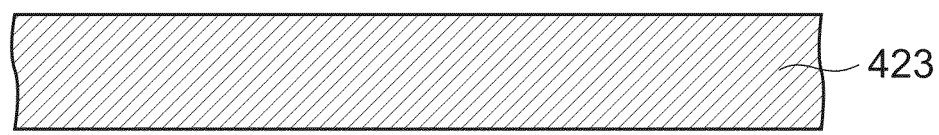

FIG. 32 is a cross-sectional view taken along line A-A' of FIG. 31.

The drawings illustrate the configuration of a memory cell for one bit included in the magnetic memory 301a. This memory cell includes a memory element portion 311 and a transistor portion for address selection 312.

As shown in FIG. 31 and FIG. 32, the memory element portion 311 includes the magneto-resistance effect element 110 and a pair of interconnections 422 and 424 connected to the magneto-resistance effect element 110.

A switching transistor 330 connected through vias 326 and embedded interconnections 328 is provided in the transistor portion for address selection 312. The switching transistor 330 performs the switching operation in accordance with a voltage applied to a gate 370 to control the opening and closing of the current pathway between the magneto-resistance effect element 110 and an interconnection 434.

An interconnection 423 for writing is provided below the magneto-resistance effect element 110 in a direction nearly orthogonal to the interconnection 422. The interconnections 422 and 423 may be formed of, for example, at least one of aluminum (Al), copper (Cu), tungsten (W), and tantalum (Ta) or an alloy containing one of them.

The interconnection 422 mentioned above corresponds to the bit line 322, and the interconnection 423 corresponds to the word line 323.

In the memory cell with such a configuration, when writing bit information on the magneto-resistance effect element 110, a write pulse current is passed through the interconnections 422 and 423, and a synthetic magnetic field induced by the currents is applied to the memory layer of the magneto-resistance effect element 110 to appropriately reverse the magnetization of the memory layer.

When reading out bit information, a sense current is passed through the interconnection 422, the magneto-resistance effect element 110 including the memory layer, and the interconnection 424, and the resistance value or the change of the resistance value of the magneto-resistance effect element 110 is measured.

By using the magneto-resistance effect element according to the first embodiment, the magnetic memories 301 and 301a according to the embodiment can perform operations with a large MR ratio, and enable highly reliable storage and reading.

The embodiment can provide a magneto-resistance effect element, a magnetic head assembly, a magnetic recording and reproducing apparatus, and a magnetic memory with a large MR ratio.

Hereinabove, embodiments of the invention are described with reference to specific examples. However, the invention is not limited to these specific examples. For example, one skilled in the art may appropriately select specific configurations of components of magneto-resistance effect elements, magnetic head assemblies, magnetic recording and reproducing apparatuses, and magnetic memories such as first electrodes, second electrodes, first magnetic layers, second magnetic layers, nonmagnetic layers, and oxide layers from known art and similarly practice the invention. Such practice is included in the scope of the invention to the extent that similar effects thereto are obtained.

Further, any two or more components of the specific examples may be combined within the extent of technical feasibility; and such combinations are included in the scope of the invention to the extent that the spirit of the invention is included. For example, the configurations and materials described in regard to the magneto-resistance effect elements 110 and 111 may be used for the magneto-resistance effect elements 114 to 120, 116a, and 130, and magneto-resistance effect elements modified based on them.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magneto-resistance effect element comprising:
   a first electrode;
   a second electrode;
   a first magnetic layer provided between the first electrode and the second electrode;
   a second magnetic layer provided between the first magnetic layer and the second electrode; and
   an oxide layer of a metal oxide provided between the first magnetic layer and the second magnetic layer, the oxide layer including wustite crystal grains of a wustite structure with a (1 1 1) plane orientation containing iron, a lattice spacing of a (1 1 1) plane of the wustite crystal grains being not less than 0.253 nanometers and not more than 0.275 nanometers,
   wherein the oxide layer further includes wurtzite crystal grains with a (0 0 2) plane orientation containing zinc and having a portion overlapping with the wustite crystal grains when projected onto a plane parallel to a thickness direction of the oxide layer.

2. The element according to claim 1, further comprising a nonmagnetic layer provided between the first magnetic layer and the second magnetic layer.

3. The element according to claim 2, wherein the nonmagnetic layer includes:
   an insulating member in which a through hole is formed; and
   a conductive member embedded in the through hole.

4. The element according to claim 3, wherein the nonmagnetic layer includes:
   an upper metal layer; and
   a lower metal layer and
   the insulating member is disposed between the upper metal layer and the lower metal layer.

5. The element according to claim 1, wherein the wustite crystal grains further contain zinc.

6. The element according to claim 1, wherein the wustite crystal grains further contain at least one of cobalt and nickel.

7. The element according to claim 1, wherein the wustite crystal grains further contain at least one of tin, indium, and cadmium.

8. The element according to claim 1, wherein the wustite crystal grains further contain at least one of copper, titanium, vanadium, chromium, manganese, aluminum, silicon, magnesium, gallium, germanium, platinum, palladium, silver, zirconium, hafnium, and tantalum.

9. The element according to claim 1, wherein a crystal orientation dispersion of the oxide layer is 5 degrees or less.

10. The element according to claim 1, wherein a thickness of the oxide layer is not less than 0.5 nanometers and not more than 4 nanometers.

11. A magneto-resistance effect element comprising:
    a nonmagnetic layer including a first portion and a second portion away from the first portion;
    a first electrode stacked with the first portion;
    a first magnetic layer provided between the first portion and the first electrode;
    a second electrode stacked with the second portion;
    a second magnetic layer provided between the second portion and the second electrode; and
    an oxide layer of a metal oxide provided at least one of between the first electrode and the first portion and between the second electrode and the second portion, the oxide layer including wustite crystal grains of a wustite structure with a (1 1 1) plane orientation containing iron, a lattice spacing of a (1 1 1) plane of the wustite crystal grains being not less than 0.253 nanometers and not more than 0.275 nanometers.

12. The element according to claim 11, wherein the oxide layer further includes wurtzite crystal grains with a (0 0 2) plane orientation containing zinc and having a portion overlapping with the wustite crystal grains when projected onto a plane parallel to a thickness direction of the oxide layer.

13. The element according to claim 11, wherein the wustite crystal grains further contain zinc.

14. The element according to claim 11, wherein the wustite crystal grains further contain at least one of cobalt and nickel.

15. The element according to claim 11, wherein the wustite crystal grains further contain at least one of tin, indium, and cadmium.

16. The element according to claim 11, wherein the wustite crystal grains further contain at least one of copper, titanium, vanadium, chromium, manganese, aluminum, silicon, magnesium, gallium, germanium, platinum, palladium, silver, zirconium, hafnium, and tantalum.

17. The element according to claim 11, wherein a crystal orientation dispersion of the oxide layer is 5 degrees or less.

18. The element according to claim 11, wherein a thickness of the oxide layer is not less than 0.5 nanometers and not more than 4 nanometers.

19. The element according to claim 11, wherein the non-magnetic layer includes:
an insulating member in which a through hole is formed; and
a conductive member embedded in the through hole.

20. The element according to claim 19, wherein the non-magnetic layer includes:
an upper metal layer; and
a lower metal layer and
the insulating member is disposed between the upper metal layer and the lower metal layer.

21. The element according to claim 11, wherein a magnetization direction of the first magnetic layer and a magnetization direction of the second magnetic layer are rotatable by an external magnetic field.

22. A magnetic head assembly comprising:
a magneto-resistance effect element;
a suspension mounted with the magneto-resistance effect element at one end; and
an actuator arm connected to another end of the suspension,
the magneto-resistance effect element including:
a first electrode;
a second electrode;
a first magnetic layer provided between the first electrode and the second electrode;
a second magnetic layer provided between the first magnetic layer and the second electrode; and
an oxide layer of a metal oxide provided between the first magnetic layer and the second magnetic layer, the oxide layer including wustite crystal grains of a wustite structure with a (1 1 1) plane orientation containing iron, a lattice spacing of a (1 1 1) plane of the wustite crystal grains being not less than 0.253 nanometers and not more than 0.275 nanometers,
wherein the oxide layer further includes wurtzite crystal grains with a (0 0 2) plane orientation containing zinc and having a portion overlapping with the wustite crystal grains when projected onto a plane parallel to a thickness direction of the oxide layer.

23. A magnetic recording and reproducing apparatus comprising:
a magnetic head assembly; and
a magnetic recording medium on which information is recorded using a magneto-resistance effect element mounted on the magnetic head assembly,
the magnetic head assembly including:
the magneto-resistance effect element;
a suspension mounted with the magneto-resistance effect element at one end; and
an actuator arm connected to another end of the suspension,
the magneto-resistance effect element including:
a first electrode;
a second electrode;
a first magnetic layer provided between the first electrode and the second electrode;
a second magnetic layer provided between the first magnetic layer and the second electrode; and
an oxide layer of a metal oxide provided between the first magnetic layer and the second magnetic layer, the oxide layer including wustite crystal grains of a wustite structure with a (1 1 1) plane orientation containing iron, a lattice spacing of a (1 1 1) plane of the wustite crystal grains being not less than 0.253 nanometers and not more than 0.275 nanometers,
wherein the oxide layer further includes wurtzite crystal grains with a (0 0 2) plane orientation containing zinc and having a portion overlapping with the wustite crystal grains when projected onto a plane parallel to a thickness direction of the oxide layer.

24. A magnetic memory comprising a magneto-resistance effect element including:
a first electrode;
a second electrode;
a first magnetic layer provided between the first electrode and the second electrode;
a second magnetic layer provided between the first magnetic layer and the second electrode; and
an oxide layer of a metal oxide provided between the first magnetic layer and the second magnetic layer, the oxide layer including wustite crystal grains of a wustite structure with a (1 1 1) plane orientation containing iron, a lattice spacing of a (1 1 1) plane of the wustite crystal grains being not less than 0.253 nanometers and not more than 0.275 nanometers,
wherein the oxide layer further includes wurtzite crystal grains with a (0 0 2) plane orientation containing zinc and having a portion overlapping with the wustite crystal grains when projected onto a plane parallel to a thickness direction of the oxide layer.

* * * * *